(12) United States Patent
Sakuragi

(10) Patent No.: US 10,260,974 B2
(45) Date of Patent: Apr. 16, 2019

(54) ELECTRONIC PART WITH SENSOR EXPOSED TO AMBIENT AIR

(71) Applicant: ROHM CO., LTD., Kyoto (JP)

(72) Inventor: Masahiro Sakuragi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 70 days.

(21) Appl. No.: 15/428,244

(22) Filed: Feb. 9, 2017

(65) Prior Publication Data

US 2017/0284881 A1 Oct. 5, 2017

(30) Foreign Application Priority Data

Mar. 29, 2016 (JP) ................. 2016-066345

(51) Int. Cl.
*G01L 9/00* (2006.01)
*H05K 1/11* (2006.01)
*H05K 1/18* (2006.01)

(52) U.S. Cl.
CPC .......... *G01L 9/0045* (2013.01); *G01L 9/0051* (2013.01); *H05K 1/111* (2013.01); *H05K 1/183* (2013.01); *H05K 2201/10151* (2013.01)

(58) Field of Classification Search
CPC ..... G01L 19/04; G01L 19/147; G01L 9/0042; G01L 9/0072; G01L 13/025; G01L 9/0054; G01L 9/0075; G01L 19/14; G01L 19/0069; G01L 19/0084; G01L 19/0645; G01L 9/0052; G01L 19/0038; G01L 19/0092; G01L 19/0618; G01L 9/0051; G01L 9/0055; G01L 9/0073; G01L 11/025; G01L 19/0046; G01L 19/06; G01L 19/0681; G01L 19/143; G01L 7/00; G01L 9/00; G01L 9/0041; G01L 9/0044; G01L 19/0007; G01L 19/0023; G01L 19/0627; G01L 19/0672; G01L 19/069; G01L 19/142; G01L 19/16; G01L 27/002; G01L 7/08; G01L 7/163; G01L 7/166; G01L 9/0047; G01L 11/02; G01L 11/04; G01L 15/00; G01L 19/0609; G01L 19/083; G01L 19/148; G01L 1/18; G01L 1/26; G01L 9/0048; G01L 9/006; G01L 9/007; G01L 9/0076; G01L 9/06; G01L 9/065;

(Continued)

(56) References Cited

U.S. PATENT DOCUMENTS 8,770,035 B2 7/2014 Yamada et al.
2012/0118068 A1 5/2012 Yamada et al.
(Continued)

FOREIGN PATENT DOCUMENTS

WO WO-2011/010571 A1 1/2011

*Primary Examiner* — Andre J Allen
(74) *Attorney, Agent, or Firm* — Rabin & Berdo, P.C.

(57) ABSTRACT

An electronic part (air pressure detecting device) 1 includes a sensor element (air pressure sensor element) 2 that includes an ambient air contacting surface S including an ambient air contacting region Sa to be exposed to ambient air, and a supporting substrate 4, arranged to support the sensor element 2. The sensor element 2 is bonded to one surface 4a of the supporting substrate 4 in a state where its ambient air contacting surface S faces the one surface 4a of the supporting substrate 4 and a gap, through which the ambient air flows, is formed between the ambient air contacting surface S and the one surface 4a of the supporting substrate 4.

18 Claims, 57 Drawing Sheets

(58) Field of Classification Search
CPC . G01L 9/12; G01L 9/125; G01L 11/00; G01L 13/00; G01L 17/00; G01L 19/00; G01L 19/0015; G01L 19/003; G01L 19/0076; G01L 19/02; G01L 19/08; G01L 19/10; G01L 19/141; G01L 19/145; G01L 1/142; G01L 1/2262; G01L 1/2287; G01L 1/246; G01L 21/12; G01L 23/16; G01L 27/005; G01L 27/007; G01L 7/04; G01L 7/063; G01L 7/082; G01L 7/084; G01L 7/16; G01L 9/0002; G01L 9/0007; G01L 9/0016; G01L 9/0019; G01L 9/0022; G01L 9/0027; G01L 9/0033; G01L 9/0039; G01L 9/0045; G01L 9/005; G01L 9/0058; G01L 9/0077; G01L 9/0079; G01L 9/008; G01L 9/0092; G01L 9/0095; G01L 9/025; G01L 9/04; G01L 9/045; G01L 9/08; G01L 9/085; G01L 9/105; G01L 9/14; G01L 9/16
See application file for complete search history.

(56) References Cited

U.S. PATENT DOCUMENTS

2014/0311249 A1     10/2014  Yamada et al.
2016/0153860 A1*     6/2016  Kamiya .................. G01P 15/09
                                                        73/753
2017/0247247 A1*     8/2017  Zhang ..................... B81B 7/008

\* cited by examiner

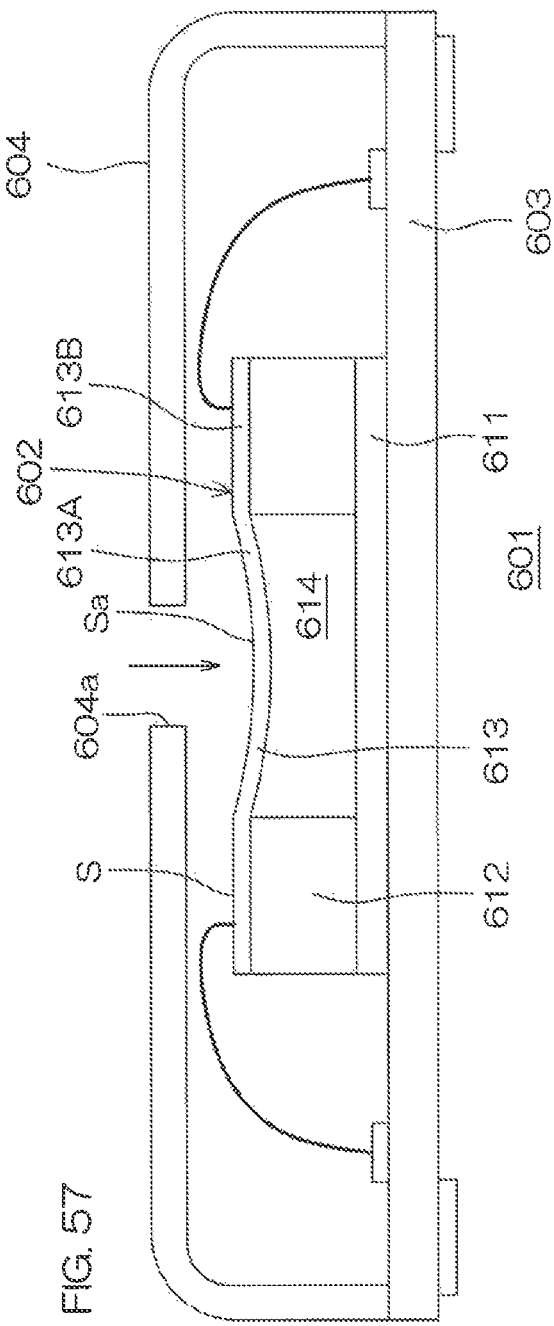

ELECTRONIC PART WITH SENSOR EXPOSED TO AMBIENT AIR

BACKGROUND OF THE INVENTION

1. Field of the Invention

The present invention relates to an electronic part that includes a sensor element having an ambient air contacting surface including an ambient air contacting region to be exposed to ambient air. As the sensor element having the ambient air contacting surface, an air pressure sensor element, a humidity sensor element, etc., can be cited.

2. Description of the Related Art

FIG. 57 is a sectional view of an electronic part (hereinafter referred to as "air pressure detecting device") that includes a conventional air pressure sensor element.

The conventional air pressure detecting device 601 includes the air pressure sensor element 602, a supporting substrate 603 supporting the air pressure sensor element 602, and a cover 604 covering the air pressure sensor element 602. The cover 604 is constituted, for example, of a metal. A vent hole 604a, penetrating through the cover 604 in a thickness direction is formed in the cover 604.

The air pressure sensor element 602 includes a glass base 611, fixed to the supporting substrate 603, a silicon substrate 612, provided on the glass base 611, and a diaphragm 613, supported by the silicon substrate 612. A cavity 614 penetrating through in a thickness direction is formed in the silicon substrate 612. The silicon substrate 612 is bonded to the base 611. The base 611 defines a bottom surface portion of the cavity 614. The diaphragm 613 defines a top surface portion of the cavity 614. The diaphragm 614 is constituted of a movable portion 613A, defining the top surface portion of the cavity 614, and a fixed portion 613B at a periphery of the movable portion 613A. The fixed portion 613B of the diaphragm 613 is bonded onto the silicon substrate 612. A strain gauge resistor (unillustrated) is formed in the movable portion 613A.

The movable portion 613A of the diaphragm 613 undergoes strain in accordance with a difference between a pressure (reference pressure) inside the cavity and an ambient air pressure. The strain amount is detected as an amount of change in electrical resistance value of the strain gauge resistor to detect the ambient air pressure. Therefore, a surface of the movable portion 613A, within a surface of the diaphragm 613 at a side opposite the cavity 614, is an ambient air contacting region Sa that must be exposed to ambient air. A surface of the air pressure sensor element 602 at the diaphragm side is an ambient air contacting surface S that includes the ambient air contacting region Sa to be exposed to the ambient air. Although the ambient air contacting region Sa of the air pressure sensor element 602 must be exposed to the ambient air, it is fragile and must thus be protected so as not to be contacted by a finger, etc. The ambient air contacting region Sa of the air pressure sensor element 602 is thus covered by the cover 604.

SUMMARY OF THE INVENTION

The inventor of preferred embodiments of the present invention described and claimed in the present application conducted an extensive study and research regarding an electronic part, such as the one described above, and in doing so, discovered and first recognized new unique challenges and previously unrecognized possibilities for improvements as described in greater detail below.

With the conventional example described above, a cover arranged to cover an ambient air contacting region of an air pressure sensor element is required. There is thus an issue that an air pressure sensor device becomes high in height and high in cost.

An object of the present invention is to provide an electronic part with which a cover arranged to cover an ambient air contacting region of a sensor element is made unnecessary.

In order to overcome the previously unrecognized and unsolved challenges described above, a preferred embodiment of the present invention provides an electronic part. The electronic part includes a sensor element that includes an ambient air contacting surface including an ambient air contacting region to be exposed to ambient air, and a supporting substrate, arranged to support the sensor element, and the sensor element is bonded to one surface of the supporting substrate in a state where its ambient air contacting surface faces the one surface of the supporting substrate and a gap, through which the ambient air flows, is formed between the ambient air contacting region and the one surface of the supporting substrate.

With the present arrangement, the ambient air contacting surface (ambient air contacting region) of the sensor element is protected by the supporting substrate arranged to support the sensor element, and therefore there is no need to separately provide a cover arranged to protect the ambient air contacting region of the sensor element. Even in such a case where the sensor element is bonded to the one surface of the supporting substrate in the state of facing the one surface of the supporting substrate, the gap, through which the ambient air flows, is formed between the ambient air contacting region of the sensor element and the one surface of the supporting substrate, and the ambient air contacting region of the sensor element can thus be exposed to the ambient air.

The preferred embodiment of the present invention further includes a plurality of electrodes, formed at the ambient air contacting surface side of the sensor element, and a plurality of pads, formed on the one surface of the supporting substrate, and the plurality of electrodes are bonded to the plurality of pads.

In the preferred embodiment of the present invention, a recess, depressed from the one surface of the supporting substrate and housing the sensor element, is formed in the supporting substrate, and the sensor element is bonded to a bottom surface of the recess in a state where its ambient air contacting surface faces a bottom surface of the recess and a gap, through which the ambient air flows, is formed between the ambient air contacting region and the bottom surface of the recess.

The preferred embodiment of the present invention further includes a plurality of electrodes, formed at the ambient air contacting surface side of the sensor element, and a plurality of pads, formed on the bottom surface of the recess, and the plurality of electrodes are bonded to the plurality of pads.

The preferred embodiment of the present invention further includes a plurality of external terminals formed in a region of the one surface of the supporting substrate that surrounds the recess and connected to any of the plurality of pads.

In the preferred embodiment of the present invention, the plurality of external terminals are connected to any of the plurality of pads via wirings formed on the one surface of the supporting substrate.

In the preferred embodiment of the present invention, the plurality of external terminals are connected to any of the plurality of pads via wirings formed inside the supporting substrate.

The preferred embodiment of the present invention further includes a plurality of external terminals formed on another surface at a side opposite the one surface of the supporting substrate and connected to any of the plurality of pads.

In the preferred embodiment of the present invention, the plurality of external terminals are connected to any of the plurality of pads via wirings formed inside the supporting substrate.

The preferred embodiment of the present invention further includes an integrated circuit element supported by the supporting substrate. The supporting substrate has formed therein a first recess, depressed from the one surface of the supporting substrate, and a second recess, depressed from the one surface of the supporting substrate, being in communication with a lateral surface of the first recess, and being shallower in depth than the first recess. The sensor element is bonded to a bottom surface of the first recess in a state where its ambient air contacting surface faces the bottom surface of the first recess and a gap, through which the ambient air flows, is formed between the ambient air contacting region and the bottom surface of the first recess. The integrated circuit element is bonded to a bottom surface of the second recess in a state where one surface thereof faces the bottom surface of the second recess.

The preferred embodiment of the present invention further includes a plurality of first electrodes, formed at the ambient air contacting surface side of the sensor element, and a plurality of first pads, formed on the bottom surface of the first recess, and the plurality of first electrodes are bonded to the plurality of first pads.

The preferred embodiment of the present invention further includes a plurality of second electrodes, formed at the one surface side of the integrated circuit element, and a plurality of second pads, formed on the bottom surface of the second recess and connected to any of the plurality of first pads, and the plurality of second electrodes are bonded to the plurality of second pads.

The preferred embodiment of the present invention further includes a plurality of external terminals formed in a region of the one surface of the supporting substrate that surrounds the first recess and the second recess and connected to any of the plurality of second pads.

In the preferred embodiment of the present invention, the plurality of second pads are connected to any of the plurality of first pads via first wirings formed on the one surface of the supporting substrate, and the plurality of external terminals are connected to any of the plurality of second pads via second wirings formed on the one surface of the supporting substrate.

The preferred embodiment of the present invention further includes an integrated circuit element supported by the supporting substrate. The supporting substrate has formed therein a third recess, depressed from the one surface of the supporting substrate, and a fourth recess, depressed further from a bottom surface of the third recess. The sensor element is bonded to a bottom surface of the fourth recess in a state where its ambient air contacting surface faces the bottom surface of the fourth recess and a gap, through which the ambient air flows, is formed between the ambient air contacting region and the bottom surface of the fourth recess. The integrated circuit element is bonded to the bottom surface of the third recess in a state where one surface thereof faces the bottom surface of the third recess and a gap, through which the ambient air flows, is formed between the one surface and the bottom surface of the third recess.

The preferred embodiment of the present invention further includes a plurality of first electrodes, formed at the ambient air contacting surface side of the sensor element, and a plurality of first pads, formed on the bottom surface of the fourth recess, and the plurality of first electrodes are bonded to the plurality of first pads.

The preferred embodiment of the present invention further includes a plurality of second electrodes, formed at the one surface side of the integrated circuit element, and a plurality of second pads, formed on the bottom surface of the third recess and connected to any of the plurality of first pads, and the plurality of second electrodes are bonded to the plurality of second pads.

The preferred embodiment of the present invention further includes a plurality of external terminals formed in a region of the one surface of the supporting substrate that surrounds the third recess and connected to any of the plurality of second pads.

In the preferred embodiment of the present invention, the plurality of second pads are connected to any of the plurality of first pads via first wirings formed inside the supporting substrate, and the plurality of external terminals are connected to any of the plurality of second pads via second wirings formed inside the supporting substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 57 is an illustrative sectional view of a conventional example.

DETAILED DESCRIPTION OF THE PREFERRED EMBODIMENTS

Preferred embodiments of cases of applying electronic parts according to the present invention to air pressure detecting devices shall now be described in detail with reference to the attached drawings.

Figure 1:
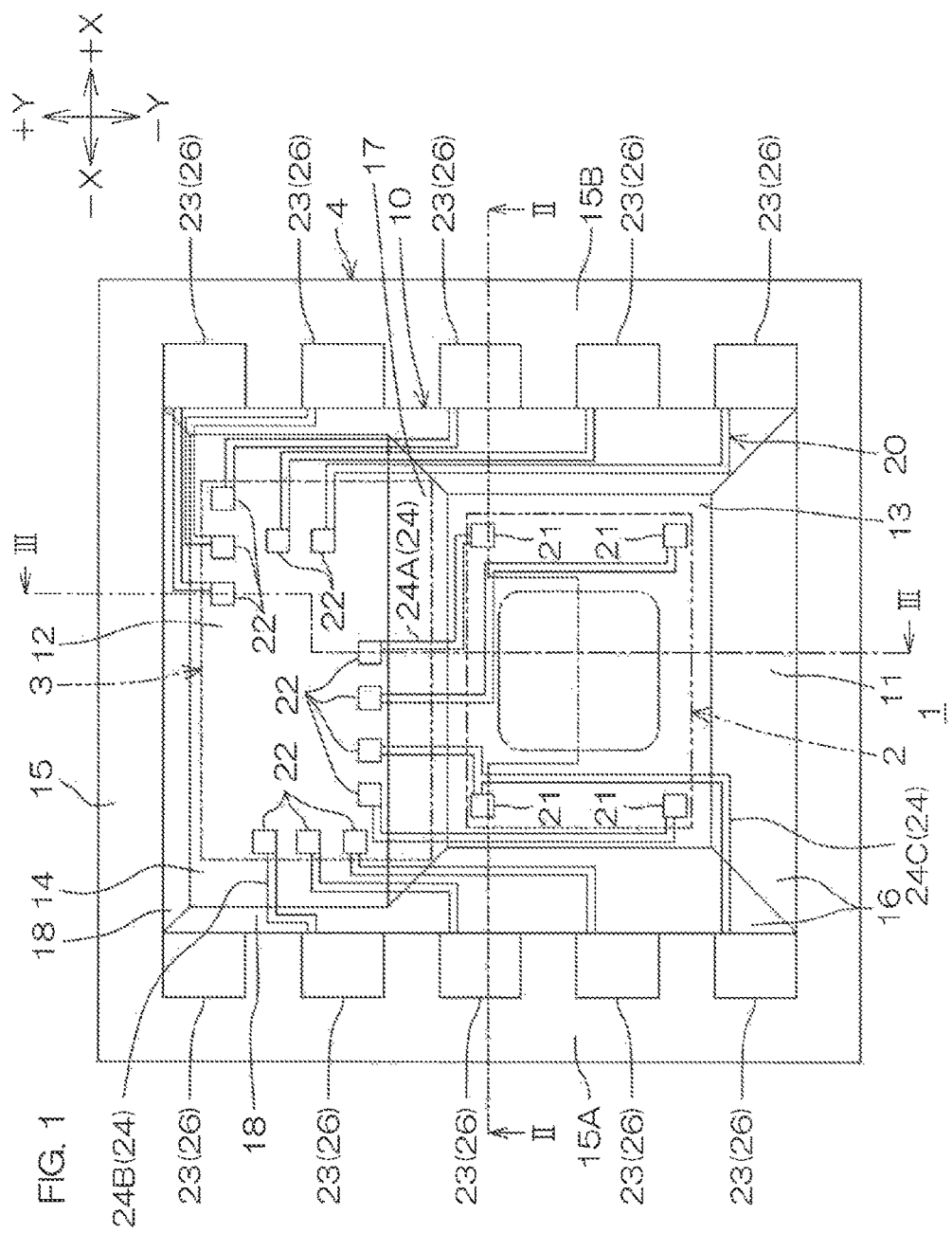
FIG. 1 is an illustrative plan view of a first air pressure detecting device.
Figure 2:
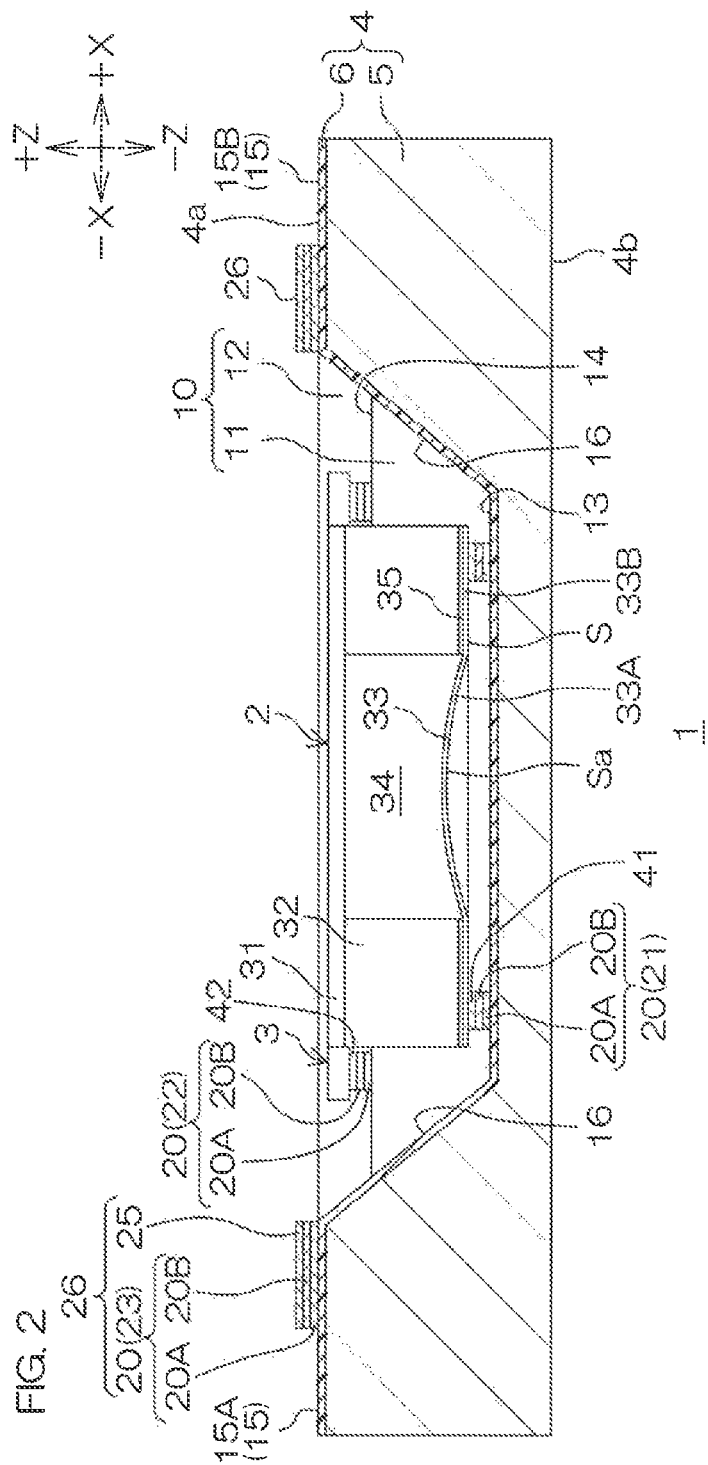
FIG. 2 is an illustrative sectional view taken along line II-II in FIG. 1.
Figure 3:
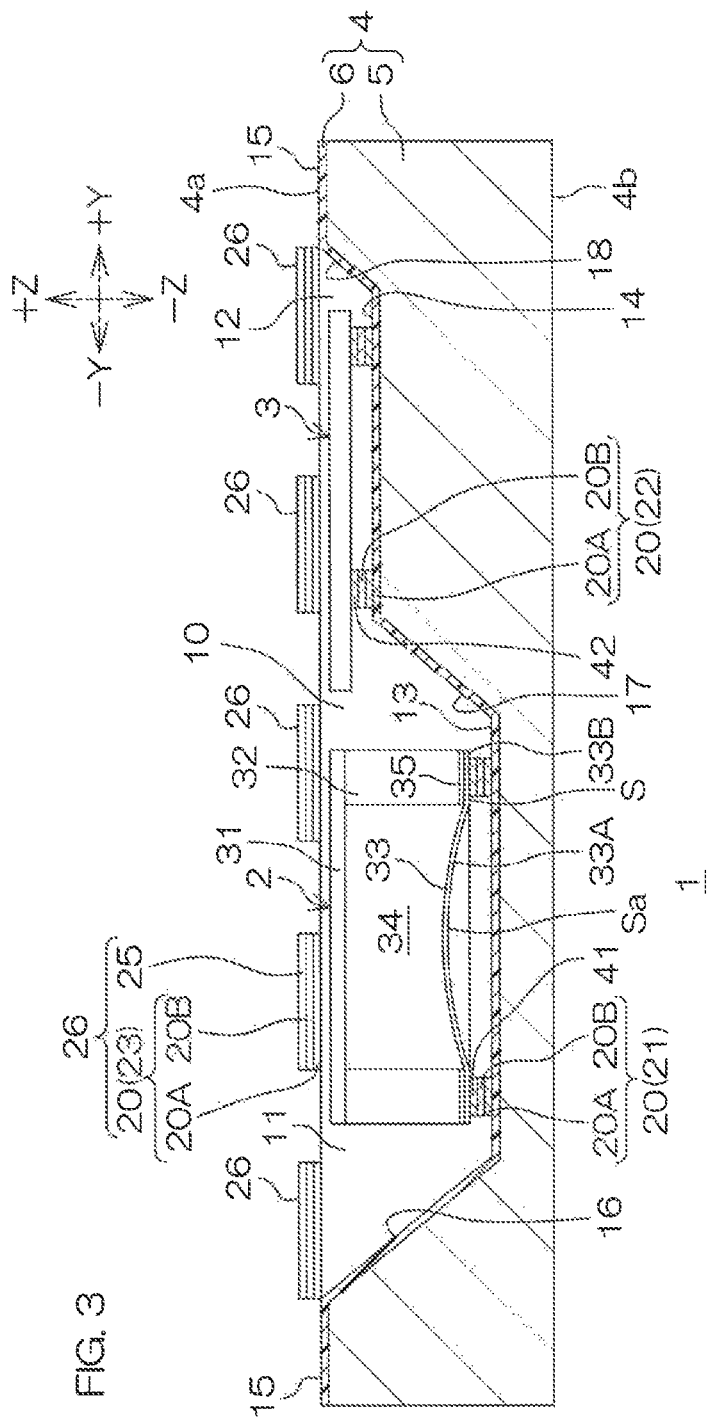
FIG. 3 is an illustrative sectional view taken along line III-III in FIG. 1.

FIG. 1 is an illustrative plan view of a first air pressure detecting device. In FIG. 1, an air pressure sensor element and an integrated circuit element are indicated by imaginary lines for convenience of description. FIG. 2 is an illustrative sectional view taken along line II-II in FIG. 1. FIG. 3 is an illustrative sectional view taken along line III-III in FIG. 1.

The first air pressure detecting device 1 includes the air pressure sensor element 2, the integrated circuit element 3, performing air pressure detection processing based on an output of the air pressure sensor element 2, and a supporting substrate 4 supporting the air pressure sensor element 2 and the integrated circuit element 3. For convenience of description, a +X direction, a −X direction, a +Y direction, and a −Y direction shown in FIG. 1 and a +Z direction and a −Z direction shown in FIG. 2 and FIG. 3 may be used in the following description. The +X direction and the −X direction are two directions oriented along one side of a supporting substrate 4 that is rectangular in a plan view and, when referred to collectively, are referred to simply as the "X direction." The +Y direction and the −Y direction are two directions oriented along another side orthogonal to the one side of the supporting substrate 4 and, when referred to collectively, are referred to simply as the "Y direction." The +Z direction and the −Z direction are two directions oriented along a thickness direction of the supporting substrate 4 and, when referred to collectively, are referred to simply as the "Z direction." When the supporting substrate 4 is placed on a horizontal plane, the X direction and the Y direction are two horizontal directions (a first horizontal direction and a second horizontal direction) oriented along two mutually orthogonal horizontal straight lines (an X-axis and a Y-axis), and the Z direction is a vertical direction (height direction) oriented along a vertical straight line.

The supporting substrate 4 is constituted of a base member 5 of rectangular shape in a plan view (Z direction view) and an insulating layer 6 formed on a +Z-side surface of the base member 5. The base member 5 is constituted, for example, of Si. The insulating layer 6 is constituted, for example, of $SiO_2$. The supporting substrate 4 is formed to a rectangular shape in a plan view and has a pair of major surfaces 4a and 4b and four lateral surfaces connecting the major surfaces 4a and 4b. At a central portion of one major surface (major surface at the +Z direction side) 4a of the supporting substrate 4 is formed a recess 10 that is depressed towards the other major surface 4b. The other major surface 4b of the supporting substrate 4 is a flat surface. In the present preferred embodiment, the recess 10 has, in a plan view, a rectangular shape having four sides parallel to the four sides of the supporting substrate 4.

The recess 10 is constituted of a first recess 11 of rectangular shape in a plan view and a second recess 12, which is in communication with one lateral surface at the +Y direction side of the first recess 11 in a plan view and is shallower in depth than the first recess 11. The second recess 12 is disposed at the +Y direction side with respect to the first recess 11. In a plan view, the respective recesses 11 and 12 are the same in width in the X direction and are aligned in regard to the Y direction.

At the one major surface 4a of the substrate 4, a low area 13, which is a bottom surface of the first recess 11, a middle area 14, which is a bottom surface of the second recess 12, and a high area 15, which is a peripheral region of the recess 10, are formed by the first recess 11 and the second recess 12. The low area 13 has, in a plan view, a rectangular shape having four sides parallel to the four sides of the supporting substrate 4. Similarly, the middle area 14 has, in a plan view, a rectangular shape having four sides parallel to the four sides of the supporting substrate 4. The high area 15 has, in a plan view, a rectangular annular shape surrounding the recess 10.

Between the high area 15 and the three sides of the low area 13 excluding the side at the +Y direction side is formed a connecting portion 16 arranged to connect these portions.

Between the side of the low area 13 at the +Y direction side and the side of the middle area 14 at the −Y direction side is formed a connecting portion 17 arranged to connect these portions. Between the high area 15 and the three sides of the middle area 13 excluding the side at the −Y direction side is formed a connecting portion 18 arranged to connect these portions.

The connecting portions 16 and 17 are formed to inclined surfaces so that a transverse cross-sectional area of the first recess 11 increases gradually as the middle area 14 and the high area 15 are approached from the low area 13. The connecting portion 18 is formed to an inclined surface so that a transverse cross-sectional area of the second recess 12 increases gradually as the high area 15 is approached from the middle area 14. The high area 15 includes a first region 15A and a second region 15B having rectangular shapes that are long in the Y direction in a plan view and are disposed apart in the X direction across the recess 10.

A wiring film 20 is formed on the major surface 4a of the supporting substrate 4. The wiring film 20 has a laminated structure of a barrier seed layer 20A and a plating layer 20B. The barrier seed layer 20A is a base layer for forming the plating layer 20B and is formed on the insulating layer 6. The barrier seed layer 20A is constituted, for example, of a Ti layer formed as a barrier layer on the insulating layer 6 and a Cu layer laminated as a seed layer on the Ti layer. The barrier seed layer 20A is formed, for example, by a sputtering method. The plating layer 20B is constituted, for example, of Cu and is formed by electroplating utilizing the barrier seed layer 20A.

The wiring film 20 includes a plurality of first pads 21, formed at a peripheral edge portion of the low area 13, a plurality of second pads 22, formed at a peripheral edge portion of the middle area 14, a plurality of third pads, formed in the first region 15A and the second region 15B of the high area 15, and a plurality of connecting portions 24 connecting the pads to each other.

The plurality of first pads 21 are rectangular in a plan view and, for example, four thereof are formed at the peripheral edge portion of the low area 13. The first pads 21 are provided to fix the air pressure sensor element 2 to the low area 13 mechanically and electrically.

The plurality of second pads 22 are rectangular in a plan view and, for example, twelve thereof are formed at the peripheral edge portion of the middle area 14. The second pads 22 are provided to fix the integrated circuit element 3 to the middle area 14 mechanically and electrically.

In regard to the plurality of third pads 23, five each are formed in the first region 15A and the second region 15B, respectively. In the present preferred embodiment, of the ten third pads 23, the third pad 23 formed at the +Y direction side end of the first region 15A is a dummy pad that is not electrically connected to either of the air pressure sensor element 2 and the integrated circuit element 3. A bump 25 is formed on each third pad 23. An external terminal 26 is formed by each third pad 23 and the bump 25 formed thereon. The external terminals 26 are used for surface-mounting the air pressure detecting device 1 onto an unillustrated circuit board.

The connecting portions 24 include a plurality of first connecting portions 24A, each connecting a first pad 21 and a second pad 22, a plurality of second connecting portions 24B, each connecting a second pad 22 and a third pad 23, and a third connecting portion 24C, connecting a first pad 21 and an external terminal 26 (third pad 23).

The air pressure sensor element 2 has a rectangular parallelepiped shape and is housed inside the first recess 11.

The air pressure sensor element 2 includes abase 31 of rectangular shape in a plan view, a substrate 32, formed on a −Z direction-side surface of the base 31, and a diaphragm 33, supported by the substrate 32. The base 31 is constituted, for example, of glass. A cavity 34 that is rectangular in a plan view and penetrates through in a thickness direction (Z direction) is formed in the substrate 32. The substrate 32 is rectangular annular in a plan view and is constituted, for example, of an Si substrate. An insulating layer 35 is formed on a −Z direction-side surface of the substrate 32.

A +Z direction-side surface of the substrate 32 is bonded to the base 31. The base 31 defines a bottom surface portion of the cavity 34. The diaphragm 33 is supported by the −Z direction-side surface of the substrate 32 via the insulating layer 35. The diaphragm 33 defines a top surface portion of the cavity 34. The diaphragm 33 is constituted of a movable portion 33A of rectangular shape in a plan view that defines the top surface portion of the cavity 34 and a fixed portion 33B of rectangular annular shape in a plan view at a periphery of the movable portion 33A. The fixed portion 33B of the diaphragm 33 is bonded to the insulating layer 35 on the silicon substrate 32. A strain gauge resistor (unillustrated) is formed in the movable portion 33A of the diaphragm 33. A plurality of pad electrodes (unillustrated), connected to the strain gauge resistor, are provided at the fixed portion 33B of the diaphragm 33.

The movable portion 33A of the diaphragm 33 undergoes strain in accordance with a difference between a pressure (reference pressure) inside the cavity and an ambient air pressure. The strain amount is detected as an amount of change in electrical resistance value of the strain gauge resistor to detect the ambient air pressure. Therefore, a surface of the movable portion 33A, within the surface (−Z direction-side surface) of the diaphragm 33 at the side opposite the cavity 34, is an ambient air contacting region Sa that must be exposed to ambient air. A surface of the air pressure sensor element 2 at the diaphragm 33 side is an ambient air contacting surface S that includes the ambient air contacting region Sa to be exposed to the ambient air.

The air pressure sensor element 2 is bonded to the low area 13 in a face-down state where the ambient air contacting surface S is made to face the low area (first recess 11 bottom surface) 13. Specifically, each of a plurality of pad electrodes provided at the ambient air contacting surface S of the air pressure sensor element 2 is mechanically and electrically bonded via a solder layer 41 to a first pad 21 formed in the low area 13. A gap, corresponding to a sum thickness of a thickness of the first pad 21 and a thickness of the solder layer 41, is formed between the ambient air contacting surface S (ambient air contacting region Sa) of the air pressure sensor element 2 and the low area 13. That is, a gap, corresponding to at least the thickness of the first pad 21, is present between the ambient air contacting region Sa of the air pressure sensor element 2 and the low area 13.

In the present preferred embodiment, the integrated circuit element 3 is arranged as a so-called ASIC (Application Specific Integrated Circuit) element. The integrated circuit element 3 has a rectangular parallelepiped shape that is flat in the Z direction and a large portion thereof is housed inside the second recess 12. A plurality of pad electrodes (unillustrated) are provided at one surface (−Z direction-side surface; hereinafter referred to as a "mounting surface") of the integrated circuit element 3. The integrated circuit element 3 is bonded to the middle area 14 in a state where its mounting surface is made to face the middle area 14. Specifically, each of the plurality of pad electrodes (unillustrated) provided at the mounting surface of the integrated circuit element 3 is mechanically and electrically bonded via a solder layer 42 to a second pad 22 formed in the middle area 14. The integrated circuit element 3 has a large portion thereof housed inside the second recess 12 and has its end portion at the −Y direction side housed inside the first recess 11. That is, the end portion of the integrated circuit element 3 at the −Y direction side projects into the first recess 11 from the second recess 12.

The integrated circuit element 3 may be used to process a signal that is in accordance with an amount of change in electrical resistance value of the strain gauge resistor in the air pressure sensor element 2, etc. A signal processing result of the integrated circuit element 3 may be output externally via a second connection portion 24B and an external terminal 26.

FIG. 4 to FIG. 17 are sectional views for describing an example of a manufacturing process of the air pressure detecting device 1 and show a section plane corresponding to FIG. 3.

Figure 4:
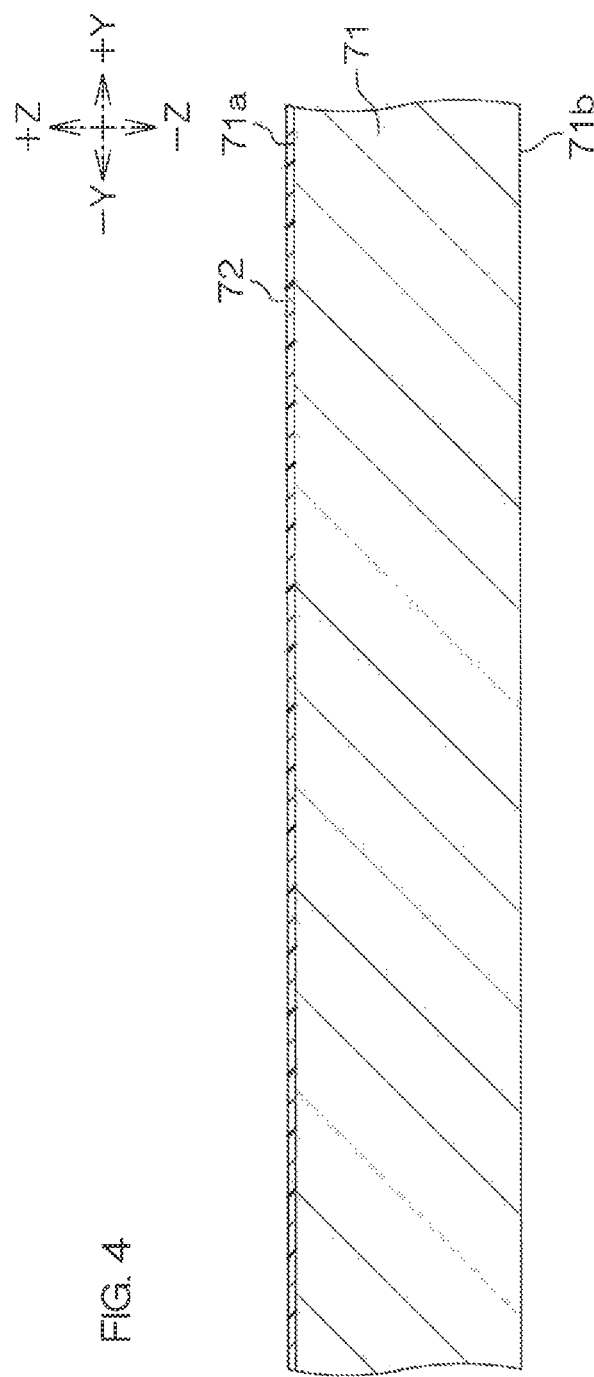
FIG. 4 is an illustrative sectional view of a manufacturing process of the air pressure detecting device of FIG. 1.

First as shown in FIG. 4, a wafer-shaped Si substrate 71 having a pair of major surfaces 71a and 71b facing mutually opposite sides in the Z direction is prepared. Next, a masking oxide film 72 is formed on the major surface 71a of the Si substrate 71, for example, by a thermal oxidation method.

Figure 5:
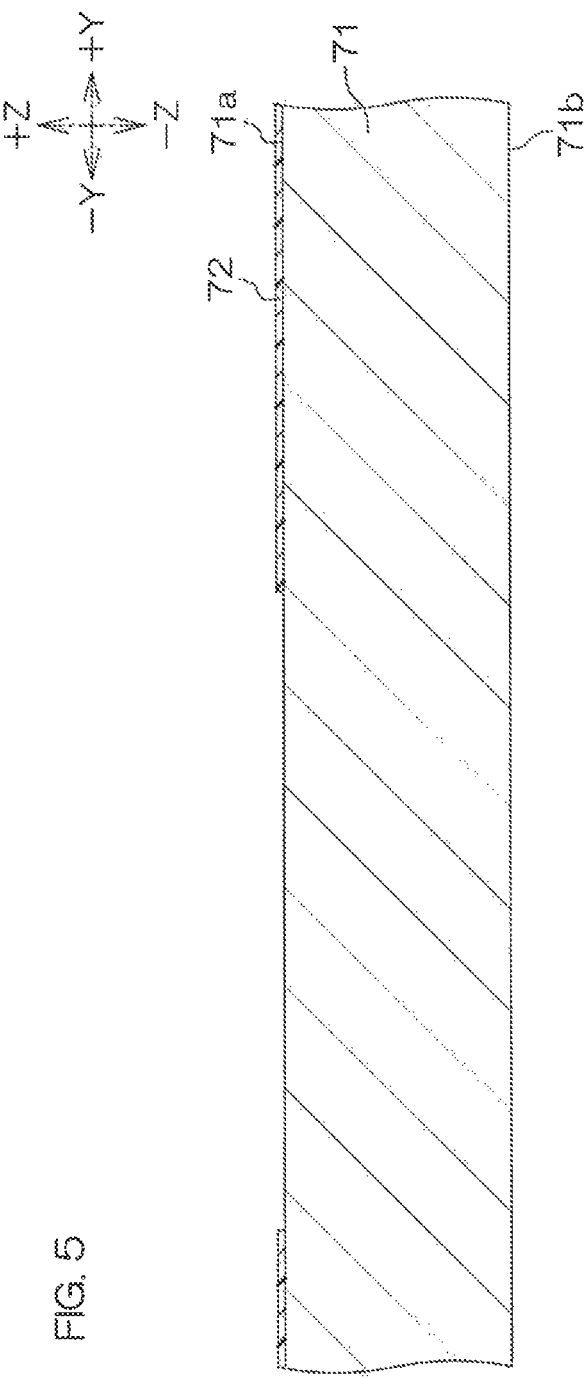
FIG. 5 is an illustrative sectional view of a step subsequent to that of FIG. 4.

Next, as shown in FIG. 5, a portion of the masking oxide film 72 corresponding to a region at which the first recess 11 is to be formed is removed by photolithography and etching.

Figure 6:
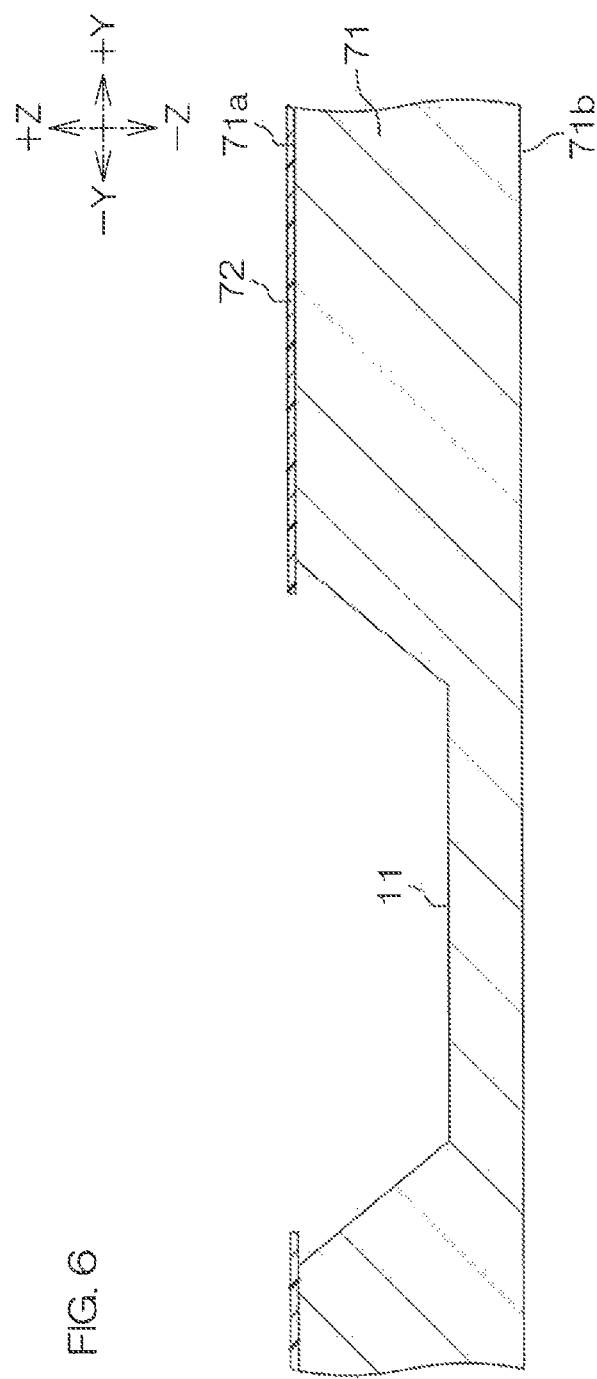
FIG. 6 is an illustrative sectional view of a step subsequent to that of FIG. 5.

Next, a hard mask constituted of the masking oxide film 72 is used to etch the Si substrate 71 as shown in FIG. 6. As the etching, for example, wet etching (anisotropic etching) using an etchant containing potassium hydroxide (KOH) is used. The first recess 11 is thereby formed.

Figure 7:
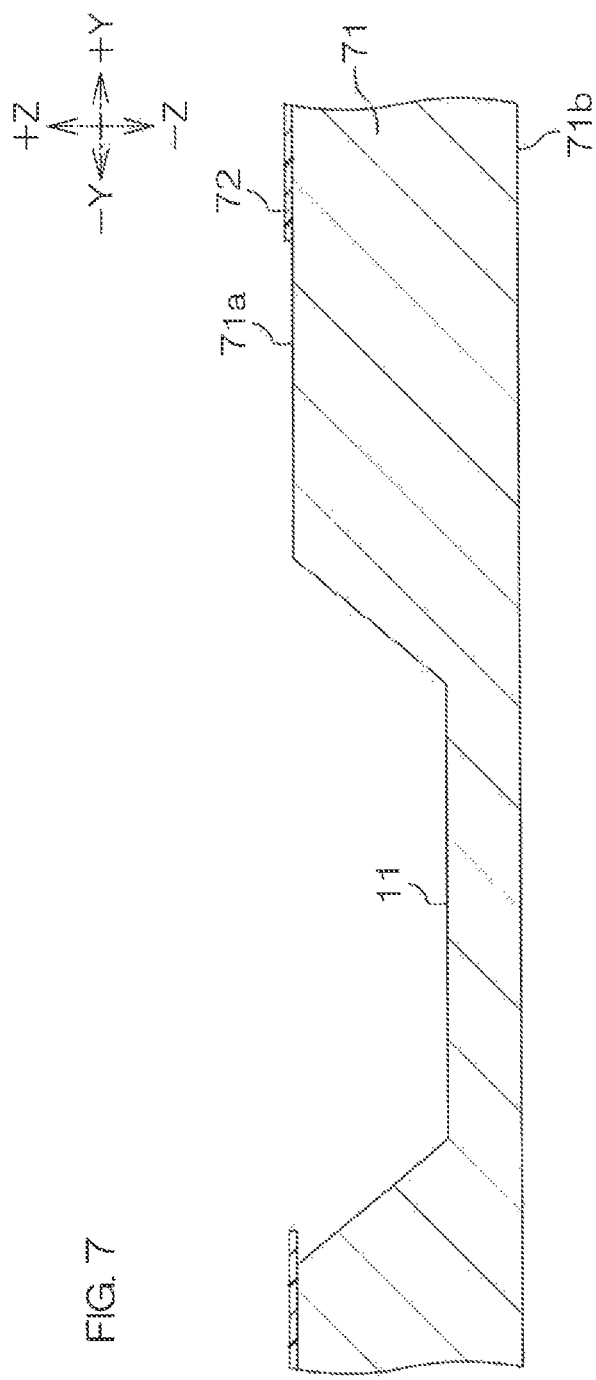
FIG. 7 is an illustrative sectional view of a step subsequent to that of FIG. 6.

Next, as shown in FIG. 7, a portion of the masking oxide film 72 corresponding to a region at which the second recess 12 is to be formed is removed by photolithography and etching.

Figure 8:
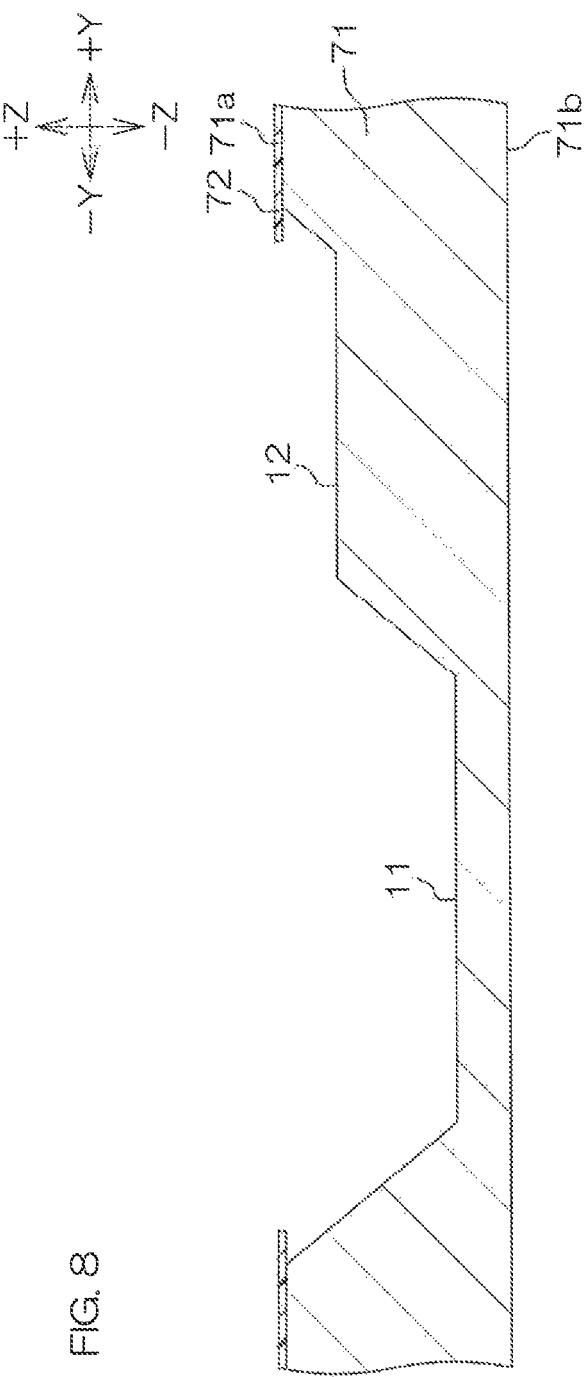
FIG. 8 is an illustrative sectional view of a step subsequent to that of FIG. 7.

Next, a hard mask constituted of the masking oxide film 72 is used to etch the Si substrate 71 as shown in FIG. 8. The second recess 12 connecting to the first recess 11 is thereby formed.

Figure 9:
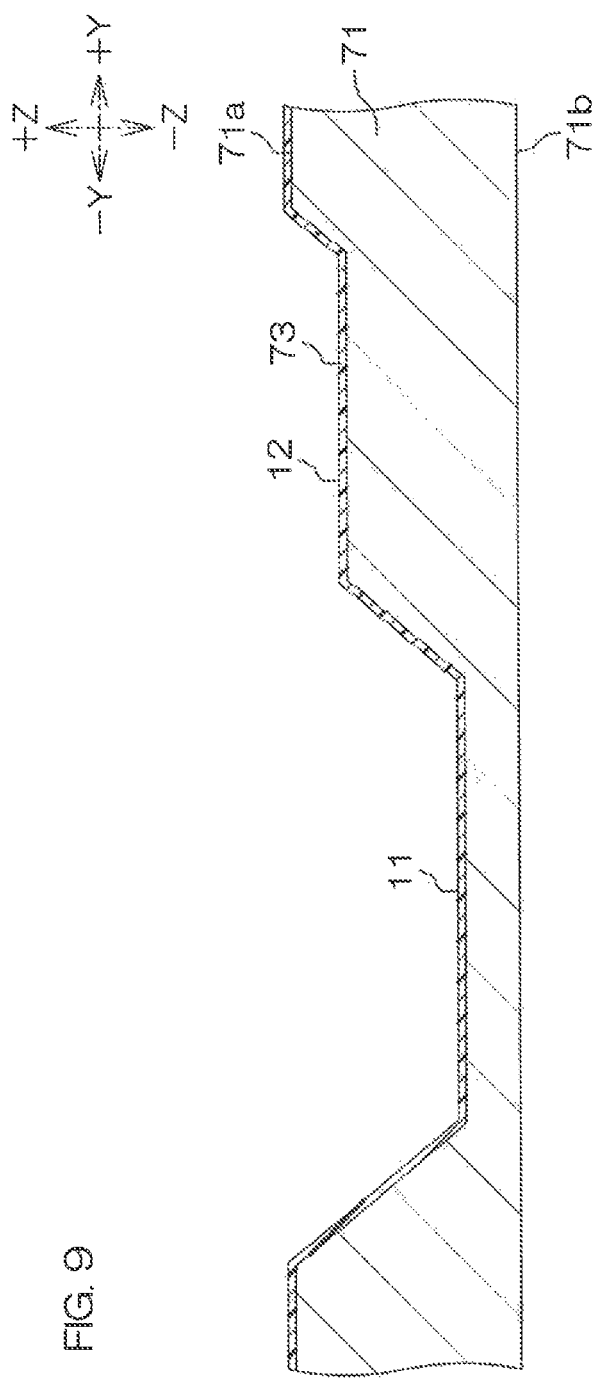
FIG. 9 is an illustrative sectional view of a step subsequent to that of FIG. 8.

Next, as shown in FIG. 9, the masking oxide film 72 is removed by etching. Thereafter, an insulating layer 73, constituted of $SiO_2$, is formed, for example, by the thermal oxidation on an entire surface of the major surface 71a including inner surfaces of the recesses 11 and 12 of the Si substrate 71.

Figure 10:
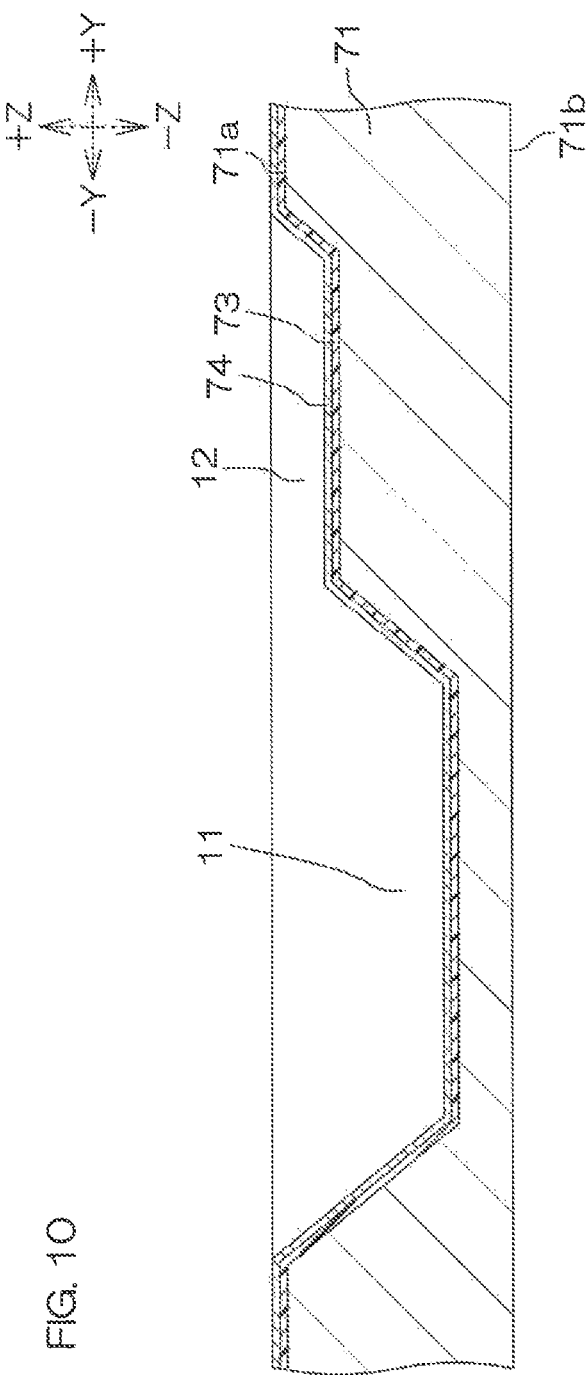
FIG. 10 is an illustrative sectional view of a step subsequent to that of FIG. 9.

Next, as shown in FIG. 10, a barrier seed layer 74, which is a material layer of the barrier seed layer 20A of the wiring film 20, is formed, for example, by the sputtering method so as to cover an entirety of the insulating layer 73. Specifically, first, the barrier layer constituted of Ti is formed on the insulating layer 73 by the sputtering method. Thereafter, the seed layer constituted of Cu is formed on the Ti barrier layer by the sputtering method.

Figure 11:
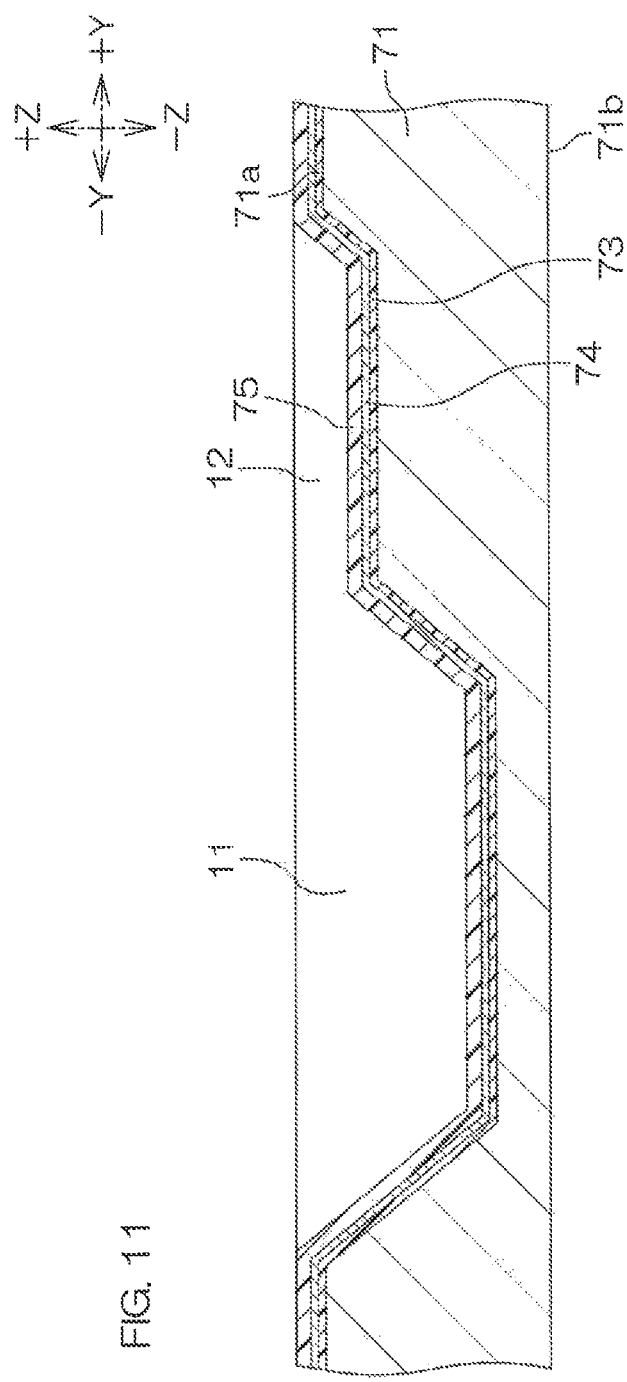
FIG. 11 is an illustrative sectional view of a step subsequent to that of FIG. 10.

Next, as shown in FIG. 11, a photoresist film 75 is formed so as to cover a surface of the barrier seed layer 74.

Figure 12:
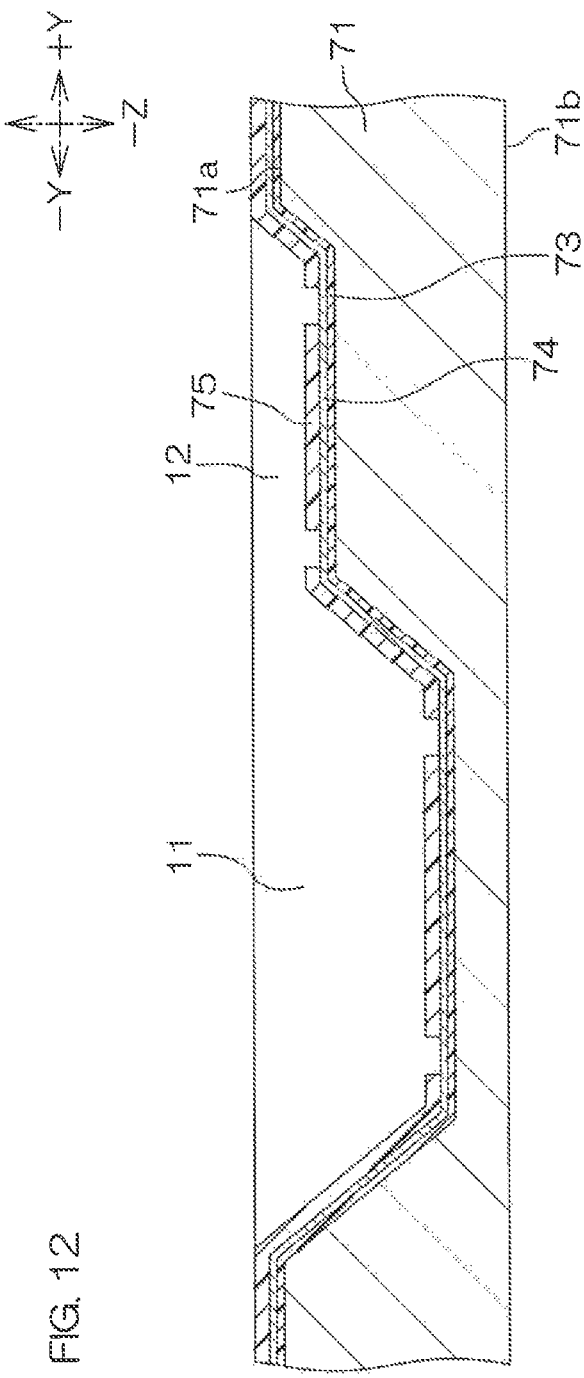
FIG. 12 is an illustrative sectional view of a step subsequent to that of FIG. 11.

Next, as shown in FIG. 12, portions of the photoresist film 75 corresponding to regions at which the wiring film 20 is to be formed, are removed by photolithography and etching. Portions of the barrier seed layer 74 corresponding to the regions at which the wiring film 20 is to be formed are thereby exposed from the portions at which the photoresist film 75 has been removed.

Figure 13:
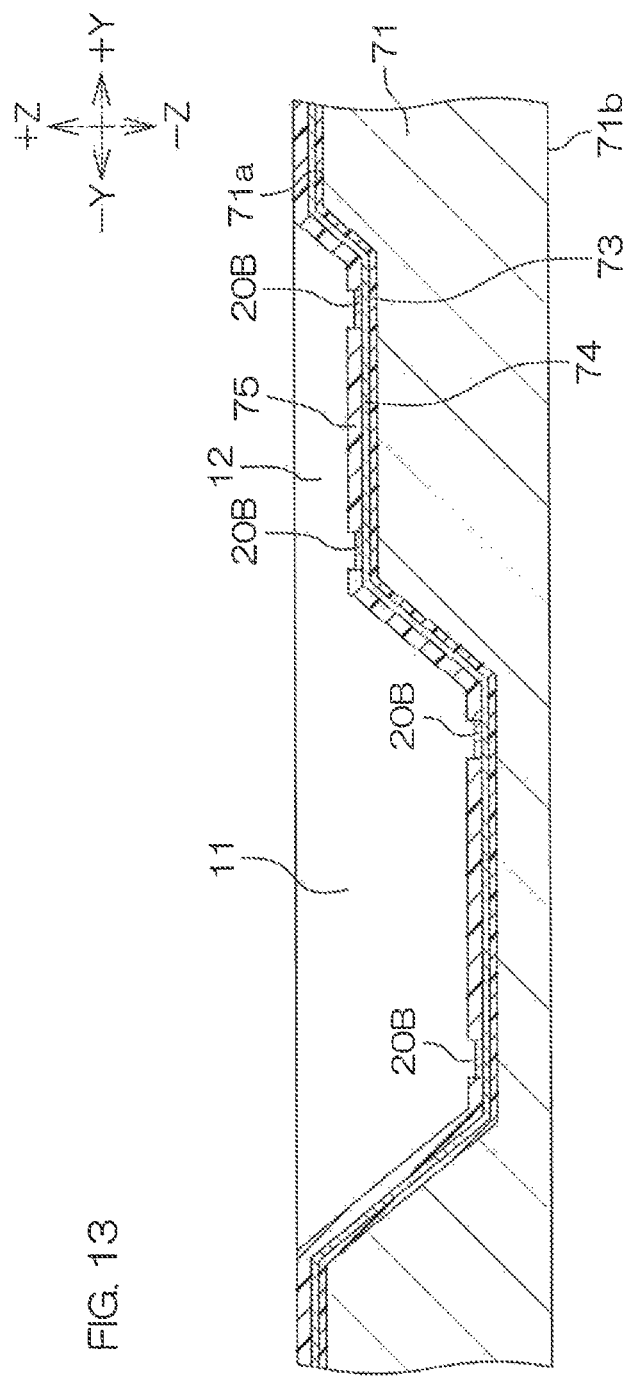
FIG. 13 is an illustrative sectional view of a step subsequent to that of FIG. 12.

Next, as shown in FIG. 13, the plating layer 20B is formed at the exposed portions of the barrier seed layer 74. The forming of the plating layer 20B is performed, for example, by electroplating utilizing the seed layer of the barrier seed layer 74. A pattern of the plating layer 20B thus formed matches a pattern of the wiring film 20 at a final stage.

Figure 14:
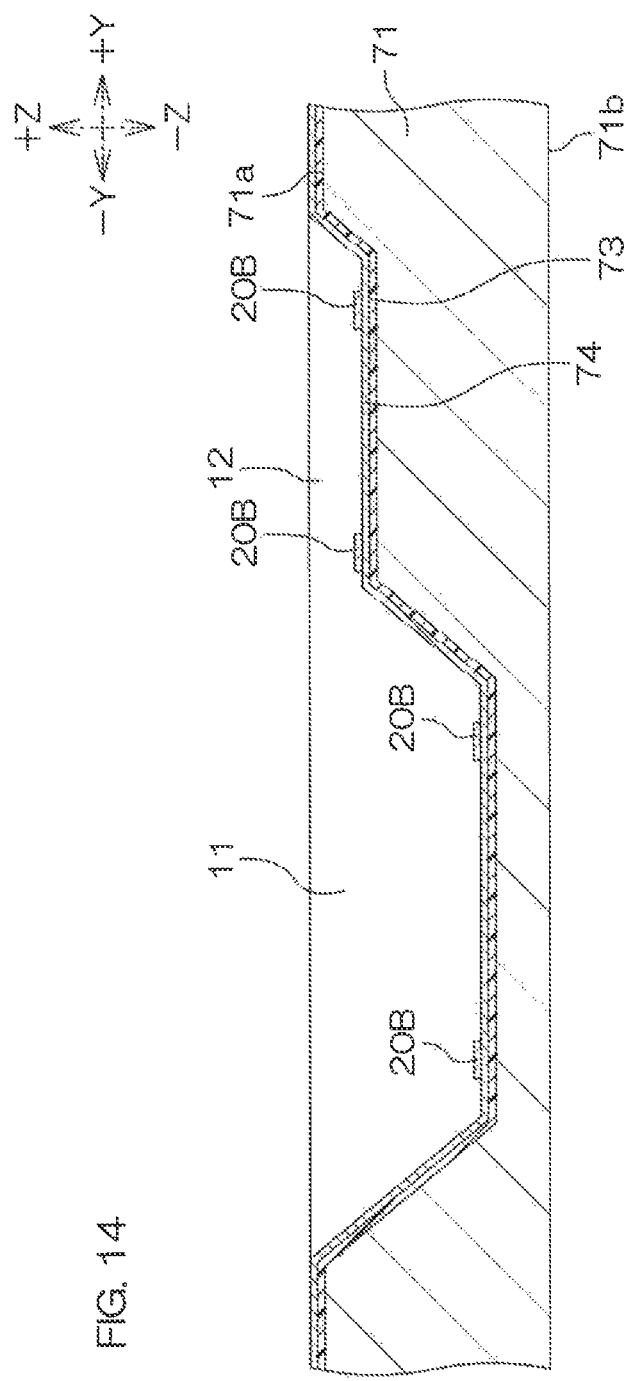
FIG. 14 is an illustrative sectional view of a step subsequent to that of FIG. 13.
Figure 15:
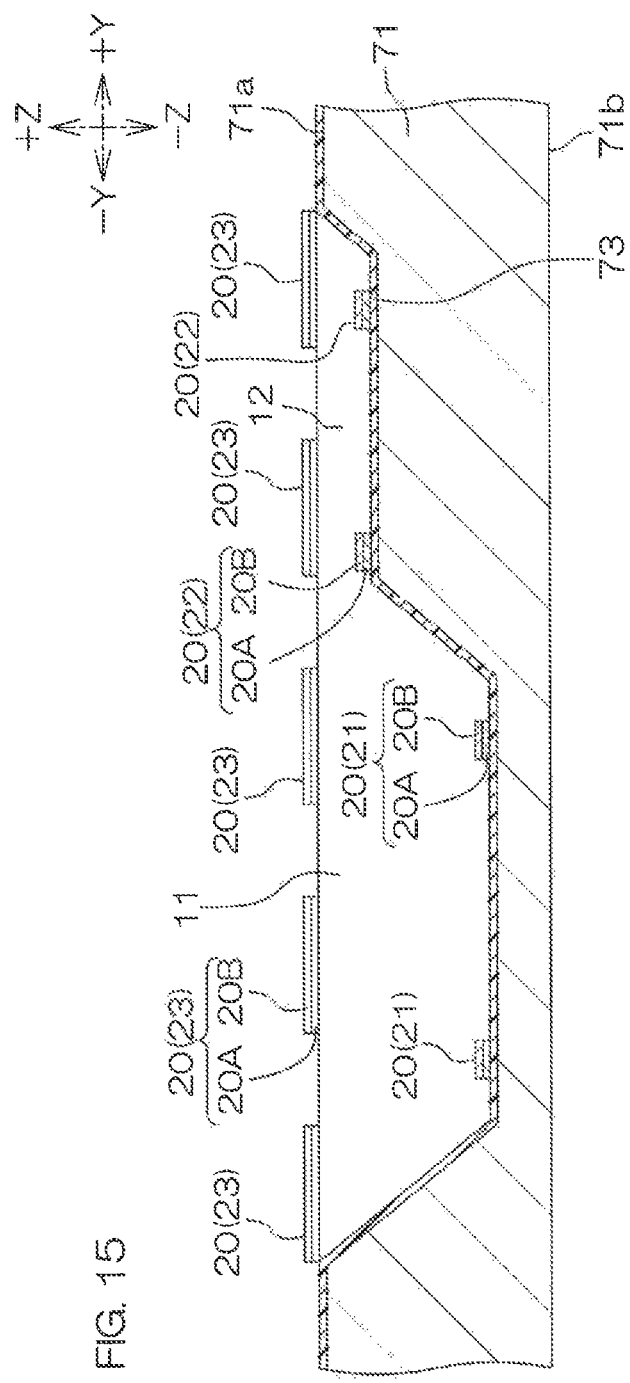
FIG. 15 is an illustrative sectional view of a step subsequent to that of FIG. 14.

Next, as shown in FIG. 14, the photoresist film 75 is removed. Portions of the barrier seed layer 74 at which the plating layer 20B is not laminated are thereby exposed. Thereafter, as shown in FIG. 15, the portions of the barrier seed layer 74 that are exposed from the plating layer 20B are removed, for example, by wet etching. The barrier seed layer 74 thereby becomes the barrier seed layer 20A that is matched in pattern with the final wiring film 20. The wiring film 20, constituted of the barrier seed layer 20A and the plating layer 20B, is thereby obtained.

Figure 16:
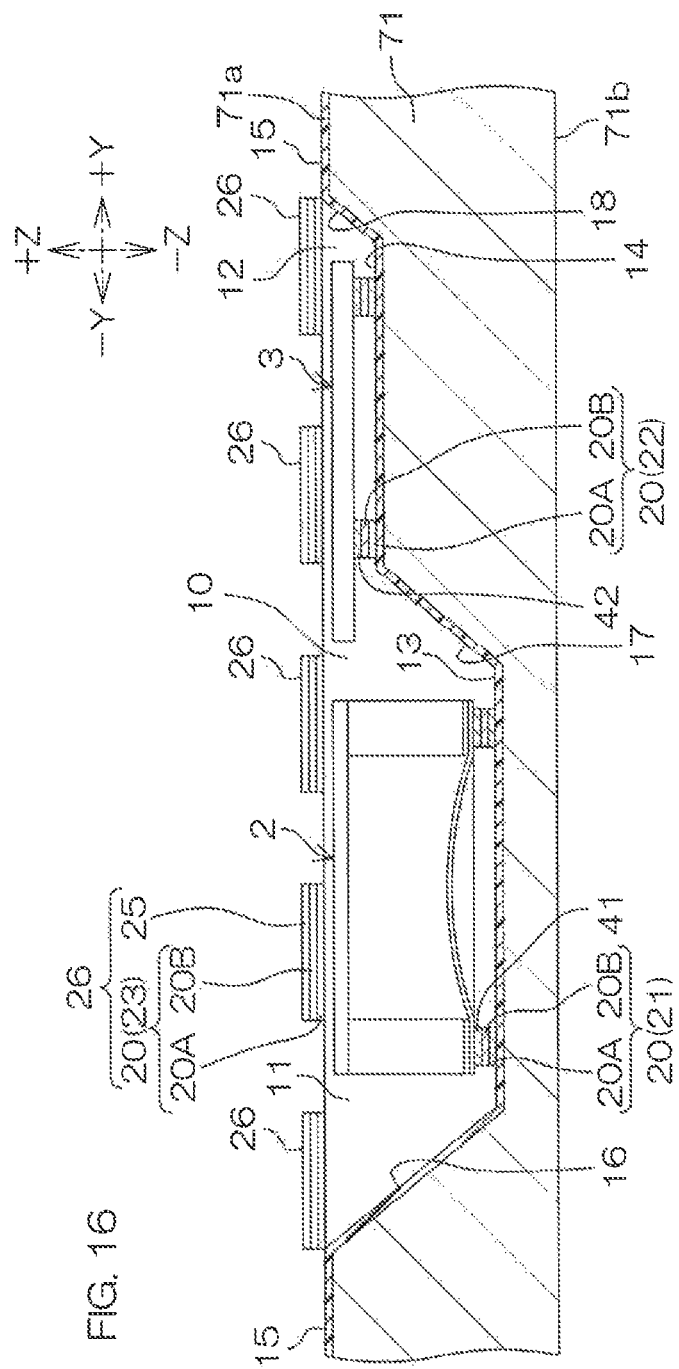
FIG. 16 is an illustrative sectional view of a step subsequent to that of FIG. 15.

Next, as shown in FIG. 16, the air pressure sensor element 2 is bonded to the low area 13 and the integrated circuit element 3 is bonded to the middle area 14. Solder balls (unillustrated), each of which is to become the solder layer 41, are formed on the plurality of electrode pads formed on the ambient air contacting surface S of the air pressure sensor element 2. After the solder balls are coated with flux, the solder balls of the air pressure sensor element 2 are set on the first pads 21 formed on the low area 13.

Similarly, solder balls (unillustrated), each of which is to become the solder layer 42, are formed on the plurality of electrode pads formed on the mounting surface of the integrated circuit element 3. After the solder balls are coated with flux, the solder balls of the integrated circuit element 3 are set on the second pads 22 formed on the middle area 14. By then melting the solder balls by a reflow furnace and thereafter hardening the solder balls, the plurality of electrode pads of the air pressure sensor element 2 are bonded to the first pads 21 via the solder layer 41, and the plurality of electrode pads of the integrated circuit element 3 are bonded to the second pads 22 via the solder layer 42. Thereafter, the bumps 25, constituted of a metal, for example, Ni, Pd, or Au, etc., are formed on the third pads 23. The plurality of external terminals 26, each constituted of a third pad 23 and a bump 25, are thereby formed in the high area 15 of the supporting substrate 4.

Figure 17:
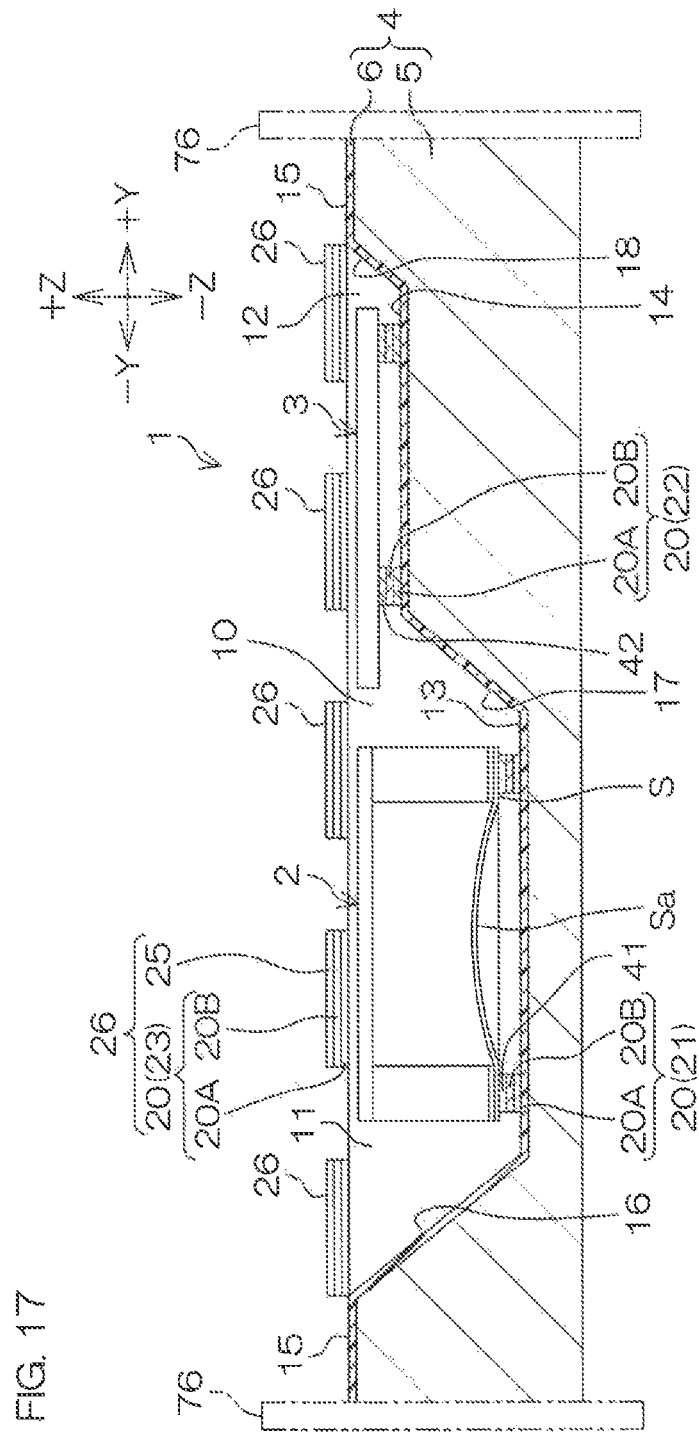
FIG. 17 is an illustrative sectional view of a step subsequent to that of FIG. 16.

Next, as shown in FIG. 17, the Si substrate 71 is cut by a dicer 76 along dicing lines set on the major surface 71a of the Si substrate 71. The wafer-shaped silicon substrate 71 is thereby diced into individual air pressure detecting devices. The Si substrate 71 thereby becomes the base member 5, the insulating layer 73 becomes the insulating layer 6, and the supporting substrate 4 is constituted of the base member 5 and the insulating layer 6. The air pressure detecting device 1 shown in FIG. 1 to FIG. 3 is thereby obtained.

Figure 18:
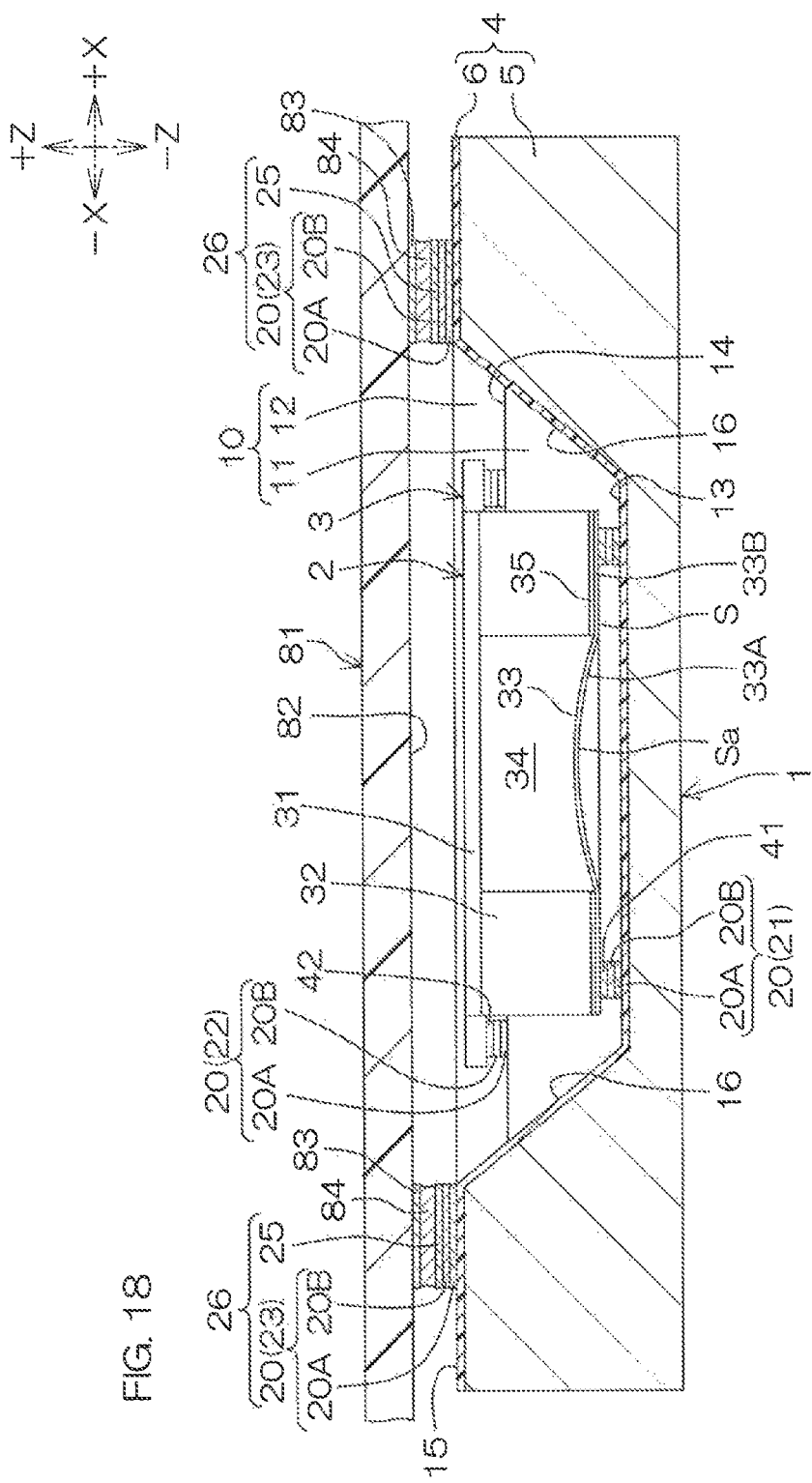
FIG. 18 is an illustrative sectional view of a mounting state of the air pressure detecting device shown in FIG. 1.

FIG. 18 is an illustrative sectional view of a mounting state of the first air pressure detecting device shown in FIG. 1 and shows a section plane corresponding to FIG. 2.

A plurality of lands 83 are formed on a surface 82 of a wiring substrate (mounting substrate) 81. The air pressure detecting device 1 is surface-mounted onto the surface 82 of the wiring substrate (mounting substrate) 81 with the bumps 25 facing the surface 82. Cream solder 84 is coated on the plurality of lands 83. In surface-mounting the air pressure detecting device 1 onto the wiring substrate 81, the third pads 23 of the air pressure detecting device 1 are bonded to the lands 83 via the cream solder 84 and the bumps 25.

In a state where the air pressure detecting device 1 has been mounted on the wiring substrate 81, a gap, corresponding to a sum thickness of a thickness of the third pad 23 and a thickness of the bump 25, cream solder 84, and land 83, is present between a surface of the high area 15 of the supporting substrate 4 of the air pressure detecting device 1 and the wiring substrate 81. As mentioned above, the gap corresponding to at least the thickness of the first pad 21 is present between the ambient air contacting surface S of the air pressure sensor element 2 and the low area 13 of the supporting substrate 4. The ambient air can thus flow into the gap between the ambient air contacting surface S (ambient air contacting region Sa) of the air pressure sensor element 2 and the low area 13 of the supporting substrate 4 through the gap, between the wiring substrate 81 and the air pressure detecting device 1, and the recess 10. An external surface (ambient air contacting region Sa) of the movable portion 33A of the diaphragm 33 of the air pressure detecting device 1 is thus put in a state of being exposed to the ambient air to enable air pressure detection using the air pressure sensor element 2.

With the first air pressure detecting device 1 described above, the air pressure sensor element 2 is bonded to the low area 13 of the supporting substrate 4 in the face-down state with its ambient air contacting surface S being made to face the low area 13. The ambient air contacting surface S (ambient air contacting region Sa) of the air pressure sensor element 2 is thereby protected by the supporting substrate 4 arranged to support the air pressure sensor element 2, and therefore there is no need to separately provide a cover arranged to protect the ambient air contacting surface S (ambient air contacting region Sa) of the air pressure sensor element 2. Even in such a case where the air pressure sensor element 2 is bonded in the face-down state to the supporting substrate 4, the gap, corresponding to at least the thickness of the first pad 21 is formed between the ambient air contacting region Sa of the air pressure sensor element 2 and the low area 13 of the supporting substrate 4, and the ambient air contacting region Sa of the air pressure sensor element 2 can thus be exposed to the ambient air through the recess 10. Hindrance to air pressure detection thus does not arise.

Figure 19:
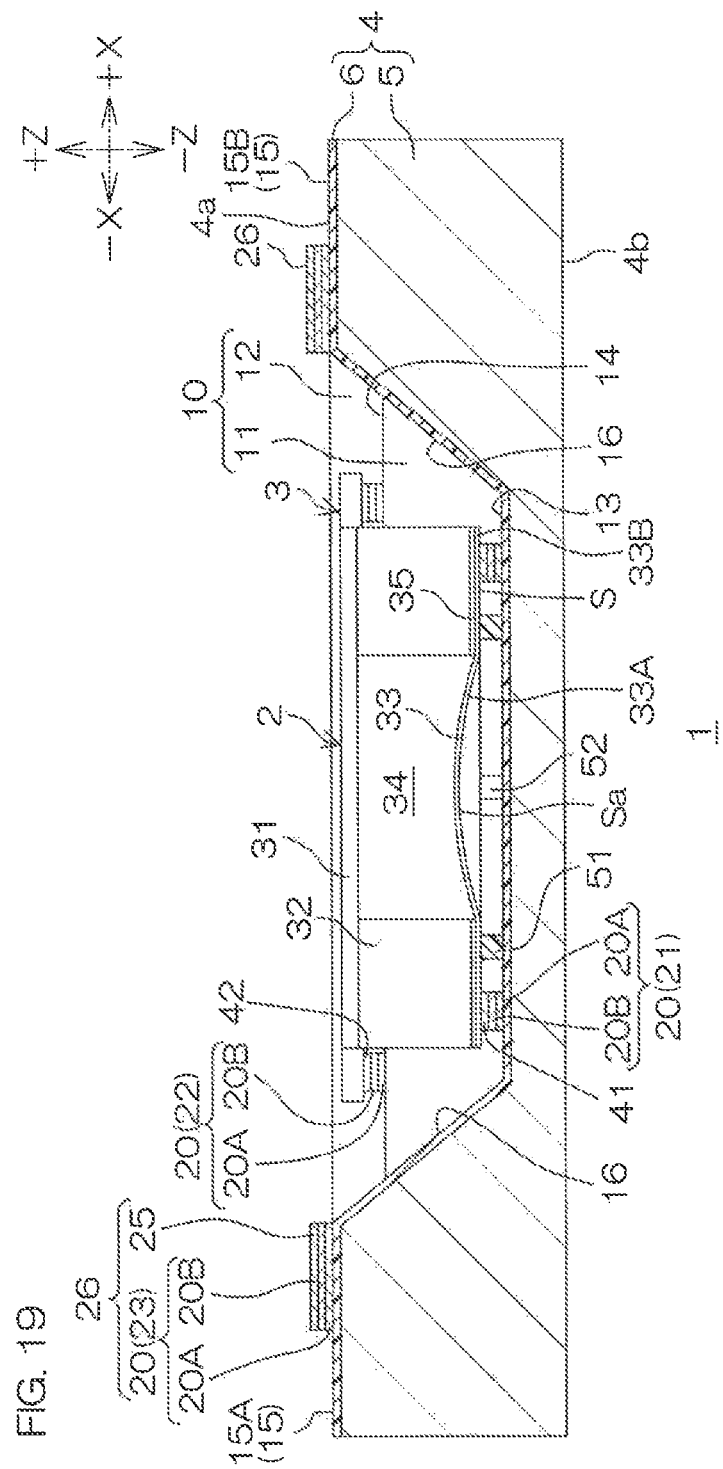
FIG. 19 is an illustrative sectional view of a modification example of the first air pressure detecting device.

FIG. 19 is an illustrative sectional view of a modification example of the first air pressure detecting device and shows a section plane corresponding to FIG. 2. In FIG. 19, portions corresponding to the respective portions of FIG. 2 described above are indicated by attaching the same symbols as in FIG. 2.

Figure 20:
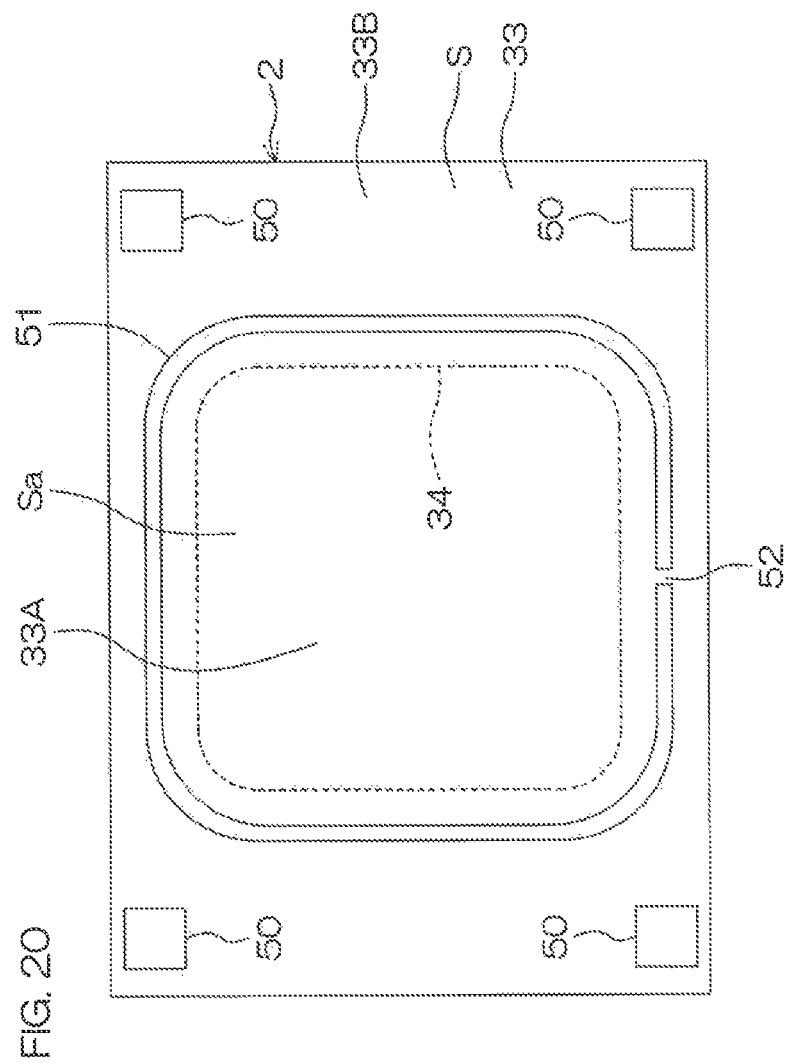
FIG. 20 is a view as viewed from a −Z direction side of an ambient air contacting surface of an air pressure sensor element used in the air pressure detecting device of FIG. 19.

In comparison to the first air pressure detecting device 1 shown in FIG. 1 to FIG. 3, the air pressure detecting device 1 of FIG. 19 differs in only the air pressure sensor element 2. FIG. 20 is a view as viewed from the −Z direction side of the ambient air contacting surface S of the air pressure sensor element 2 used in the air pressure detecting device 1 of FIG. 19. In FIG. 20, the solder layer 41 is omitted and therefore the electrode pads are apparent on the ambient air contacting surface S.

Four electrode pads 50 are formed on the ambient air contacting surface S of the air pressure sensor element 2. In the −Z direction view, the four electrode pads 50 are disposed at four corners of the ambient air contacting surface S of the air pressure sensor element 2. On an outer surface (−Z direction-side surface) of the fixed portion 33B of the diaphragm 33, a waterproof/dustproof wall 51, which is disconnected at least at one location, is formed so as to substantially surround the movable portion 33A (ambient air contacting region Sa) of the diaphragm 33. With the present example, in the −Z direction view, the waterproof/dustproof wall 51 is of rectangular annular shape with ends and has a disconnected portion (cutout portion) 52 formed at only one location. Also with the present example, the waterproof/dustproof wall 51 is formed so as to run along an inner side of the four electrode pads 50 in the −Z direction view.

Figure 21:
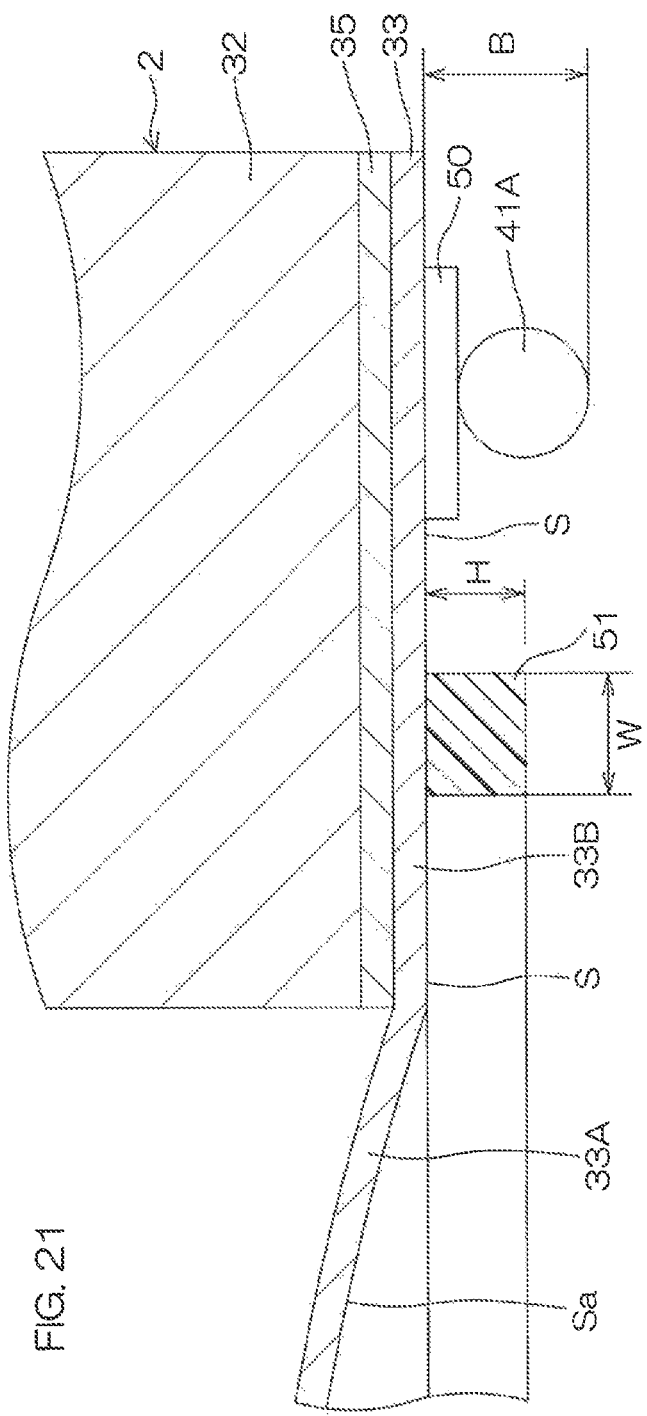
FIG. 21 is a partially enlarged sectional view of the air pressure sensor element used in the air pressure detecting device of FIG. 19.

The waterproof/dustproof wall 51 projects in the −Z direction from the outer surface of the diaphragm 33. A projection length (Z direction length) of the waterproof/ dustproof wall 51 is preferably set to a length such that when the air pressure sensor element 2 is bonded to the low area 13 of the supporting substrate 4, a projecting end of the waterproof/dustproof wall 51 is press-contacted or contacted with the surface of the low area 13. Specifically, as shown in FIG. 21, a length H from the outer surface of the diaphragm 33 to the projecting end of the waterproof/ dustproof wall 51 is set to be smaller than a length B from the outer surface of the diaphragm 33 to a projecting end of a solder ball 41A when the solder ball 41A, which is to become the solder layer 41, is formed on the electrode pad 50 of the air pressure sensor element 2 in a state before the air pressure sensor element 2 is bonded to the low area 13 of the supporting substrate 4. An aspect ratio R (H/W), defined as a ratio of the height H of the waterproof/dustproof wall 52 with respect to a width of the waterproof/dustproof wall 51, is preferably set so as to be not more than 1 (R≤1).

The waterproof/dustproof wall 51 is constituted of polyimide or other resin, $SiO_2$ or other ceramic, or Cu or other metal, etc. The waterproof/dustproof wall 51 that is constituted of polyimide is formed, for example, as follows. First, polyimide imparted with photosensitivity is coated onto the fixed portion 33B of the diaphragm 33 by a CVD method. Next, after exposing the polyimide in a pattern of a region other than a region in which the waterproof/dustproof wall 51 is to be formed, the polyimide is photosensitized. Lastly, the polyimide is heat-treated. The waterproof/dustproof wall 51 constituted of polyimide is thereby formed.

The waterproof/dustproof wall 51 constituted of $SiO_2$ may be formed, for example, by forming an $SiO_2$ film on the fixed portion 33B of the diaphragm 33 by the CVD method and thereafter patterning the $SiO_2$ film. The waterproof/ dustproof wall 51 constituted of Cu may be formed, for example, by forming a Cu film on the fixed portion 33B of the diaphragm 33 by the sputtering method and thereafter patterning the Cu film.

As in the first air pressure detecting device 1 of FIG. 1, there is no need to separately provide a cover arranged to protect the ambient air contacting surface S of the air pressure sensor element 2 in the air pressure detecting device 1 of FIG. 19 as well. Also with the air pressure detecting device 1 of FIG. 19, the waterproof/dustproof wall 51 of rectangular annular shape with ends in a plan view is formed on the −Z direction-side surface of the fixed portion 33B of the diaphragm 33 so as to substantially surround the movable portion 33A (ambient air contacting region Sa) and therefore entry of moisture and dust into the gap between the movable portion 33A (ambient air contacting region Sa) of the diaphragm 33 and the low area 13 of the supporting substrate 4 can be suppressed.

Figure 22:
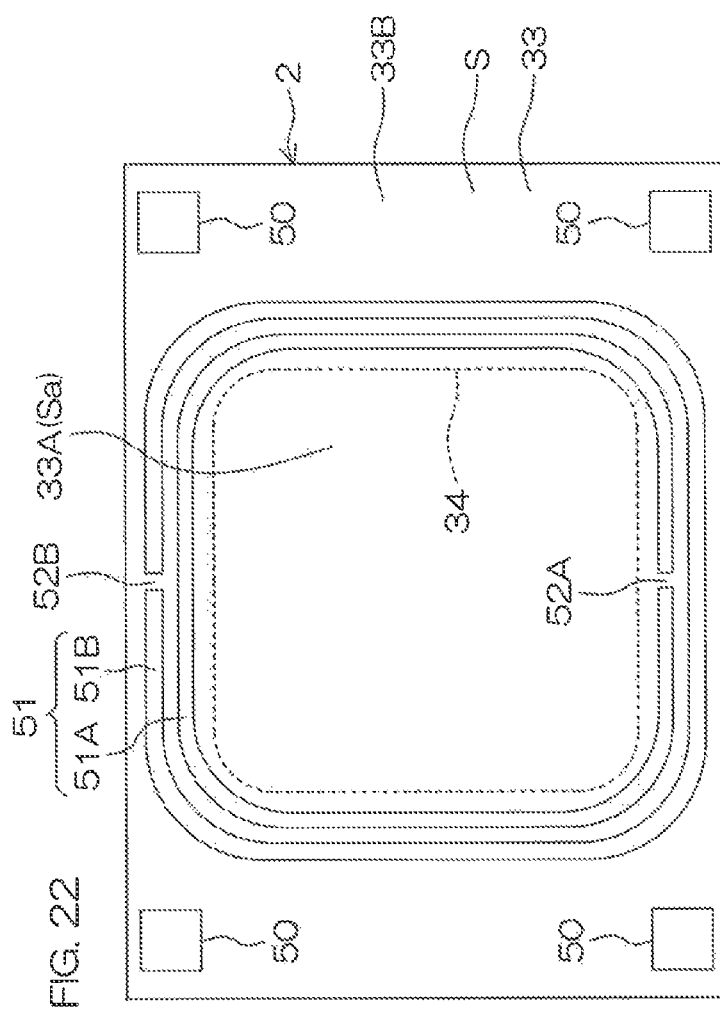
FIG. 22 shows a modification example of a waterproof/dustproof wall and is a view as viewed from the −Z direction side of the ambient air contacting surface of the air pressure sensor element.

As shown in FIG. 22, the waterproof/dustproof wall 51 may be constituted, in the −Z direction view, from a first waterproof/dustproof wall 51A, formed at the fixed portion 33B so as to substantially surround the movable portion 33A of the diaphragm 33, and a second waterproof/dustproof wall 51B, formed at the fixed portion 33B so as to substantially surround the first waterproof/dustproof wall 51A. In the present example, the first and second waterproof/dustproof walls 51A and 51B are of rectangular annular shapes with ends, each having a disconnected portion 52A or 52B at only one location in the −Z direction view.

With the present preferred embodiment, the disconnected portion 52A of the first waterproof/dustproof wall 51A is formed at a length center portion of a portion oriented along one side of the diaphragm 33 and the disconnected portion 52B of the second waterproof/dustproof wall 51B is formed at a length center portion of a portion oriented along another side of the diaphragm 33 that faces the one side. The disconnected portion 52A of the first waterproof/dustproof wall 51A and the disconnected portion 52B of the second waterproof/dustproof wall 51B are thus preferably formed at positions that are shifted with respect to each other in regard to directions oriented along the first or second waterproof/ dustproof wall 51A or 51B in the −Z direction view. In other words, it is preferable for the disconnected portion 52A of the first waterproof/dustproof wall 51A to be formed at a position facing a non-disconnected portion (portion other than the disconnected portion 52B) of the second waterproof/dustproof wall 51B when the second waterproof/ dustproof wall 51B is viewed from the first waterproof/ dustproof wall 51A side. Also, it is preferable for the disconnected portion 52B of the second waterproof/dustproof wall 51B to be formed at a position facing a non-disconnected portion (portion other than the disconnected portion 52A) of the first waterproof/dustproof wall 51A when the first waterproof/dustproof wall 51A is viewed from the second waterproof/dustproof wall 51B side. This is because by arranging thus, the entry of moisture and dust into the ambient air contacting region Sa of the air pressure sensor element 2 can be suppressed more effectively.

Figure 23:
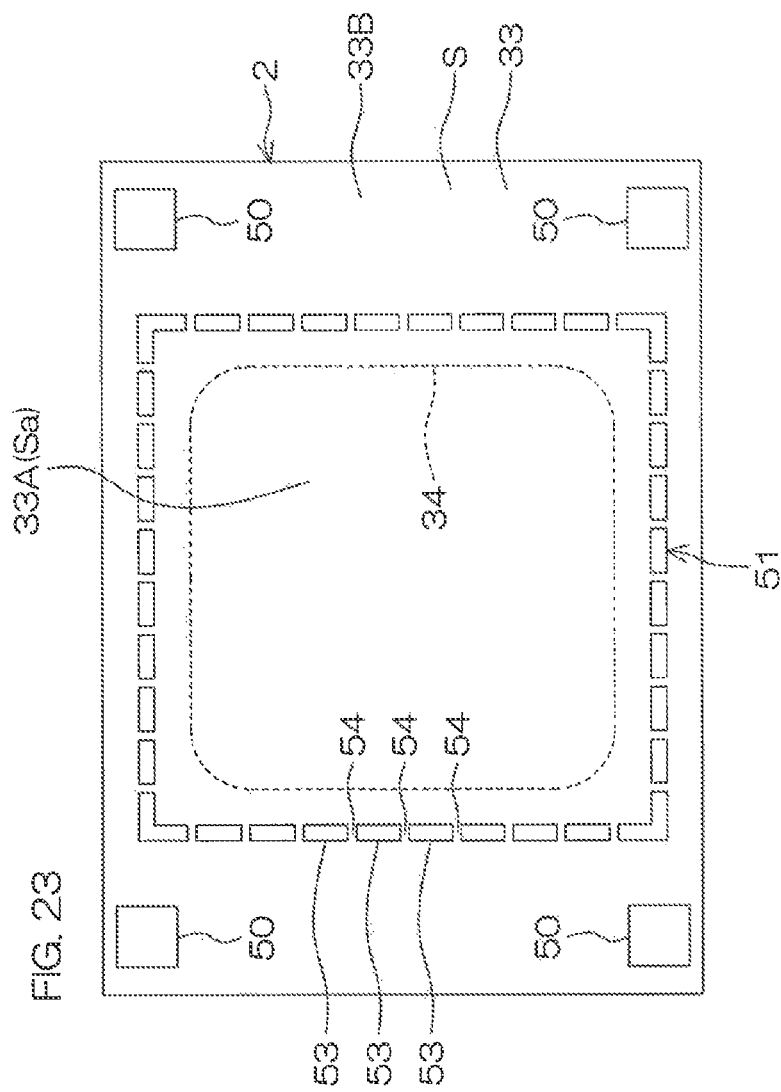
FIG. 23 shows another modification example of a waterproof/dustproof wall and is a view as viewed from the −Z direction side of the ambient air contacting surface of the air pressure sensor element.

The waterproof/dustproof wall 51 may also be of an arrangement where, in the −Z direction view, rectangular portions 53, having longitudinal directions oriented along an annular virtual line surrounding the movable portion 33A (ambient air contacting region Sa), and disconnected portions 54 are formed alternately at the fixed portion 33B of the diaphragm 33 as shown in FIG. 23.

Figure 24:
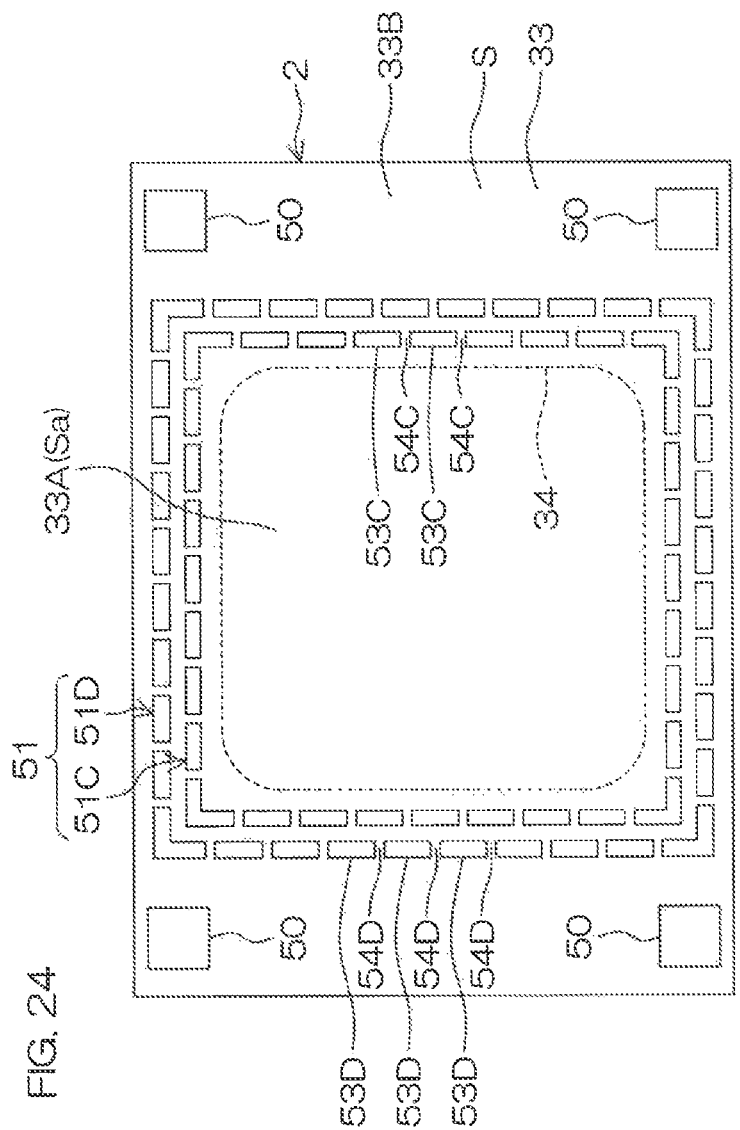
FIG. 24 shows yet another modification example of a waterproof/dustproof wall and is a view as viewed from the −Z direction side of the ambient air contacting surface of the air pressure sensor element.

Also as shown in FIG. 24, the waterproof/dustproof wall 51 may be constituted, in the −Z direction view, from a first waterproof/dustproof wall 51C, formed at the fixed portion 33B so as to substantially surround the movable portion 33A (ambient air contacting region Sa) of the diaphragm 33, and a second waterproof/dustproof wall 51D, formed at the fixed portion 33B so as to substantially surround the first waterproof/dustproof wall 51C. The first waterproof/dustproof wall 51C is of an arrangement where, in the −Z direction view, rectangular portions 53C, having longitudinal directions oriented along a first annular virtual line surrounding the movable portion 33A (ambient air contacting region Sa), and disconnected portions 54C are formed alternately. The second waterproof/dustproof wall 51D is of an arrangement where, in the −Z direction view, rectangular portions 53D, having longitudinal directions oriented along a second annular virtual line surrounding the first waterproof/dustproof wall 51C, and disconnected portions 54D are formed alternately.

The respective disconnected portions 54C of the first waterproof/dustproof wall 51C and the respective disconnected portions 54D of the second waterproof/dustproof wall 51D are preferably formed at positions that are shifted with respect to each other in regard to directions oriented along the first or second annular virtual line as shown in FIG. 24. In other words, it is preferable for the respective disconnected portions 54C of the first waterproof/dustproof wall 51C to be formed at positions facing any of the rectangular portions 53D of the second waterproof/dustproof wall 51D when the second waterproof/dustproof wall 51D is viewed from the first waterproof/dustproof wall 51C side. Also, it is preferable for the respective disconnected portions 54D of the second waterproof/dustproof wall 51D to be formed at positions facing any of the rectangular portions 53C of the first waterproof/dustproof wall 51C when the first waterproof/dustproof wall 51C is viewed from the second waterproof/dustproof wall 51D side. This is because by arranging thus, the entry of moisture and dust into the ambient air contacting region Sa of the air pressure sensor element 2 can be suppressed more effectively.

In place of or in addition to forming the waterproof/dustproof wall 51 on the ambient air contacting surface of the air pressure sensor element 2, a waterproof/dustproof wall 55 may be formed in the high area 15 of the supporting substrate 4.

Figure 25:
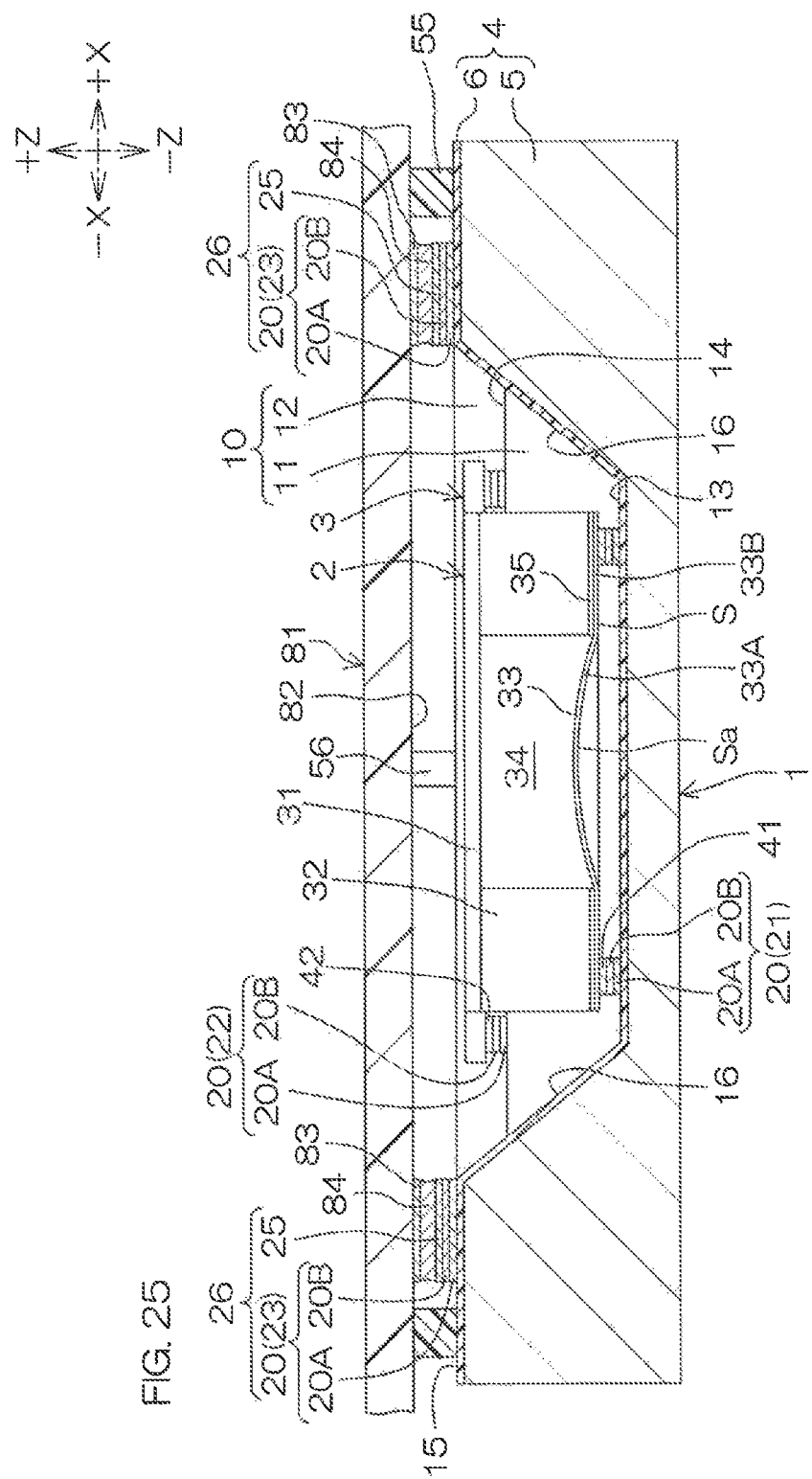
FIG. 25 is an illustrative sectional view of an example where a waterproof/dustproof wall is formed in a high area of a supporting substrate.
Figure 26:
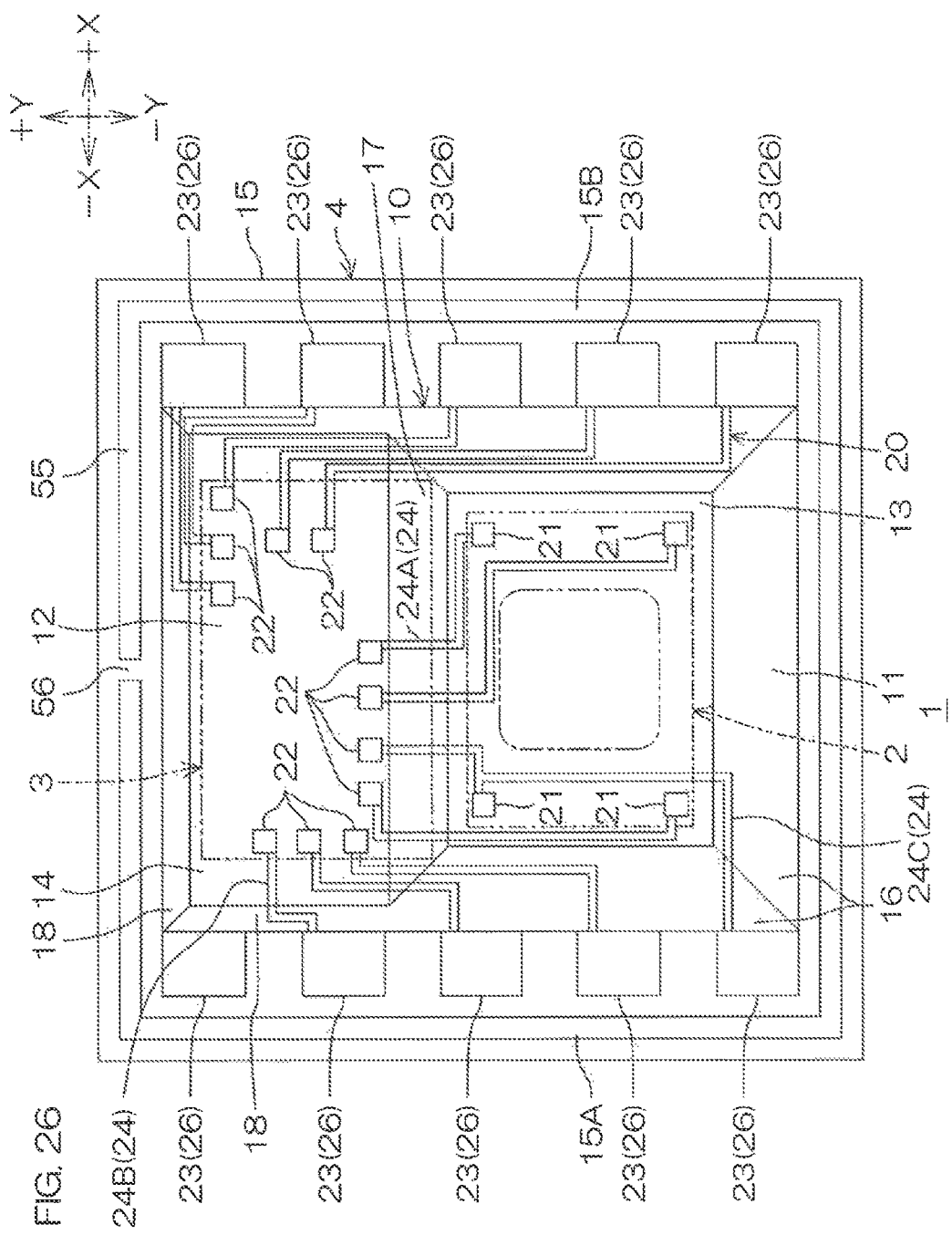
FIG. 26 is an illustrative plan view of the waterproof/dustproof wall formed in the high area of the supporting substrate.

FIG. 25 is an illustrative sectional view of an example where the waterproof/dustproof wall is formed in the high area of the supporting substrate and shows a section plane corresponding to FIG. 18. FIG. 26 is an illustrative plan view of the waterproof/dustproof wall formed in the high area of the supporting substrate. Although in the example of FIG. 25, a waterproof/dustproof wall is not formed on the ambient air contacting surface S of the air pressure sensor element 2, the waterproof/dustproof wall 51 described above may be formed on the ambient air contacting surface S of the air pressure sensor element 2.

In the high area 15 of the supporting substrate 4, the waterproof/dustproof wall 55, which is disconnected at least at one location, is formed so as to substantially surround the recess 10. With the present example, in the Z direction view, the waterproof/dustproof wall 55 is of rectangular annular shape with ends and has a disconnected portion 56 formed at only one location. Also with the present example, the waterproof/dustproof wall 55 is formed so as to run along an outer side of the ten third pads 23 in the Z direction view.

The waterproof/dustproof wall 55 projects in the +Z direction from the high area 15. A projection length (Z direction length) of the waterproof/dustproof wall 55 is preferably set to a length such that when the first air pressure detecting device 1 is mounted on the wiring substrate 81, a projecting end of the waterproof/dustproof wall 55 is press-contacted or contacted with the surface 82 of the wiring substrate 81. The waterproof/dustproof wall 55 is constituted of polyimide or other resin, $SiO_2$ or other ceramic, or Cu or other metal, etc. By thus forming the waterproof/dustproof wall 55 in the high area 15 of the supporting substrate 4, entry of moisture and dust into the recess 10 can be suppressed and therefore the entry of moisture and dust into the gap between the movable portion 33A (ambient air contacting region Sa) of the diaphragm 33 and the low area 13 of the supporting substrate 4 can be suppressed.

Figure 27:
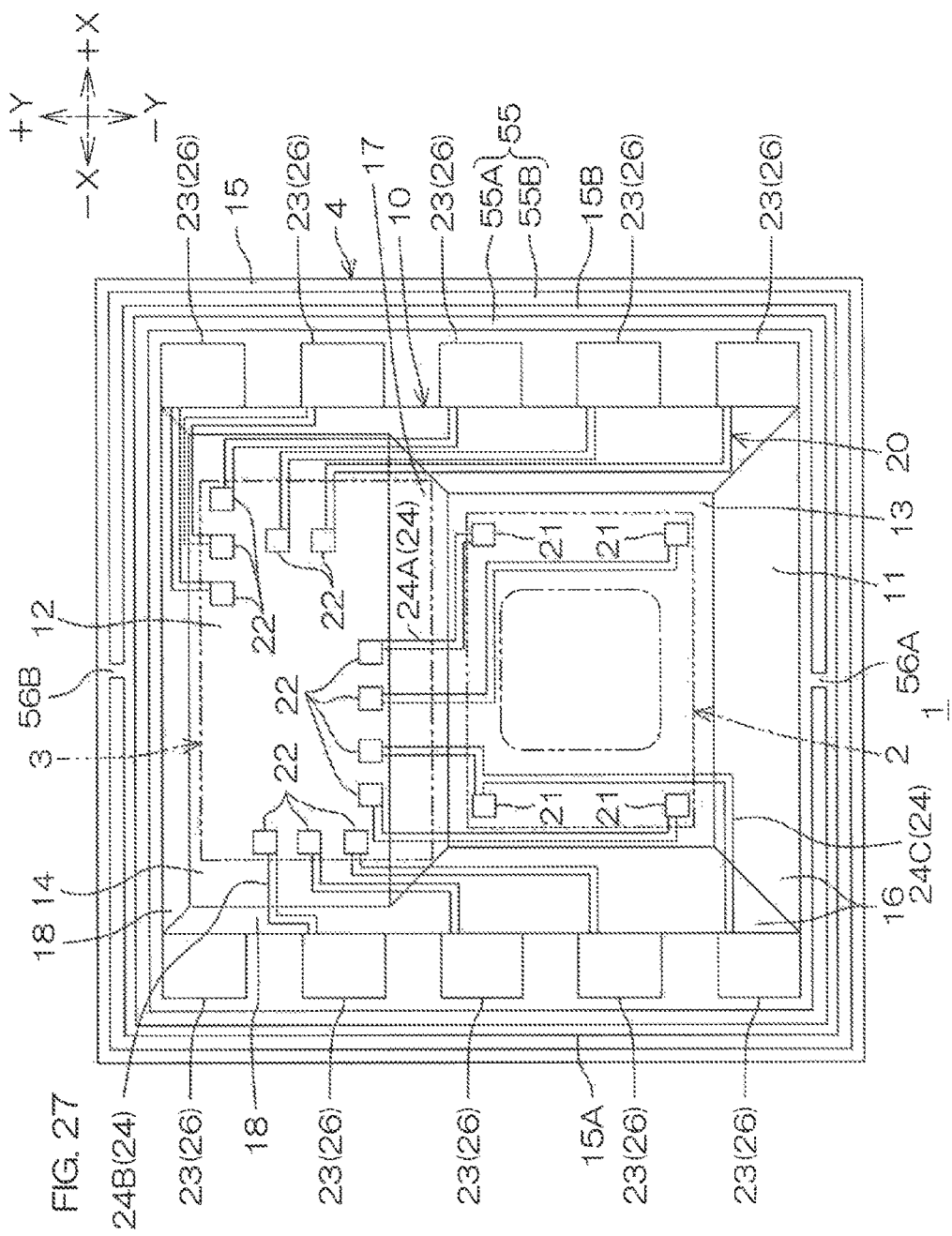
FIG. 27 shows a modification example of the waterproof/dustproof wall formed in the high area of the supporting substrate and is a view as viewed from a +Z direction side of the high area of the supporting substrate.

As shown in FIG. 27, the waterproof/dustproof wall 55 may be constituted, in the Z direction view, from a first waterproof/dustproof wall 55A, formed in the high area 15 so as to substantially surround the recess 10, and a second waterproof/dustproof wall 55B, formed in the high area 15 so as to substantially surround the first waterproof/dustproof wall 55A. In the present example, the first and second waterproof/dustproof walls 55A and 55B are of rectangular annular shapes with ends, each having a disconnected portion 56A or 56B at only one location in the Z direction view.

With the present preferred embodiment, the disconnected portion 56A of the first waterproof/dustproof wall 55A is formed at a length center portion of a portion oriented along one side of the major surface 4a of the supporting substrate 4 and the disconnected portion 56B of the second waterproof/dustproof wall 55B is formed at a length center portion of a portion oriented along another side of the major surface 4a of the supporting substrate 4 that faces the one side. The disconnected portion 56A of the first waterproof/dustproof wall 55A and the disconnected portion 56B of the second waterproof/dustproof wall 55B are thus preferably formed at positions that are shifted with respect to each other in regard to directions oriented along the first or second waterproof/dustproof wall 55A or 55B in the Z direction view. In other words, it is preferable for the disconnected portion 56A of the first waterproof/dustproof wall 55A to be formed at a position facing a non-disconnected portion (portion other than the disconnected portion 56B) of the second waterproof/dustproof wall 55B when the second waterproof/dustproof wall 55B is viewed from the first waterproof/dustproof wall 55A side. Also, it is preferable for the disconnected portion 56B of the second waterproof/dustproof wall 55B to be formed at a position facing a non-disconnected portion (portion other than the disconnected portion 56A) of the first waterproof/dustproof wall 55A when the first waterproof/dustproof wall 55A is viewed from the second waterproof/dustproof wall 55B side.

Figure 28:
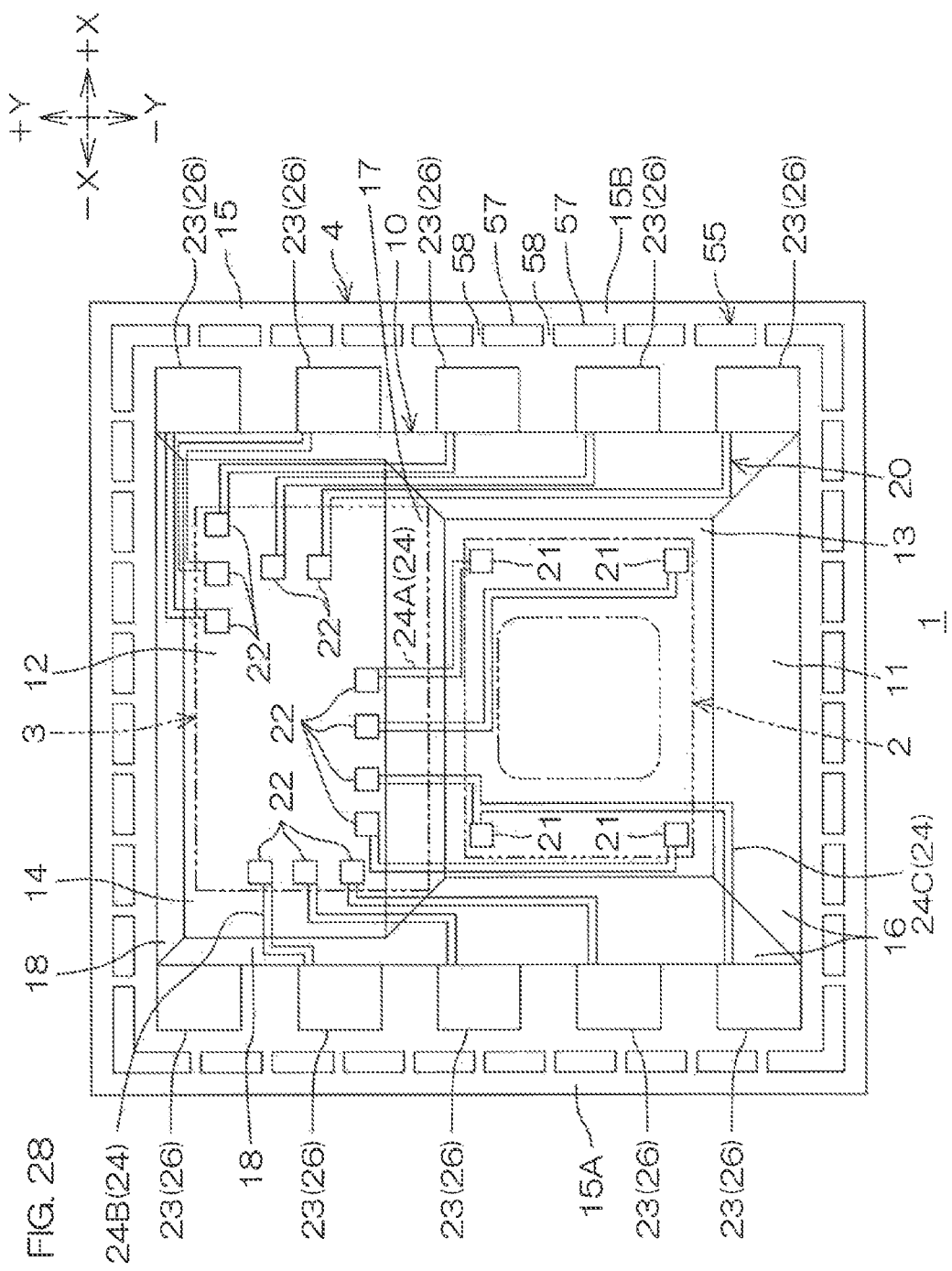
FIG. 28 shows another modification example of the waterproof/dustproof wall formed in the high area of the supporting substrate and is a view as viewed from the +Z direction side of the high area of the supporting substrate.

The waterproof/dustproof wall 55 may also be of an arrangement where, in the Z direction view, rectangular portions 57, having longitudinal directions oriented along an annular virtual line surrounding the movable portion 33A, and disconnected portions 58 are formed alternately at the high area 15 as shown in FIG. 28.

Figure 29:
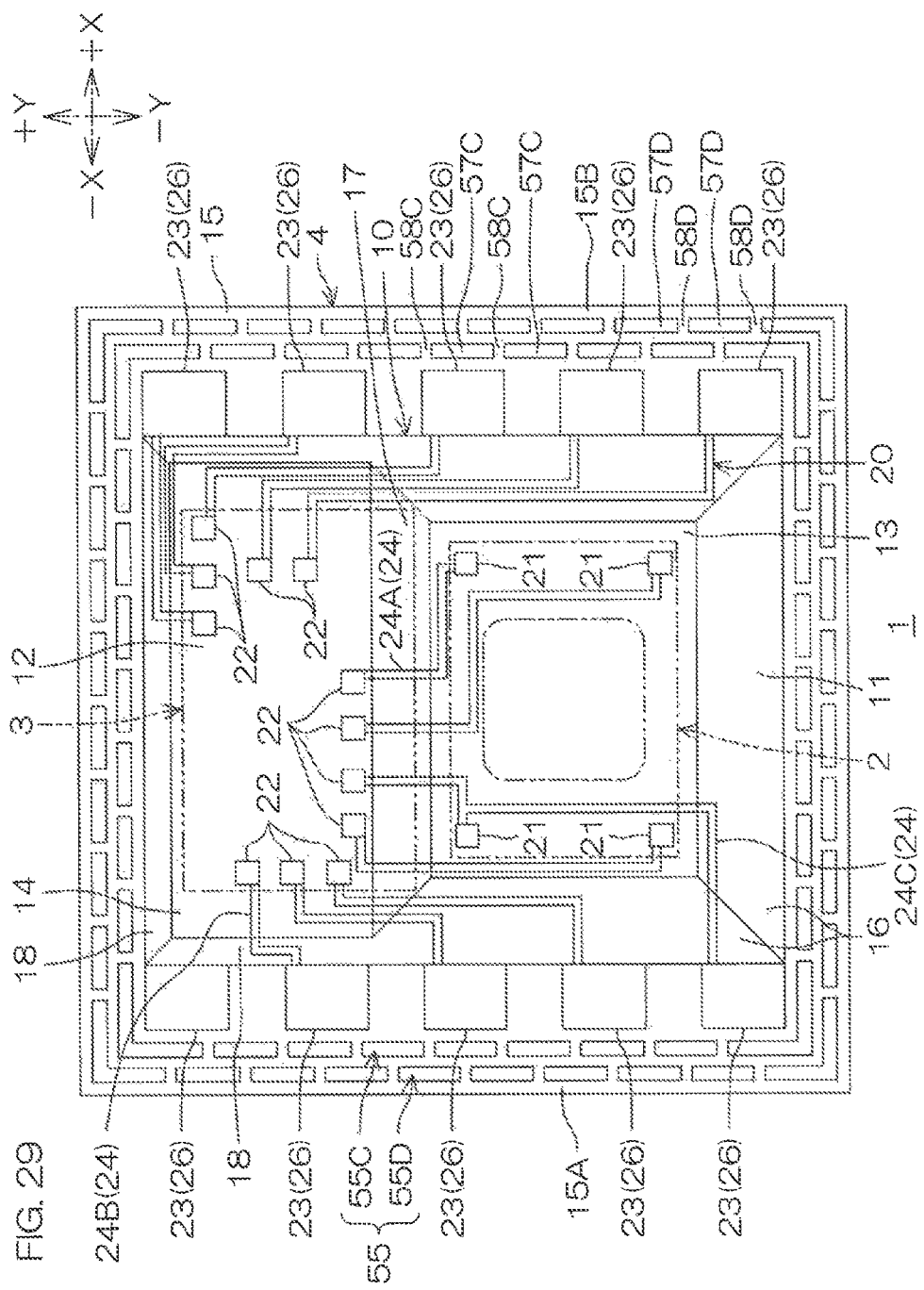
FIG. 29 shows yet another modification example of the waterproof/dustproof wall formed in the high area of the supporting substrate and is a view as viewed from the +Z direction side of the high area of the supporting substrate.

Also as shown in FIG. 29, the waterproof/dustproof wall 55 may be constituted, in the Z direction view, from a first waterproof/dustproof wall 55C, formed in the high area 15 so as to substantially surround the recess 10, and a second waterproof/dustproof wall 55D, formed in the high area 15 so as to substantially surround the first waterproof/dustproof wall 55C. The first waterproof/dustproof wall 55C is of an arrangement where, in the Z direction view, rectangular portions 57C, having longitudinal directions oriented along a first annular virtual line surrounding the recess 10, and disconnected portions 58C are formed alternately. The second waterproof/dustproof wall 55D is of an arrangement where, in the Z direction view, rectangular portions 57D, having longitudinal directions oriented along a second annular virtual line surrounding the first waterproof/dustproof wall 55C, and disconnected portions 58D are formed alternately.

The respective disconnected portions 58C of the first waterproof/dustproof wall 55C and the respective disconnected portions 58D of the second waterproof/dustproof wall 55D are preferably formed at positions that are shifted with respect to each other in regard to directions oriented along the first or second annular virtual line as shown in FIG. 29. In other words, it is preferable for the respective disconnected portions 58C of the first waterproof/dustproof wall 55C to be formed at positions facing any of the rectangular portions 57D of the second waterproof/dustproof wall 55D when the second waterproof/dustproof wall 55D is viewed from the first waterproof/dustproof wall 55C side. Also, it is preferable for the respective disconnected portions 58D of the second waterproof/dustproof wall 55D to be formed at positions facing any of the rectangular portions 57C of the first waterproof/dustproof wall 55C when the first waterproof/dustproof wall 55C is viewed from the second waterproof/dustproof wall 55D side.

Figure 30:
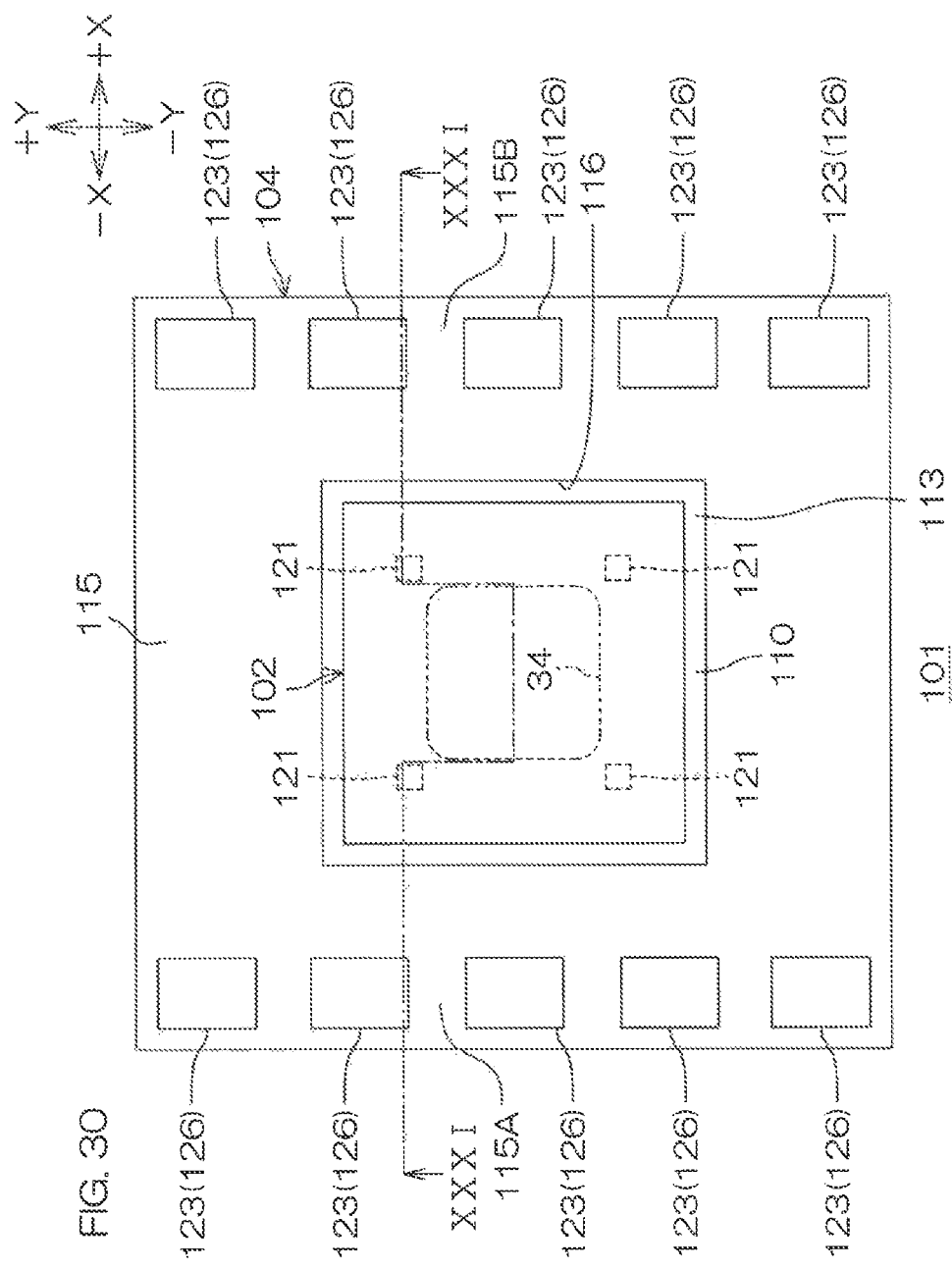
FIG. 30 is an illustrative plan view of a second air pressure detecting device.
Figure 31:
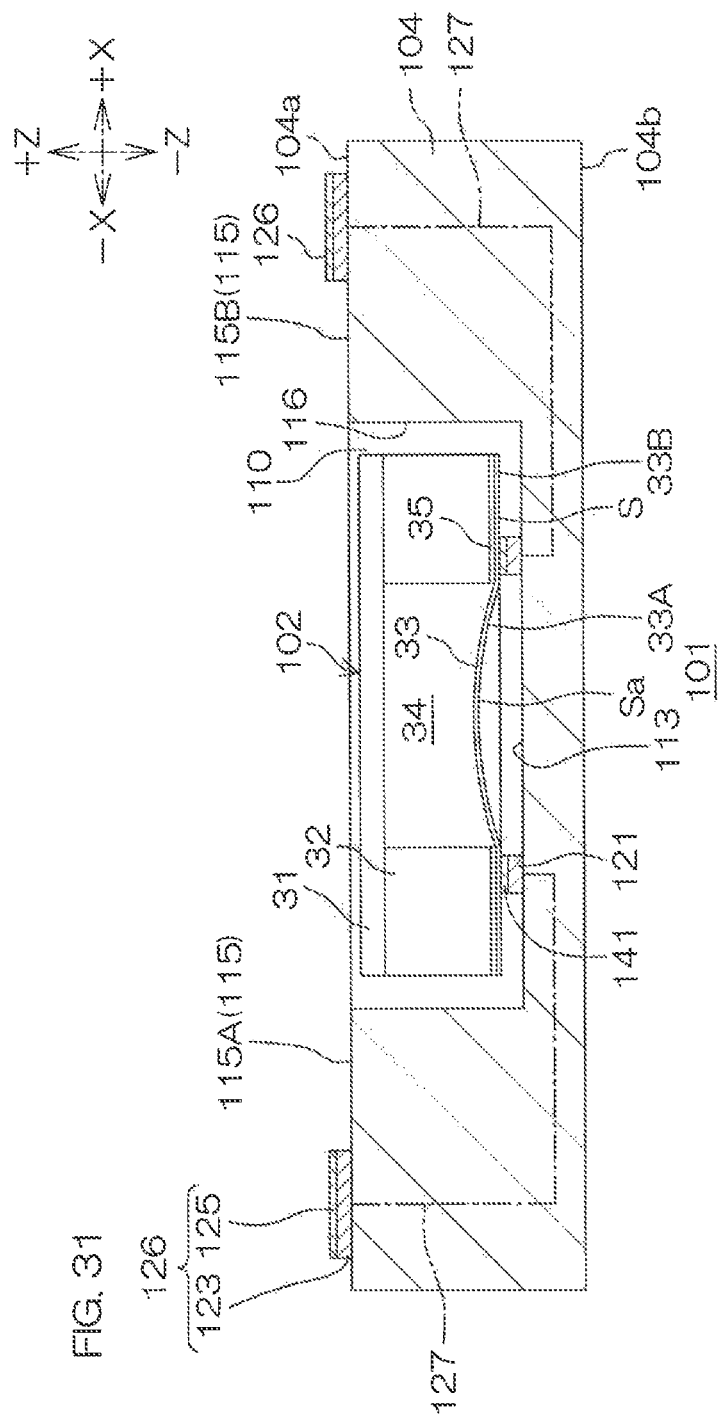
FIG. 31 is an illustrative sectional view taken along line XXXI-XXXI in FIG. 30.

FIG. 30 is an illustrative plan view of a second air pressure detecting device. FIG. 31 is an illustrative sectional view taken along line XXXI-XXXI in FIG. 30.

The second air pressure detecting device 101 includes an air pressure sensor element 102 and a supporting substrate 104 supporting the air pressure sensor element 102. For convenience of description, a +X direction, a −X direction, a +Y direction, and a −Y direction shown in FIG. 30 and a +Z direction and a −Z direction shown in FIG. 31 may be used in the following description.

The supporting substrate 104 is constituted of a multilayer wiring substrate having a wiring layer in its interior. The supporting substrate 104 is formed to a rectangular shape in a plan view (Z direction view) and has a pair of major surfaces 104a and 104b and four lateral surfaces connecting the major surfaces 104a and 104b. At a central portion of one major surface (major surface at the +Z direction side) 104a of the supporting substrate 104 is formed a recess 110 of rectangular shape in a plan view that is depressed towards the other major surface 104b. The other major surface 104b of the supporting substrate 104 is a flat surface.

At the one major surface 104a of the substrate 104, a low area 113, which is a bottom surface of the recess 110, and a high area 115 of annular shape in a plan view, which is a periphery of the recess 110, are formed by the recess 110. The low area 113 has, in a plan view, a rectangular shape having four sides parallel to the four sides of the supporting substrate 104. Between the high area 115 and the four sides of the low area 113 is formed a connecting portion 116 arranged to connect these portions. The connecting portion 116 is substantially perpendicular to the low area 113. The high area 115 includes a first region 115A and a second region 115B having rectangular shapes that are long in the Y direction in a plan view and are disposed apart in the X direction across the recess 110.

A plurality of first pads 121 are formed in the low area 113. The plurality of first pads 121 are rectangular in a plan view and, for example, four thereof are formed in the low area 113. The first pads 121 are provided to fix the air pressure sensor element 102 to the low area 113 mechanically and electrically.

A plurality of second pads 123 are formed in the first region 115A and the second region 115B of the high area 115. Five each of the plurality of second pads 123 are formed in each of the first region 115A and the second region 115B. A bump 125 is formed on each second pad 123. An external terminal 126 is formed by each second pad 123 and the bump 125 formed thereon. The external terminals 126 are used for surface-mounting the air pressure detecting device 101 onto an unillustrated circuit board. The first pads 121 and the second pads 123 are connected via wirings 127 formed inside the supporting substrate 104.

The air pressure sensor element 102 has a substantially rectangular parallelepiped shape with a planar shape being a rectangular shape that is closer to being a square in comparison to the air pressure sensor element 2 of the first air pressure detecting device 1. The structure of the air pressure sensor element 102 is the same as that of the air pressure sensor element 2 of the first air pressure detecting device 1. That is, the air pressure sensor element 102 includes the base 31, the substrate 32, formed on the −Z direction-side surface of the base 31, and the diaphragm 33, supported by the substrate 32. The base 31 is constituted, for example, of glass. The cavity 34 that is rectangular in a plan view and penetrates through in the thickness direction is formed in the substrate 32. The substrate 32 is rectangular annular in a plan view and is constituted, for example, of an Si substrate. The insulating layer 35 is formed on the −Z direction-side surface of the substrate 32.

The +Z direction-side surface of the substrate 32 is bonded to the base 31. The base 31 defines the bottom surface portion of the cavity 34. The diaphragm 33 is supported by the surface of the substrate 32 via the insulating layer 35. The diaphragm 33 defines the top surface portion of the cavity 34. The diaphragm 33 is constituted of the movable portion 33A of rectangular shape in a plan view that defines the top surface portion of the cavity 34 and the fixed portion 33B of rectangular annular shape in a plan view at the periphery of the movable portion 33A. The fixed portion 33B of the diaphragm 33 is bonded to the insulating layer 35 on the silicon substrate 32. The strain gauge resistor (unillustrated) is formed in the movable portion 33A of the diaphragm 33. The plurality of pad electrodes (unillustrated), connected to the strain gauge resistor, are provided at the fixed portion 33B of the diaphragm 33.

The movable portion 33A of the diaphragm 33 undergoes strain in accordance with the difference between the pressure (reference pressure) inside the cavity and the ambient air pressure. The strain amount is detected as the amount of change in electrical resistance value of the strain gauge resistor to detect the ambient air pressure. Therefore, the surface of the movable portion 33A, within the surface (−Z direction-side surface) of the diaphragm 33 at the side opposite the cavity 34, is the ambient air contacting region Sa that must be exposed to the ambient air. The surface of the air pressure sensor element 102 at the diaphragm side is the ambient air contacting surface S that includes the ambient air contacting region Sa to be exposed to the ambient air.

The air pressure sensor element 102 is bonded to the low area 113 in the face-down state where its ambient air contacting surface S is made to face the low area (recess 110 bottom surface) 113. Specifically, each of the plurality of pad electrodes provided at the ambient air contacting surface S of the air pressure sensor element 102 is mechanically and electrically bonded via a solder layer 141 to a first pad 121 formed in the low area 113. The respective pad electrodes of the air pressure sensor element 102 are thereby connected to the second pads 123 (external terminals 126) via the first pads 121 and the wirings 127 formed inside the supporting substrate 104. A gap, corresponding to a sum thickness of a thickness of the first pad 121 and a thickness of the solder layer 141, is formed between the ambient air contacting surface S (ambient air contacting region Sa) of the air pressure sensor element 102 and the low area 113. That is, a gap, corresponding to at least the thickness of the first pad 121, is present between the ambient air contacting region Sa of the air pressure sensor element 102 and the low area 113.

Figure 32:
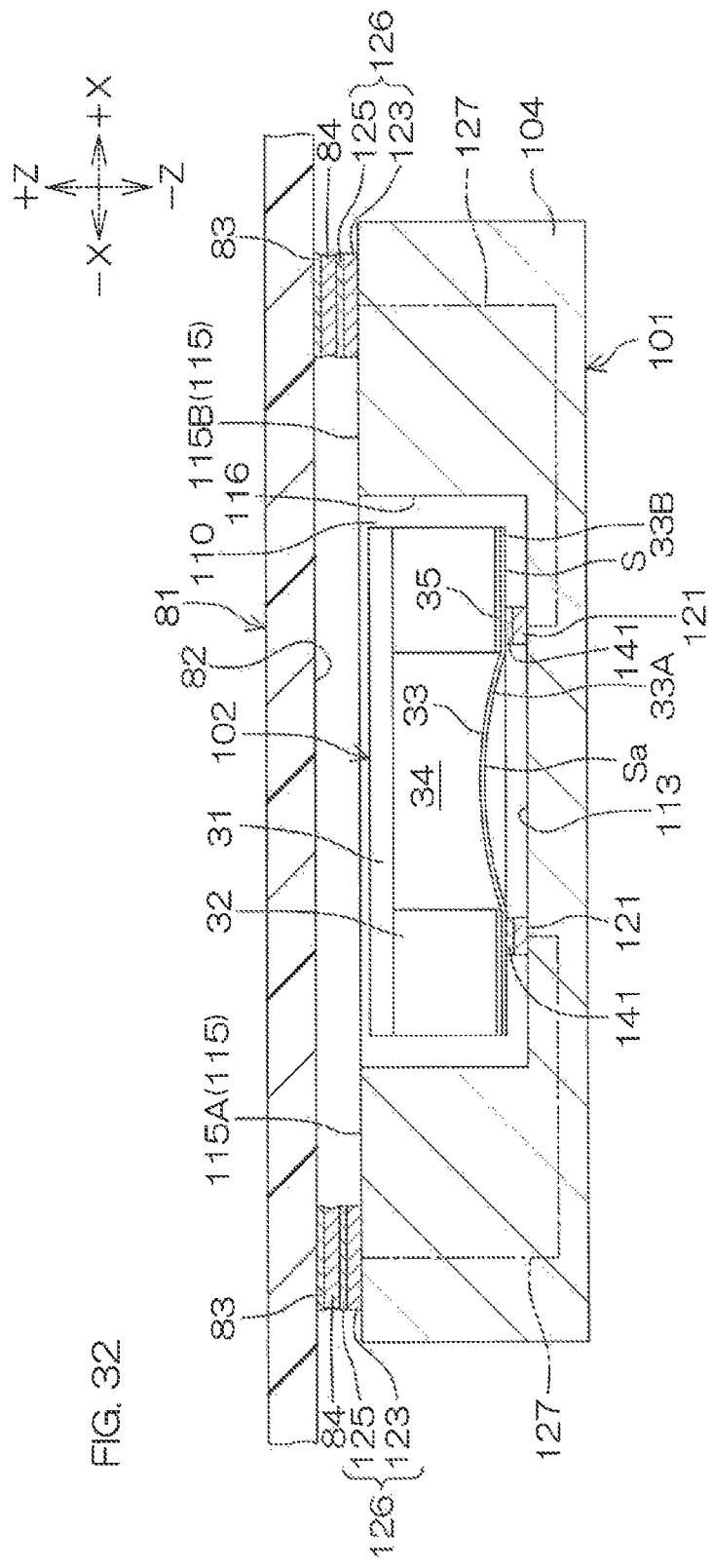
FIG. 32 is an illustrative sectional view of a mounting state of the air pressure detecting device shown in FIG. 30.

FIG. 32 is an illustrative sectional view of a mounting state of the second air pressure detecting device shown in FIG. 30 and shows a section plane corresponding to FIG. 31.

The plurality of lands 83 are formed on the surface 82 of the wiring substrate (mounting substrate) 81. The air pressure detecting device 101 is surface-mounted onto the surface 82 of the wiring substrate (mounting substrate) 81 with the bumps 125 facing the surface 82. The cream solder 84 is coated on the plurality of lands 83. In surface-mounting the air pressure detecting device 101 onto the wiring substrate 81, the second pads 123 of the air pressure detecting device 101 are bonded to the lands 83 via the cream solder 84 and the bumps 125.

In a state where the air pressure detecting device 101 has been mounted on the wiring substrate 81, a gap, corresponding to a sum thickness of a thickness of the second pad 123 and a thickness of the bump 125, cream solder 84, and land 83, is present between a surface (+Z-side surface) of the high area 115 of the supporting substrate 104 of the air pressure detecting device 101 and the wiring substrate 81. As mentioned above, the gap corresponding to at least the thickness of the first pad 121 is present between the ambient air contacting surface S of the air pressure sensor element 102 and the low area 113 of the supporting substrate 104. The ambient air can thus flow into the gap between the ambient air contacting surface S of the air pressure sensor element 102 and the low area 113 of the supporting substrate 104 through the gap, between the wiring substrate 81 and the air pressure detecting device 101, and the recess 110. The external surface (ambient air contacting region Sa) of the movable portion 33A of the diaphragm 33 of the air pressure detecting device 101 is thus put in the state of being exposed to the ambient air to enable air pressure detection using the air pressure sensor element 102.

With the second air pressure detecting device 101, the air pressure sensor element 102 is bonded to the low area 113 of the supporting substrate 104 in the face-down state with its ambient air contacting surface S being made to face the low area 113. The ambient air contacting surface S (ambient air contacting region Sa) of the air pressure sensor element 102 is thereby protected by the supporting substrate 104 arranged to support the air pressure sensor element 102, and therefore there is no need to separately provide a cover arranged to protect the ambient air contacting surface S (ambient air contacting region Sa) of the air pressure sensor element 102. Even in such a case where the air pressure sensor element 102 is bonded in the face-down state to the supporting substrate 104, the gap, corresponding to at least the thickness of the first pad 121 is formed between the ambient air contacting region Sa of the air pressure sensor element 102 and the low area 113 of the supporting substrate 104, and the ambient air contacting region Sa of the air pressure sensor element 102 can thus be exposed to the ambient air through the recess 110. Hindrance to air pressure detection thus does not arise.

Figure 33:
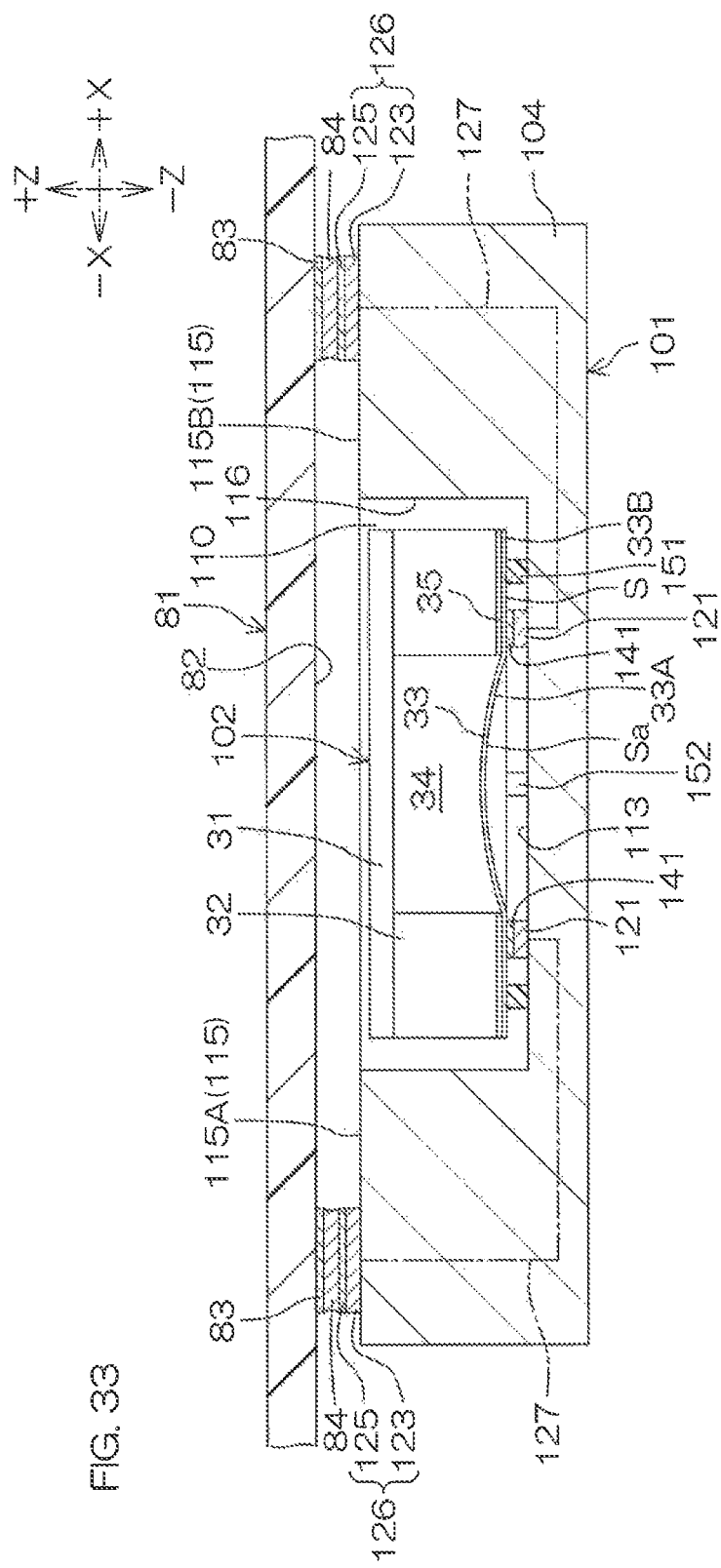
FIG. 33 is an illustrative sectional view of a modification example of the second air pressure detecting device.

FIG. 33 is an illustrative sectional view of a modification example of the second air pressure detecting device and shows a section plane corresponding to FIG. 31. In FIG. 33, portions corresponding to the respective portions of FIG. 31 described above are indicated by attaching the same symbols as in FIG. 31.

Figure 34:
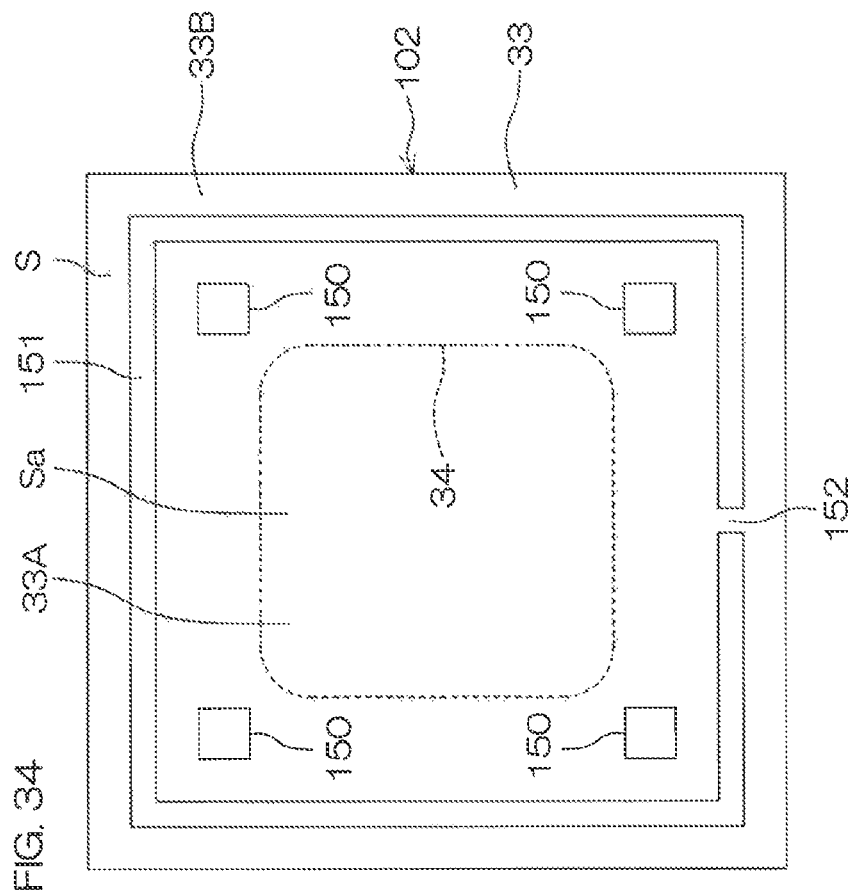
FIG. 34 is a view as viewed from the −Z direction side of an ambient air contacting surface of an air pressure sensor element used in the air pressure detecting device of FIG. 33.

The air pressure detecting device 101 of FIG. 33 differs in only the air pressure sensor element 102 from the second air pressure detecting device 101 shown in FIG. 30 and FIG. 31. FIG. 34 is a view as viewed from the −Z direction side of the ambient air contacting surface S of the air pressure sensor element 102 used in the air pressure detecting device 101 of FIG. 33. In FIG. 34, the solder layer 141 is omitted and therefore the electrode pads are apparent on the ambient air contacting surface S.

Four electrode pads 150 are formed on the ambient air contacting surface S of the air pressure sensor element 102. In the −Z direction view, the four electrode pads 150 are disposed at four corners of the ambient air contacting surface S of the air pressure sensor element 102. On the −Z direction-side surface of the fixed portion 33B of the diaphragm 33, a waterproof/dustproof wall 151, which is disconnected at least at one location, is formed so as to substantially surround the movable portion 33A (ambient air contacting region Sa) of the diaphragm 33. With the present example, in the −Z direction view, the waterproof/dustproof wall 151 is of rectangular annular shape with ends and has a disconnected portion (cutout portion) 152 formed at only one location. Also with the present example, the waterproof/dustproof wall 151 is formed so as to run along an outer side of the four electrode pads 150 in the −Z direction view.

Figure 35:
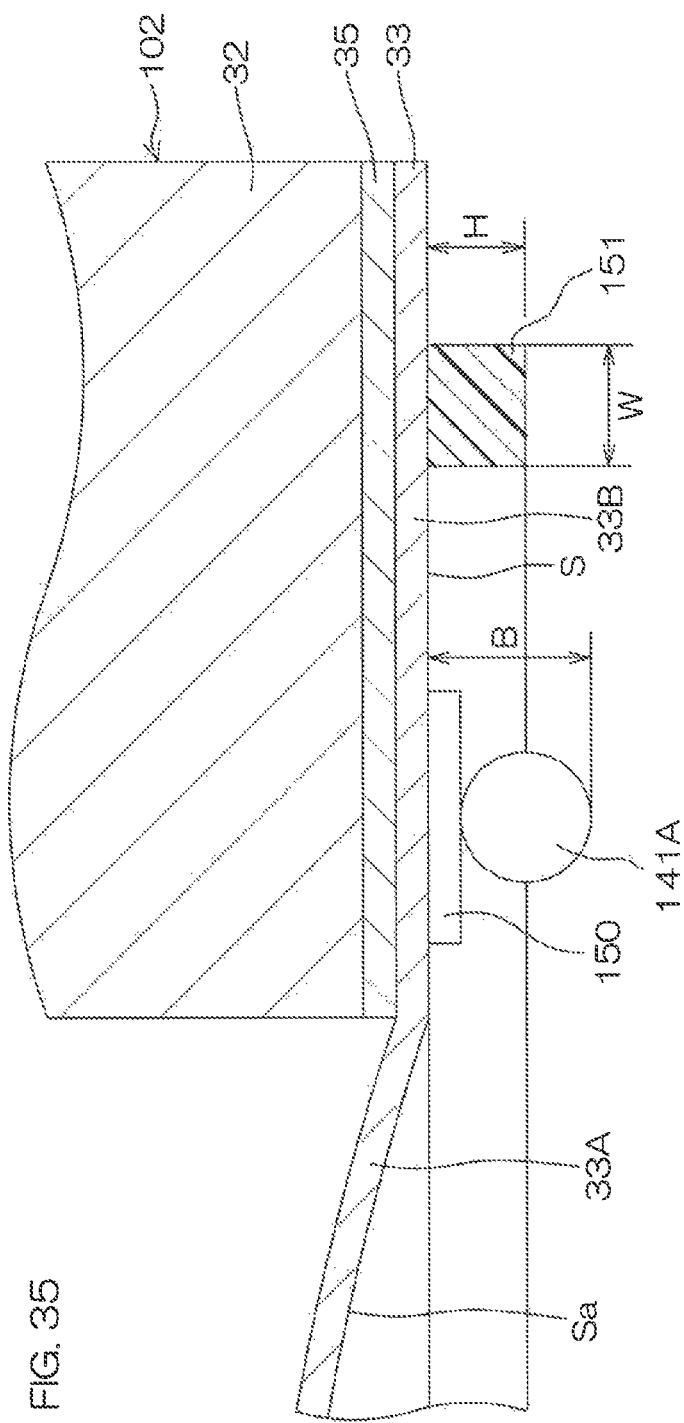
FIG. 35 is a partially enlarged sectional view of the air pressure sensor element used in the air pressure detecting device of FIG. 33.

The waterproof/dustproof wall 151 projects in the −Z direction from the outer surface of the diaphragm 33. A projection length (Z direction length) of the waterproof/dustproof wall 151 is preferably set to a length such that when the air pressure sensor element 102 is bonded to the low area 113 of the supporting substrate 104, a projecting end of the waterproof/dustproof wall 151 is press-contacted or contacted with the surface of the low area 113. Specifically, as shown in FIG. 35, a length H from the outer surface of the diaphragm 33 to the projecting end of the waterproof/dustproof wall 151 is set to be smaller than a length B from the outer surface of the diaphragm 33 to a projecting end of a solder ball 141A when the solder ball 141A, which is to become the solder layer 141, is formed on the electrode pad 150 of the air pressure sensor element 102 in the state before the air pressure sensor element 102 is bonded to the low area 113 of the supporting substrate 104. An aspect ratio R (H/W), defined as a ratio of the height H of the waterproof/dustproof wall 151 with respect to a width of the waterproof/dustproof wall 151, is preferably set so as to be not more than 1 (R≤1). The waterproof/dustproof wall 151 is constituted of polyimide or other resin, $SiO_2$ or other ceramic, or Cu or other metal, etc.

As in the second air pressure detecting device 101 of FIG. 30, there is no need to separately provide a cover arranged to protect the ambient air contacting surface S of the air pressure sensor element 102 in the air pressure detecting device 101 of FIG. 33 as well. Also with the air pressure detecting device 101 of FIG. 33, the waterproof/dustproof wall 151 of rectangular annular shape with ends in a plan view is formed on the −Z direction-side surface of the fixed portion 33B of the diaphragm 33 so as to substantially surround the movable portion 33A (ambient air contacting region Sa) and therefore entry of moisture and dust into the gap between the movable portion 33A (ambient air contacting region Sa) of the diaphragm 33 and the low area 113 of the supporting substrate 104 can be suppressed.

Figure 36:
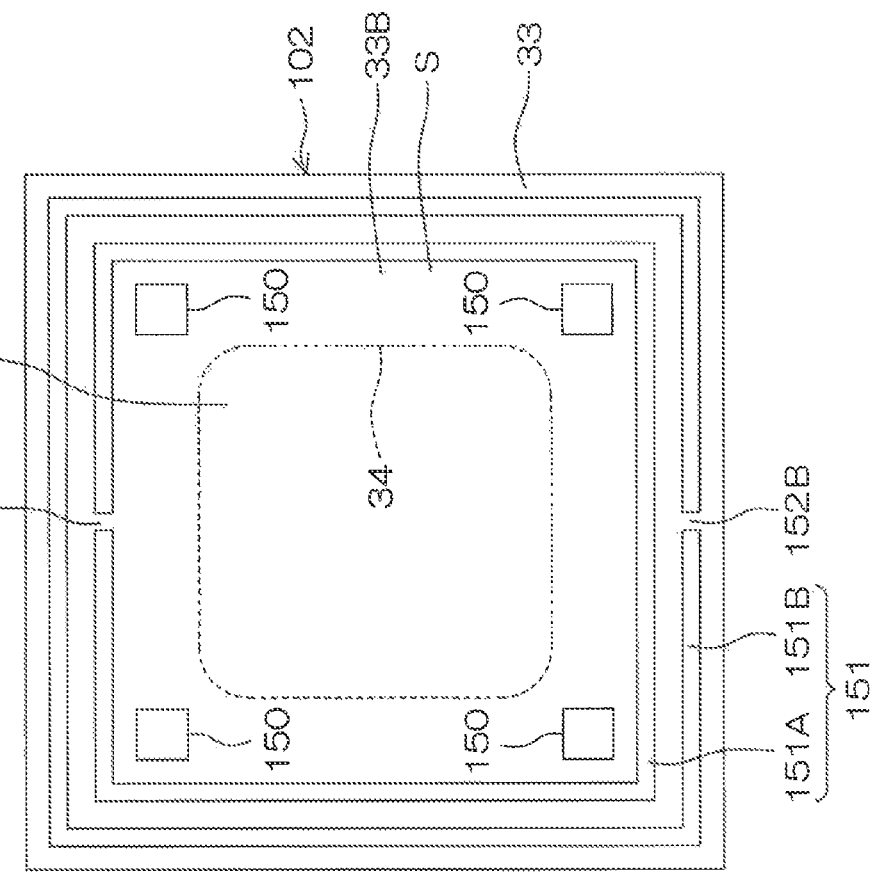
FIG. 36 shows a modification example of a waterproof/dustproof wall and is a view as viewed from the −Z direction side of the ambient air contacting surface of the air pressure sensor element.

As shown in FIG. 36, the waterproof/dustproof wall 151 may be constituted, in the −Z direction view, from a first waterproof/dustproof wall 151A, formed at the fixed portion 33B so as to substantially surround the movable portion 33A of the diaphragm 33, and a second waterproof/dustproof wall 151B, formed at the fixed portion 33B so as to substantially surround the first waterproof/dustproof wall 151A. In the present example, the first and second waterproof/dustproof walls 151A and 151B are of rectangular annular shapes with ends, each having a disconnected portion 152A or 152B at only one location in the −Z direction view.

With the present preferred embodiment, the disconnected portion 152A of the first waterproof/dustproof wall 151A is formed at a length center portion of a portion oriented along one side of the diaphragm 33 and the disconnected portion 152B of the second waterproof/dustproof wall 151B is formed at a length center portion of a portion oriented along another side of the diaphragm 33 that faces the one side. The disconnected portion 152A of the first waterproof/dustproof wall 151A and the disconnected portion 152B of the second waterproof/dustproof wall 151B are thus preferably formed at positions that are shifted with respect to each other in regard to directions oriented along the first or second waterproof/dustproof wall 151A or 151B in the −Z direction view. In other words, it is preferable for the disconnected portion 152A of the first waterproof/dustproof wall 151A to be formed at a position facing a non-disconnected portion (portion other than the disconnected portion 152B) of the second waterproof/dustproof wall 151B when the second waterproof/dustproof wall 151B is viewed from the first waterproof/dustproof wall 151A side. Also, it is preferable for the disconnected portion 152B of the second waterproof/dustproof wall 151B to be formed at a position facing a non-disconnected portion (portion other than the disconnected portion 152A) of the first waterproof/dustproof wall 151A when the first waterproof/dustproof wall 151A is viewed from the second waterproof/dustproof wall 151B side.

Figure 37:
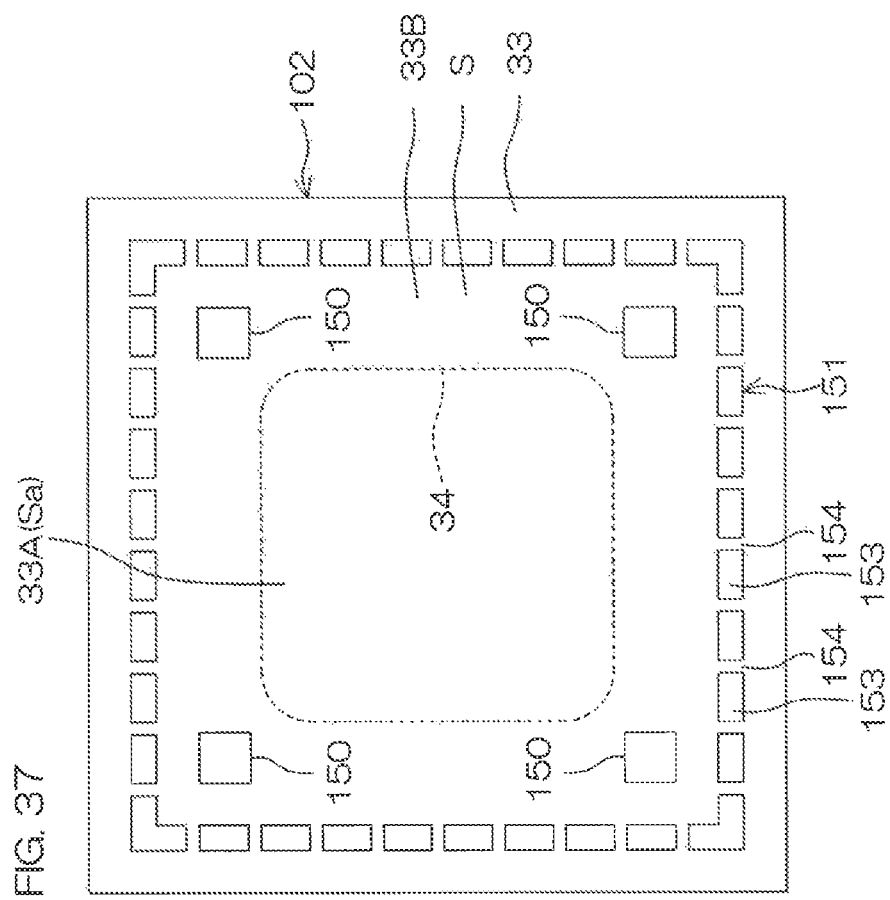
FIG. 37 shows another modification example of the waterproof/dustproof wall and is a view as viewed from the −Z direction side of the ambient air contacting surface of the air pressure sensor element.

The waterproof/dustproof wall 151 may also be of an arrangement where, in the −Z direction view, rectangular portions 153, having longitudinal directions oriented along the annular virtual line surrounding the movable portion 33A, and disconnected portions 154 are formed alternately at the fixed portion 33B of the diaphragm 33 as shown in FIG. 37.

Figure 38:
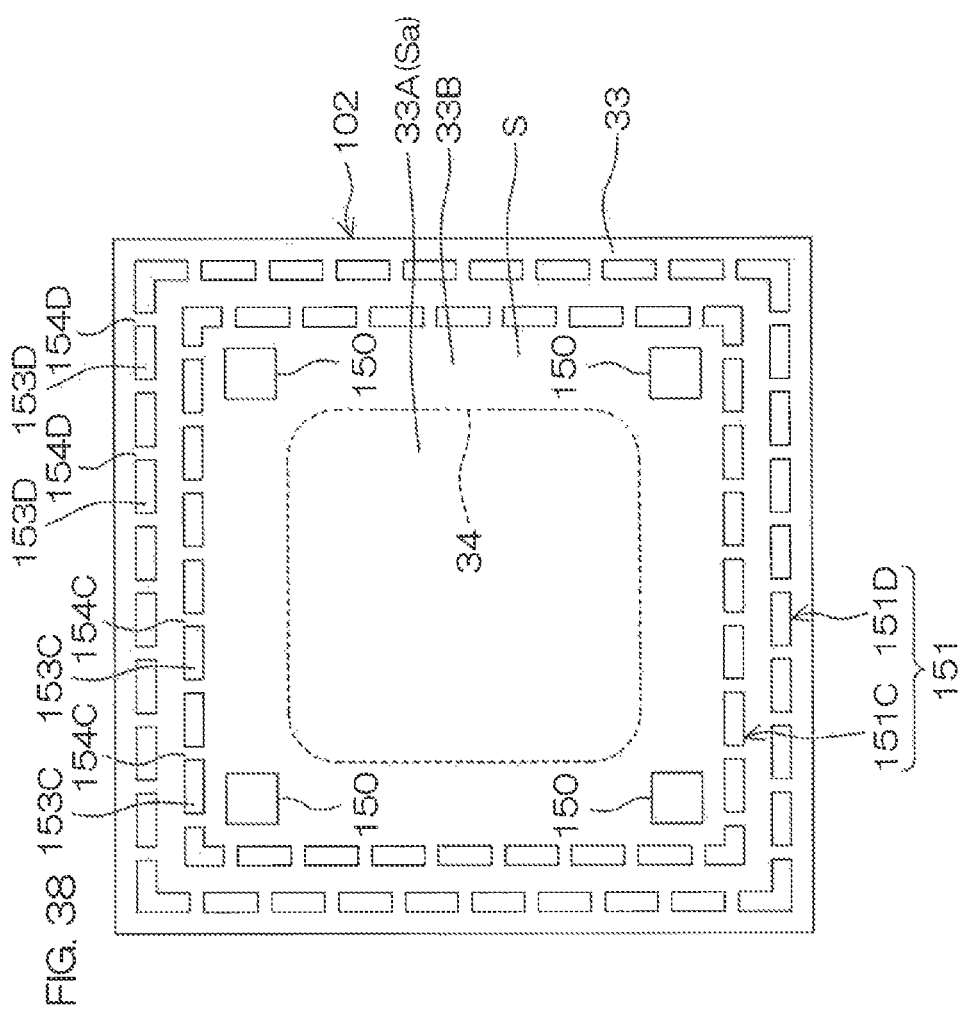
FIG. 38 shows yet another modification example of the waterproof/dustproof wall and is a view as viewed from the −Z direction side of the ambient air contacting surface of the air pressure sensor element.

Also as shown in FIG. 38, the waterproof/dustproof wall 151 may be constituted, in the −Z direction view, from a first waterproof/dustproof wall 151C, formed at the fixed portion 33B so as to substantially surround the movable portion 33A (ambient air contacting region Sa) of the diaphragm 33, and a second waterproof/dustproof wall 151D, formed at the fixed portion 33B so as to substantially surround the first waterproof/dustproof wall 151C. The first waterproof/dustproof wall 151C is of an arrangement where, in the −Z direction view, rectangular portions 153C, having longitudinal directions oriented along the first annular virtual line surrounding the movable portion 33A, and disconnected portions 154C are formed alternately. The second waterproof/dustproof wall 151D is of an arrangement where, in the −Z direction view, rectangular portions 153D, having longitudinal directions oriented along the second annular virtual line surrounding the first waterproof/dustproof wall 151C, and disconnected portions 154D are formed alternately.

The respective disconnected portions 154C of the first waterproof/dustproof wall 151C and the respective disconnected portions 154D of the second waterproof/dustproof wall 151D are preferably formed at positions that are shifted with respect to each other in regard to directions oriented along the first or second annular virtual line as shown in FIG. 38. In other words, it is preferable for the respective disconnected portions 154C of the first waterproof/dustproof wall 151C to be formed at positions facing any of the rectangular portions 153D of the second waterproof/dustproof wall 151D when the second waterproof/dustproof wall 151D is viewed from the first waterproof/dustproof wall 151C side. Also, it is preferable for the respective disconnected portions 154D of the second waterproof/dustproof wall 151D to be formed at positions facing any of the rectangular portions 153C of the first waterproof/dustproof wall 151C when the first waterproof/dustproof wall 151C is viewed from the second waterproof/dustproof wall 151D side.

In place of or in addition to forming the waterproof/dustproof wall 151 on the ambient air contacting surface of the air pressure sensor element 102, a waterproof/dustproof wall 155 may be formed in the high area 115 of the supporting substrate 104.

Figure 39:
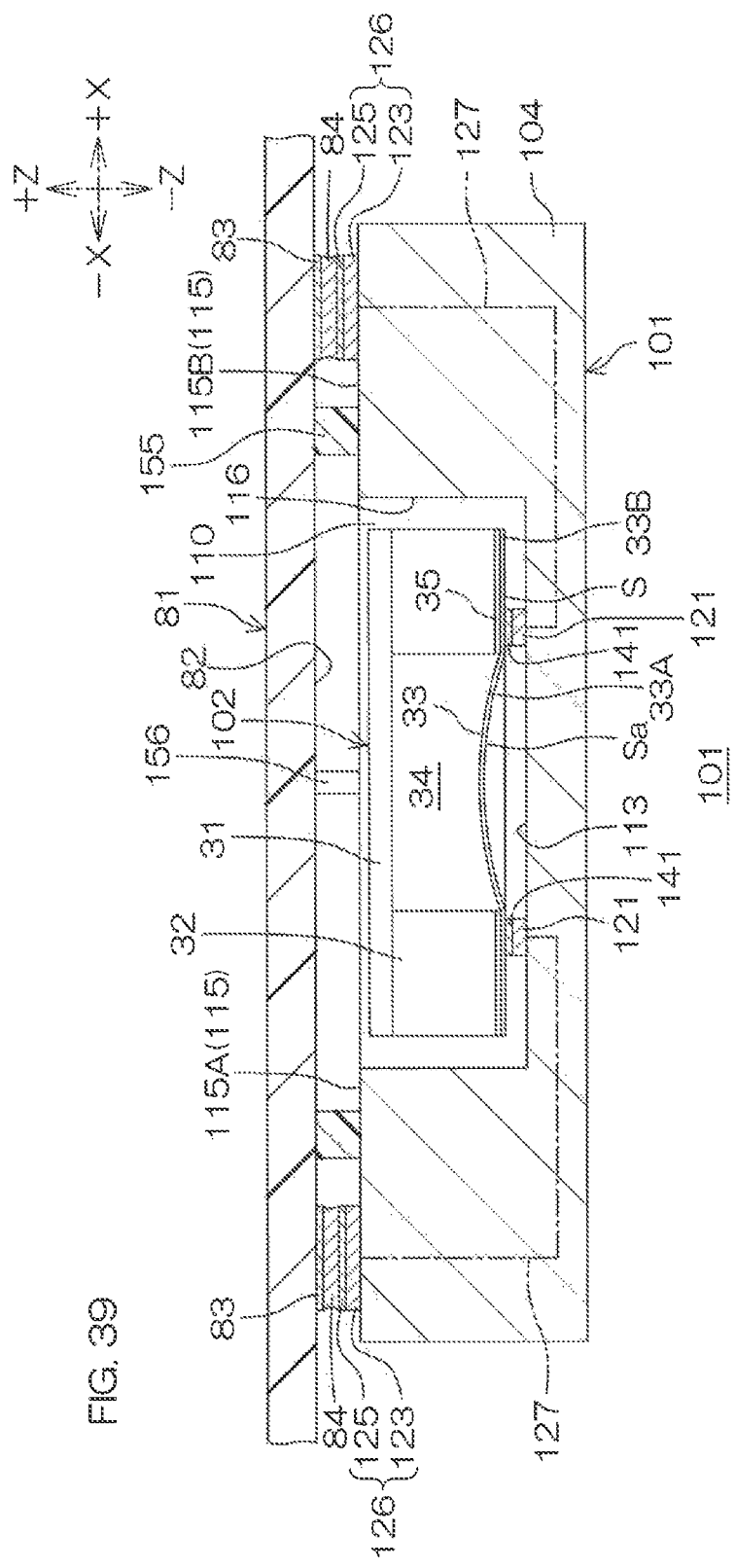
FIG. 39 is an illustrative sectional view of an example where the waterproof/dustproof wall is formed in a high area of a supporting substrate and shows a section plane corresponding to FIG. 32.
Figure 40:
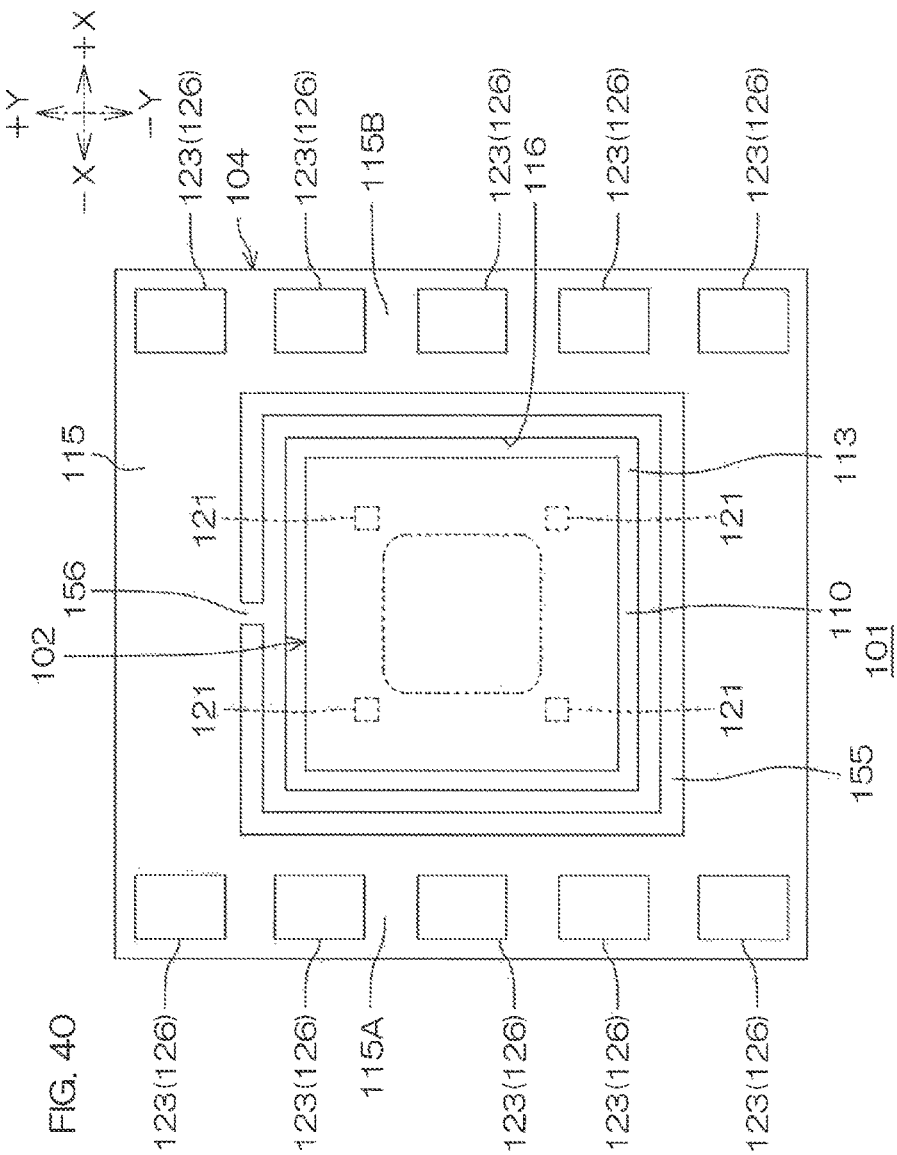
FIG. 40 is an illustrative plan view of the waterproof/dustproof wall formed in the high area of the supporting substrate.

FIG. 39 is an illustrative sectional view of an example where the waterproof/dustproof wall is formed in the high area of the supporting substrate and shows a section plane corresponding to FIG. 32. FIG. 40 is an illustrative plan view of the waterproof/dustproof wall formed in the high area of the supporting substrate. Although in the example of FIG. 39, a waterproof/dustproof wall is not formed on the ambient air contacting surface S of the air pressure sensor element 102, the waterproof/dustproof wall 151 described above may be formed on the ambient air contacting surface S of the air pressure sensor element 102.

In the high area 115 of the supporting substrate 104, the waterproof/dustproof wall 155, which is disconnected at least at one location, is formed so as to substantially surround the recess 110. With the present example, in the Z direction view, the waterproof/dustproof wall 155 is of rectangular annular shape with ends and has a disconnected portion 156 formed at only one location. Also with the present example, the waterproof/dustproof wall 155 is formed so as to run along an inner side of the four second pads 123 in the Z direction view.

The waterproof/dustproof wall 155 projects in the +Z direction from the high area 115. A projection length (Z direction length) of the waterproof/dustproof wall 155 is preferably set to a length such that when the second air pressure detecting device 101 is mounted on the wiring substrate 81, a projecting end of the waterproof/dustproof wall 155 is press-contacted or contacted with the surface 82 of the wiring substrate 81. The waterproof/dustproof wall 155 is constituted of polyimide or other resin, $SiO_2$ or other ceramic, or Cu or other metal, etc. By thus forming the waterproof/dustproof wall 155 in the high area 115 of the supporting substrate 104, entry of moisture and dust into the recess 110 can be suppressed and therefore the entry of moisture and dust into the gap between the movable portion 33A (ambient air contacting region Sa) of the diaphragm 33 and the low area 113 of the supporting substrate 104 can be suppressed.

Figure 41:
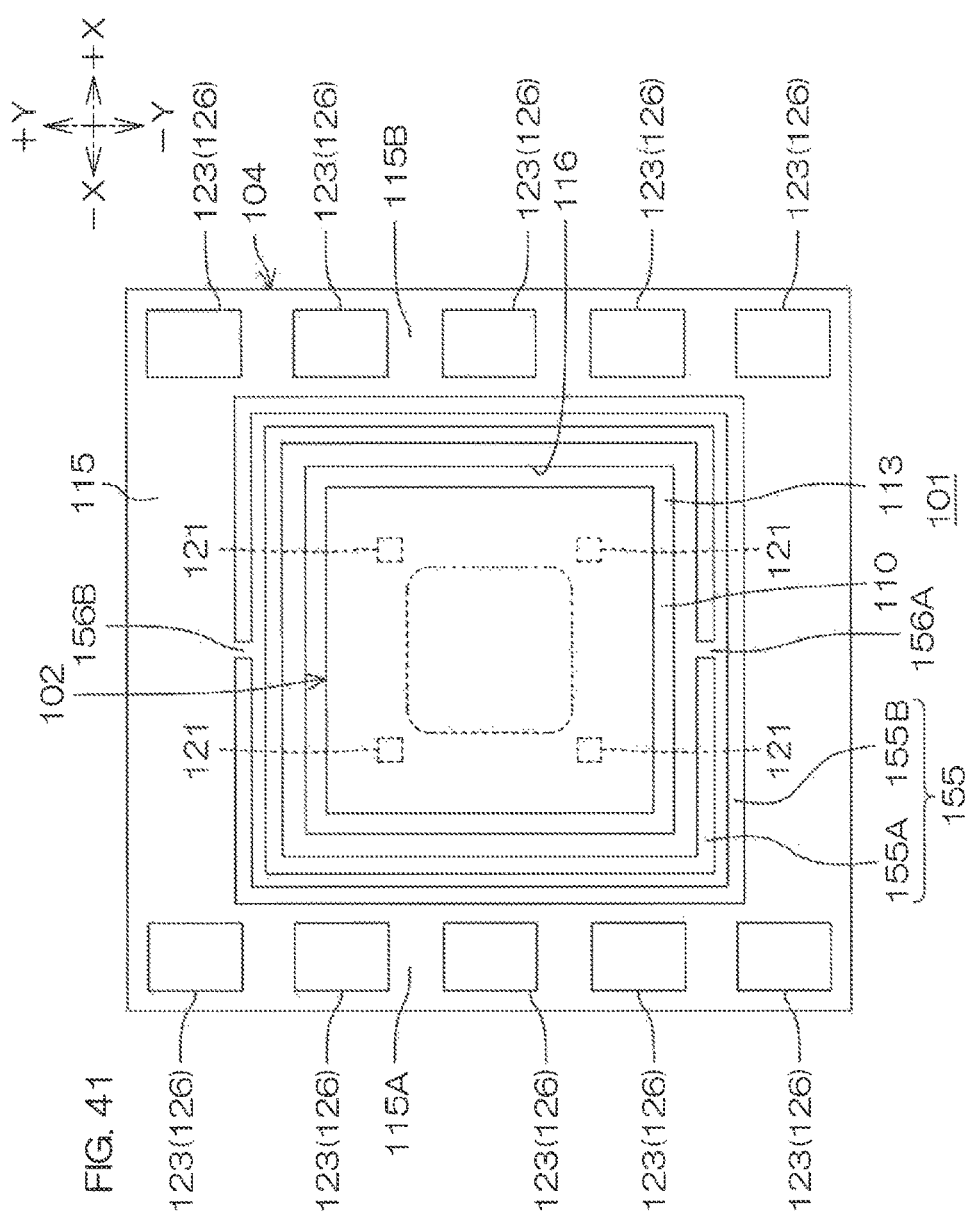
FIG. 41 shows a modification example of the waterproof/dustproof wall formed in the high area of the supporting substrate and is a view as viewed from the +Z direction side of the high area of the supporting substrate.

As shown in FIG. 41, the waterproof/dustproof wall 155 may be constituted, in the Z direction view, from a first waterproof/dustproof wall 155A, formed in the high area 115 so as to substantially surround the recess 110, and a second waterproof/dustproof wall 155B, formed in the high area 115 so as to substantially surround the first waterproof/dustproof wall 155A. In the present example, the first and second waterproof/dustproof walls 155A and 155B are of rectangular annular shapes with ends, each having a disconnected portion 156A or 156B at only one location in the Z direction view.

With the present preferred embodiment, the disconnected portion 156A of the first waterproof/dustproof wall 155A is formed at a length center portion of a portion oriented along one side of the major surface 104a of the supporting substrate 104 and the disconnected portion 156B of the second waterproof/dustproof wall 155B is formed at a length center portion of a portion oriented along another side of the major surface 104a of the supporting substrate 104 that faces the one side. The disconnected portion 156A of the first waterproof/dustproof wall 155A and the disconnected portion 156B of the second waterproof/dustproof wall 155B are thus preferably formed at positions that are shifted with respect to each other in regard to directions oriented along the first or second waterproof/dustproof wall 155A or 155B in the Z direction view. In other words, it is preferable for the disconnected portion 156A of the first waterproof/dustproof wall 155A to be formed at a position facing a non-disconnected portion (portion other than the disconnected portion 156B) of the second waterproof/dustproof wall 155B when the second waterproof/dustproof wall 155B is viewed from the first waterproof/dustproof wall 155A side. Also, it is preferable for the disconnected portion 156B of the second waterproof/dustproof wall 155B to be formed at a position facing a non-disconnected portion (portion other than the disconnected portion 156A) of the first waterproof/dustproof wall 155A when the first waterproof/dustproof wall 155A is viewed from the second waterproof/dustproof wall 155B side.

Figure 42:
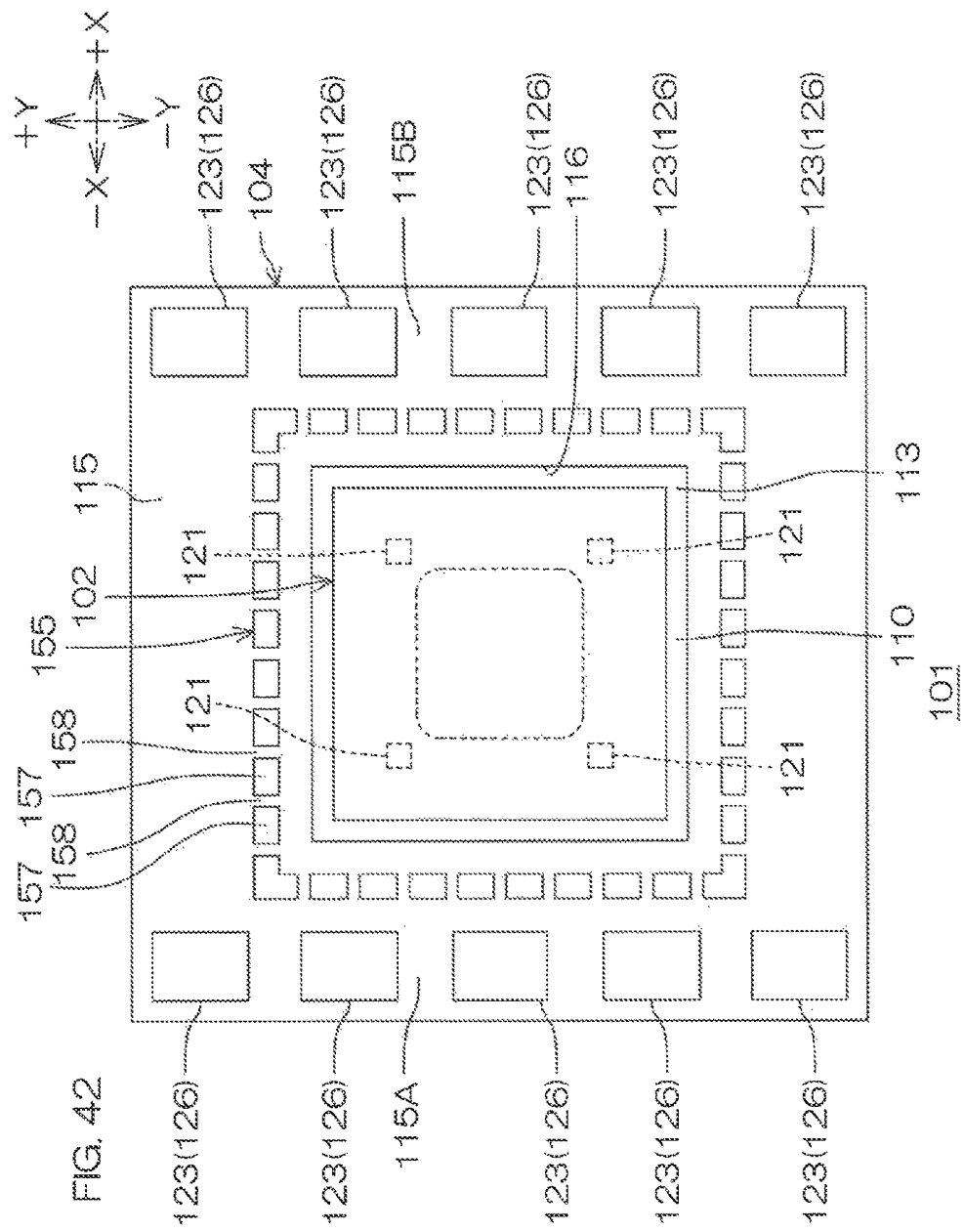
FIG. 42 shows another modification example of the waterproof/dustproof wall formed in the high area of the supporting substrate and is a view as viewed from the +Z direction side of the high area of the supporting substrate.

The waterproof/dustproof wall 155 may also be of an arrangement where, in the Z direction view, rectangular portions 157, having longitudinal directions oriented along an annular virtual line surrounding the movable portion 33A, and disconnected portions 158 are formed alternately at the high area 115 as shown in FIG. 42.

Figure 43:
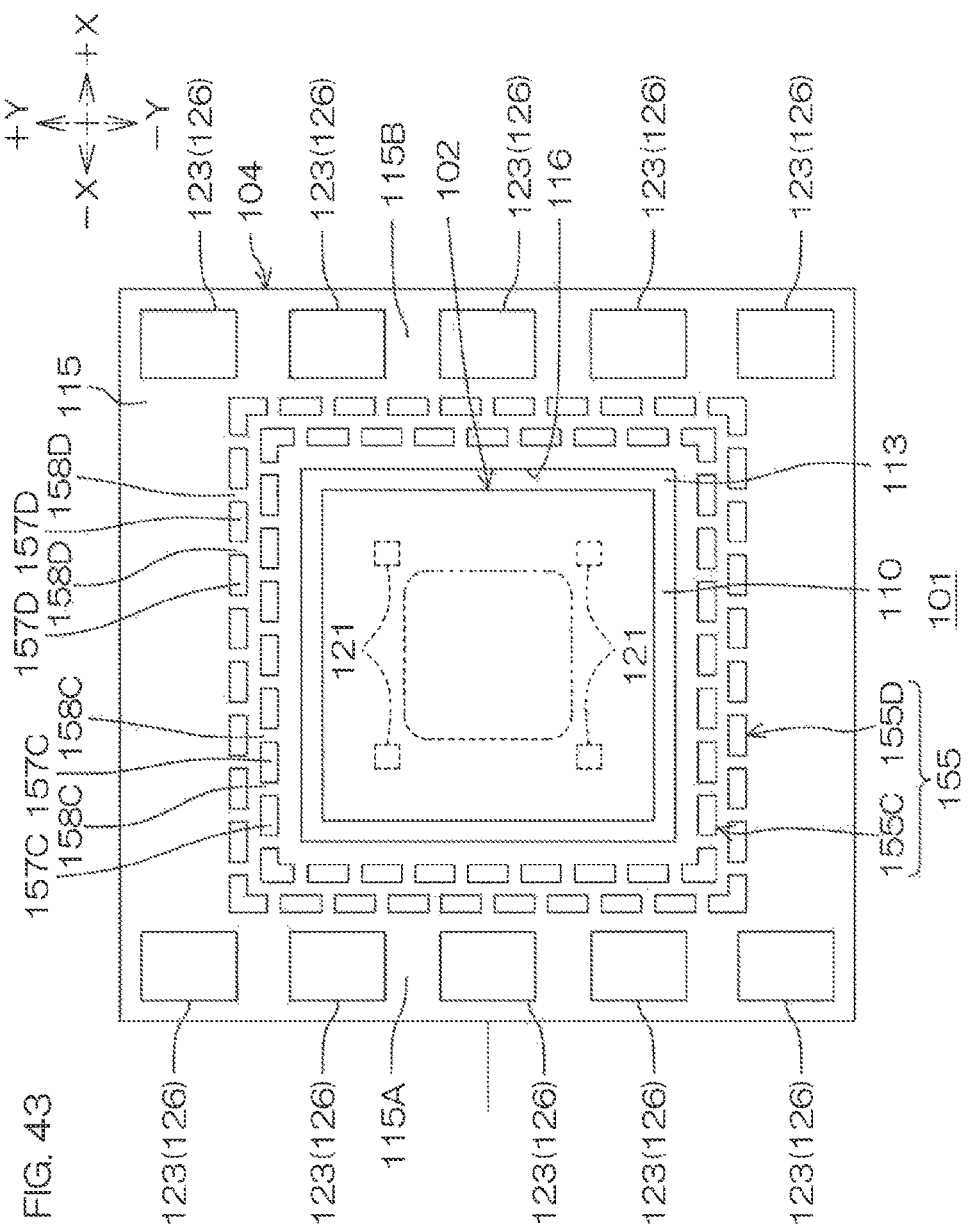
FIG. 43 shows yet another modification example of the waterproof/dustproof wall formed in the high area of the supporting substrate and is a view as viewed from the +Z direction side of the high area of the supporting substrate.

Also as shown in FIG. 43, the waterproof/dustproof wall 155 may be constituted, in the Z direction view, from a first waterproof/dustproof wall 155C, formed in the high area 115 so as to substantially surround the recess 110, and a second waterproof/dustproof wall 155D, formed in the high area 115 so as to substantially surround the first waterproof/dustproof wall 155C. The first waterproof/dustproof wall 155C is of an arrangement where, in the Z direction view, rectangular portions 157C, having longitudinal directions oriented along a first annular virtual line surrounding the recess 10, and disconnected portions 158C are formed alternately. The second waterproof/dustproof wall 155D is of an arrangement where, in the Z direction view, rectangular portions 157D, having longitudinal directions oriented along a second annular virtual line surrounding the first waterproof/dustproof wall 155C, and disconnected portions 158D are formed alternately.

The respective disconnected portions 158C of the first waterproof/dustproof wall 155C and the respective disconnected portions 158D of the second waterproof/dustproof wall 155D are preferably formed at positions that are shifted with respect to each other in regard to directions oriented along the first or second annular virtual line as shown in FIG. 43. In other words, it is preferable for the respective disconnected portions 158C of the first waterproof/dustproof wall 155C to be formed at positions facing any of the rectangular portions 157D of the second waterproof/dustproof wall 155D when the second waterproof/dustproof wall 155D is viewed from the first waterproof/dustproof wall 155C side. Also, it is preferable for the respective disconnected portions 158D of the second waterproof/dustproof wall 155D to be formed at positions facing any of the rectangular portions 157C of the first waterproof/dustproof wall 155C when the first waterproof/dustproof wall 155C is viewed from the second waterproof/dustproof wall 155D side.

Figure 44:
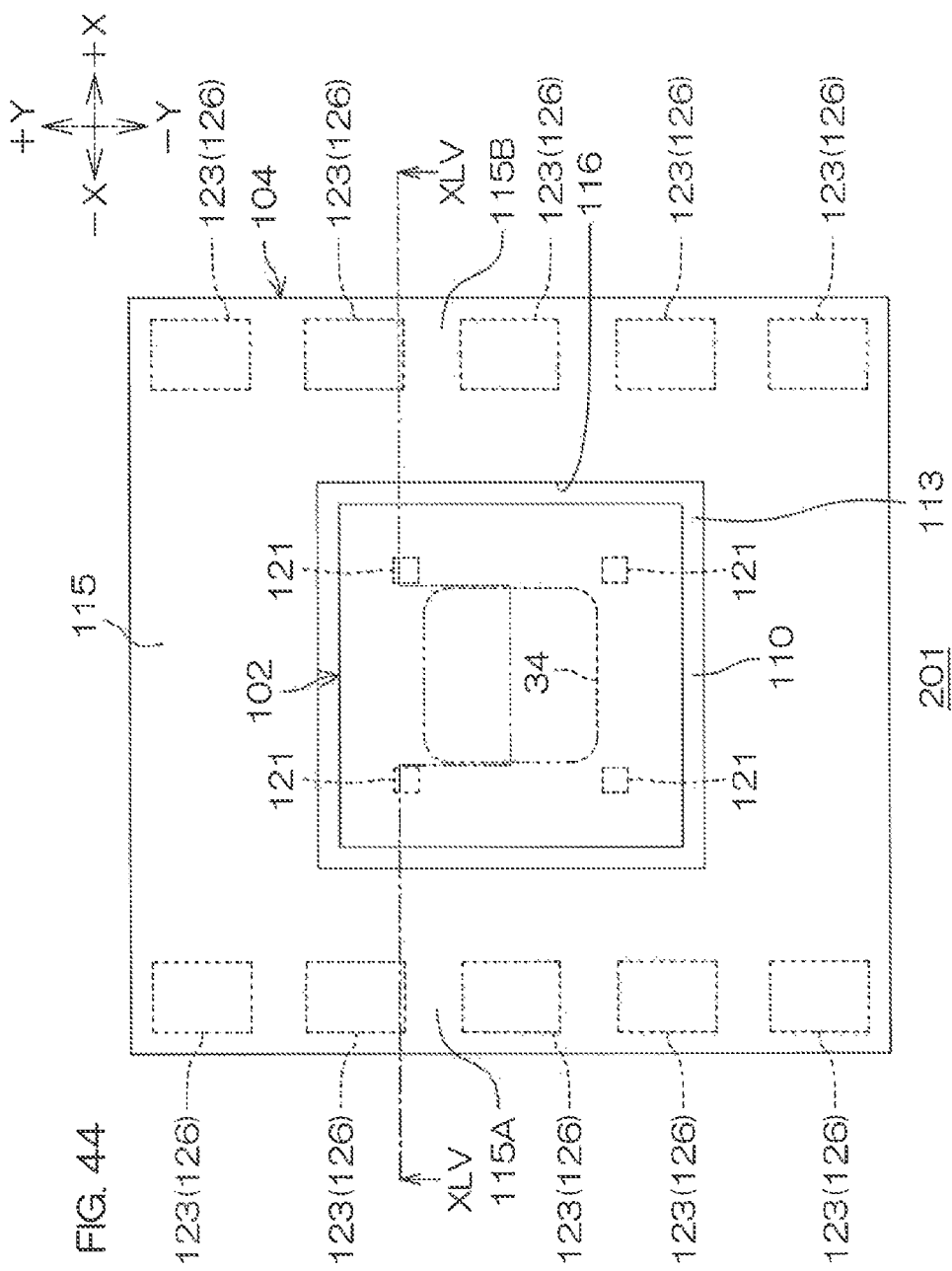
FIG. 44 is an illustrative plan view of a third air pressure detecting device.
Figure 45:
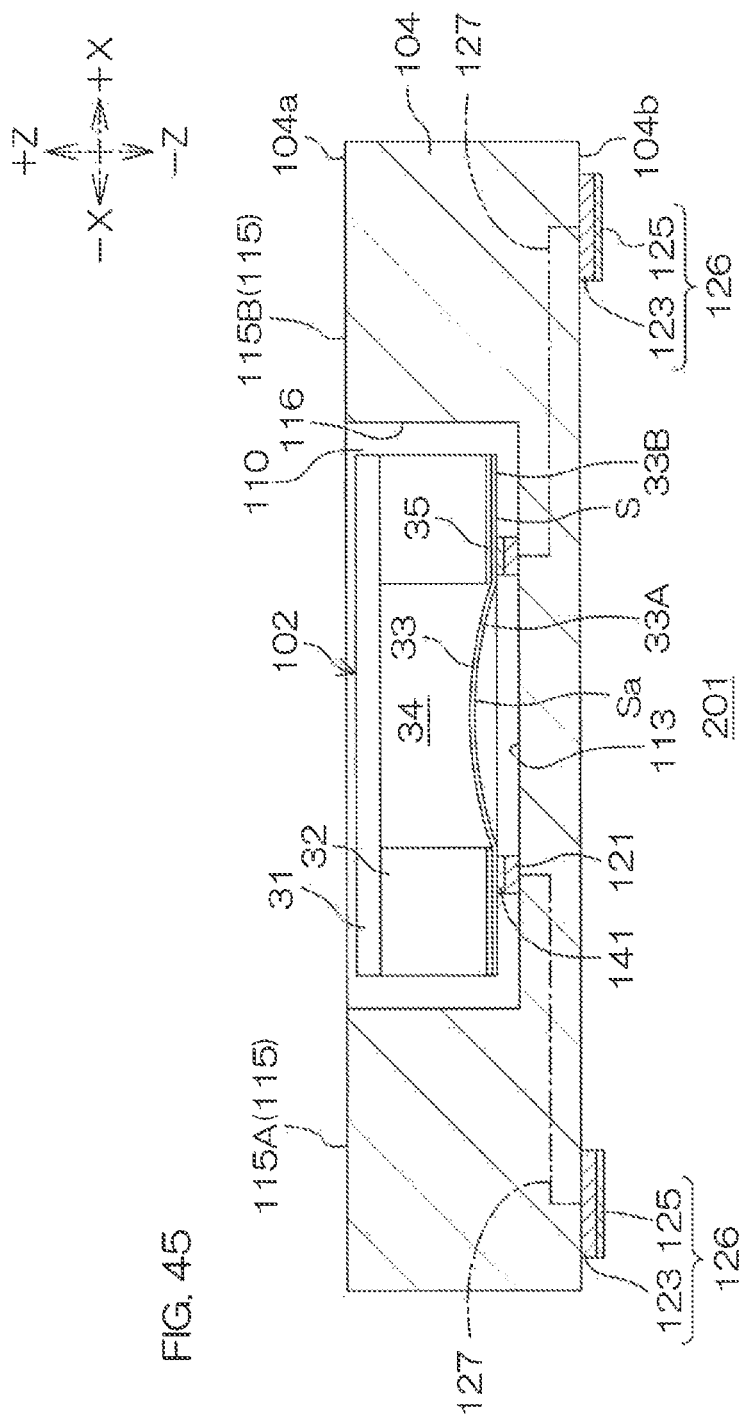
FIG. 45 is an illustrative sectional view taken along line XLV-XLV in FIG. 44.

FIG. 44 is an illustrative plan view of a third air pressure detecting device. FIG. 45 is an illustrative sectional view taken along line XLV-XLV in FIG. 44. In FIG. 44 and FIG. 45, portions corresponding to respective portions shown in FIG. 30 and FIG. 31 described above are indicated by attaching the same reference symbols.

The third air pressure detecting device 201 includes the air pressure sensor element 102 and the supporting substrate 104 supporting the air pressure sensor element 102. For convenience of description, a +X direction, a −X direction, a +Y direction, and a −Y direction shown in FIG. 44 and a +Z direction and a −Z direction shown in FIG. 45 may be used in the following description.

With the third air pressure detecting device 201, forming positions of the second pads 123 for surface mounting of the air pressure detecting device 201 onto the wiring substrate 81 and paths of the wirings connecting the first pads 121 and the second pads 123 differ from those of the second air pressure detecting device 101 described above. Aspects other than the above are the same as in the second air pressure detecting device 101.

With the third air pressure detecting device 201, the second pads 123 are formed not on the major surface 104a at the +Z direction side of the supporting substrate 104 but on the major surface 104b at the −Z direction side. Specifically, at the major surface 104b of the supporting substrate 104, five each of the second pads 123 are formed in each of a region opposing the first region 115A of the high area 115 and a region opposing the second region 115B of the high area 115. The bump 125 is formed on each second pad 123. The external terminal 126 is formed by each second pad 123 and the bump 125 formed thereon. The first pads 121 and the second pads 123 are connected via the wirings 127 formed inside the supporting substrate 104.

Figure 46:
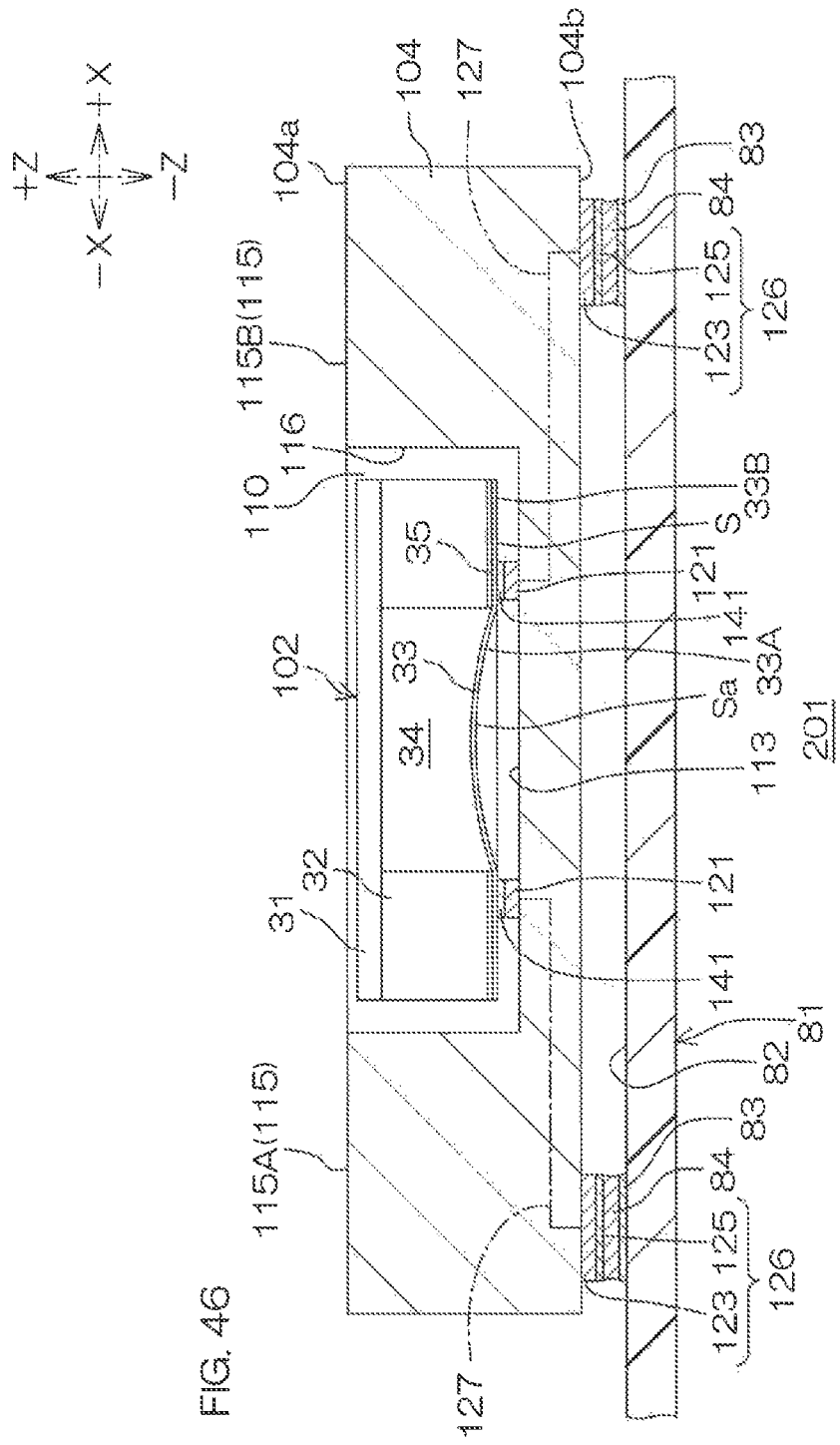
FIG. 46 is an illustrative sectional view of a mounting state of the air pressure detecting device shown in FIG. 44.

FIG. 46 is an illustrative sectional view of a mounting state of the third air pressure detecting device shown in FIG. 44 and shows a section plane corresponding to FIG. 45.

The plurality of lands 83 are formed on the surface 82 of the wiring substrate (mounting substrate) 81. The air pressure detecting device 201 is surface-mounted onto the surface 82 of the wiring substrate (mounting substrate) 81 with the bumps 125 facing the surface 82. With the third air pressure detecting device 201, the bumps 125 are formed at the major surface 104b side of the supporting substrate 104 and therefore the air pressure detecting device 201 is mounted onto the wiring substrate 81 in a state where the major surface 104b of the supporting substrate 104 faces the surface of the wiring substrate 81. The cream solder 84 is coated on the plurality of lands 83. In surface-mounting the air pressure detecting device 201 onto the wiring substrate 81, the second pads 123 of the air pressure detecting device 201 are bonded to the lands 83 via the cream solder 84 and the bumps 125.

In a state where the air pressure detecting device 201 has been mounted on the wiring substrate 81, an opening portion of the recess 110 is open to the ambient air. The gap corresponding to at least the thickness of the first pad 121 is present between the ambient air contacting surface S of the air pressure sensor element 102 and the low area 113 of the supporting substrate 104. The ambient air can thus flow into the gap between the ambient air contacting surface S of the air pressure sensor element 102 and the low area 113 of the supporting substrate 104 through the opening portion of the recess 110. The external surface (ambient air contacting region Sa) of the movable portion 33A of the diaphragm 33 of the air pressure sensor element 102 is thus put in the state of being exposed to the ambient air to enable air pressure detection using the air pressure sensor element 102.

With the third air pressure detecting device 201, the air pressure sensor element 102 is bonded to the low area 113 of the supporting substrate 104 in the face-down state with its ambient air contacting surface S being made to face the low area 113. The ambient air contacting surface S (ambient air contacting region Sa) of the air pressure sensor element 102 is thereby protected by the supporting substrate 104 arranged to support the air pressure sensor element 102, and therefore there is no need to separately provide a cover arranged to protect the ambient air contacting surface S (ambient air contacting region Sa) of the air pressure sensor element 102. Even in such a case where the air pressure sensor element 102 is bonded in the face-down state to the supporting substrate 104, the gap, corresponding to at least the thickness of the first pad 121 is formed between the ambient air contacting region Sa of the air pressure sensor element 102 and the low area 113 of the supporting substrate 104, and the ambient air contacting region Sa of the air pressure sensor element 102 can thus be exposed to the ambient air through the recess 110. Hindrance to air pressure detection thus does not arise.

Figure 47:
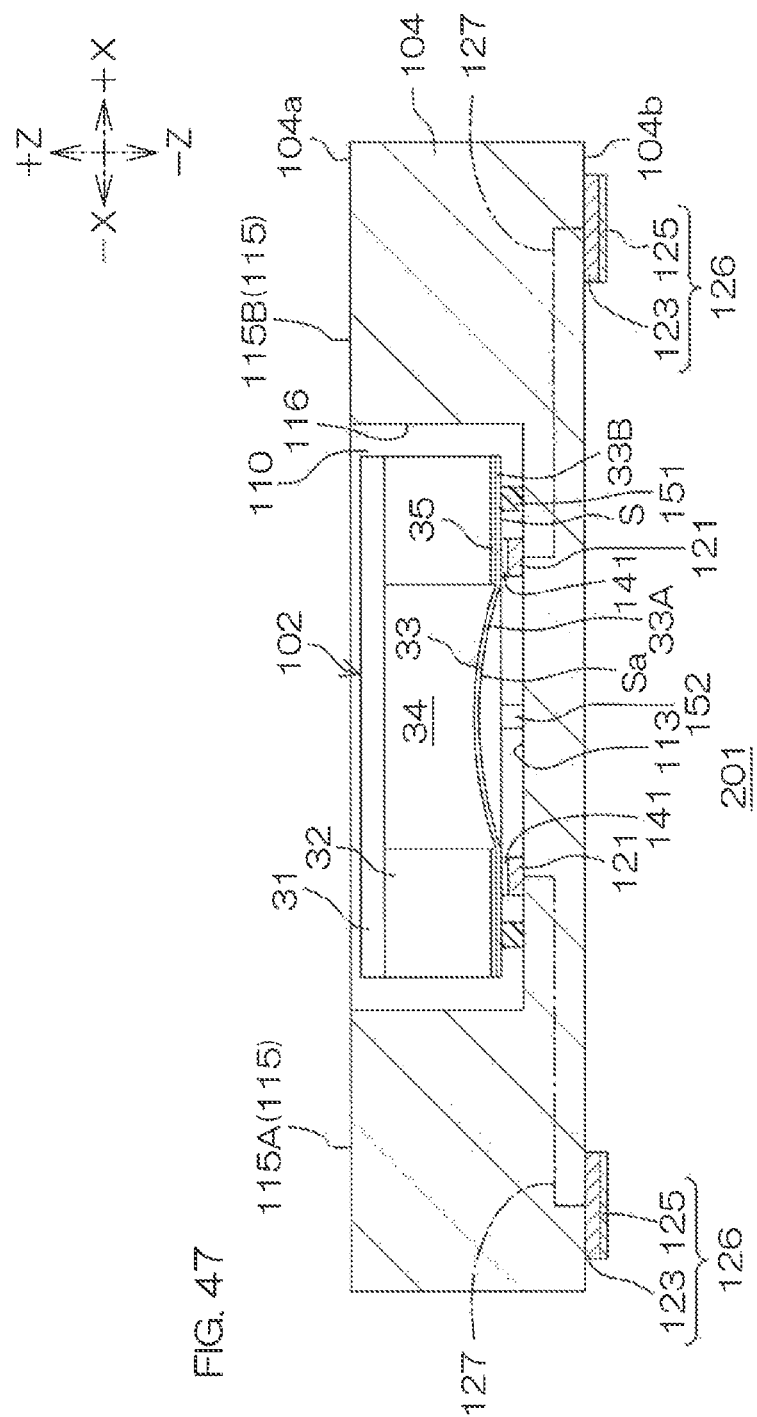
FIG. 47 is an illustrative sectional view of a modification example of the third air pressure detecting device.

FIG. 47 is an illustrative sectional view of a modification example of the third air pressure detecting device and shows a section plane corresponding to FIG. 45. In FIG. 47, portions corresponding to the respective portions of FIG. 45 described above are indicated by attaching the same symbols as in FIG. 45.

Figure 48:
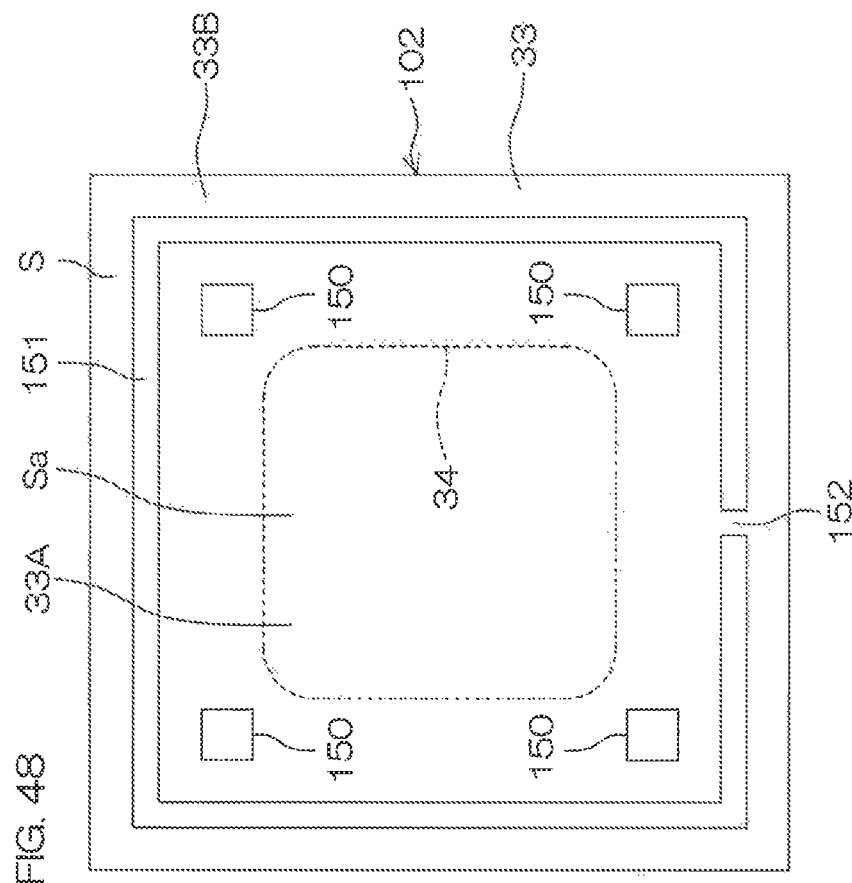
FIG. 48 is a view as viewed from the −Z direction side of an ambient air contacting surface of an air pressure sensor element used in the air pressure detecting device of FIG. 47.

The air pressure detecting device 201 of FIG. 47 differs in only the air pressure sensor element 102 from the third air pressure detecting device 201 shown in FIG. 44 and FIG. 45. FIG. 48 is a view as viewed from the −Z direction side of the ambient air contacting surface S of the air pressure sensor element 102 used in the air pressure detecting device 201 of FIG. 47. In FIG. 48, the solder layer 141 is omitted and therefore the electrode pads are apparent on the ambient air contacting surface S.

Four electrode pads 150 are formed on the ambient air contacting surface S of the air pressure sensor element 102. In the −Z direction view, the four electrode pads 150 are disposed at four corners of the ambient air contacting surface S of the air pressure sensor element 102. On the −Z direction-side surface of the fixed portion 33B of the diaphragm 33, a waterproof/dustproof wall 151, which is disconnected at least at one location, is formed so as to substantially surround the movable portion 33A (ambient air contacting region Sa) of the diaphragm. The present waterproof/dustproof wall 151 is the same as the waterproof/dustproof wall 151 described with FIG. 33 to FIG. 35. With the present example, in the −Z direction view, the waterproof/dustproof wall 151 is of rectangular annular shape with ends and has the disconnected portion (cutout portion) 152 formed at only one location. Also with the present example, the waterproof/dustproof wall 151 is formed so as to run along the outer side of the four electrode pads 150 in the −Z direction view.

The waterproof/dustproof wall 151 projects in the −Z direction from the outer surface of the diaphragm 33. The projection length (Z direction length) of the waterproof/dustproof wall 151 is preferably set to a length such that when the air pressure sensor element 102 is bonded to the low area 113 of the supporting substrate 104, the projecting end of the waterproof/dustproof wall 151 is press-contacted or contacted with the surface of the low area 113. The waterproof/dustproof wall 151 is constituted of polyimide or other resin, $SiO_2$ or other ceramic, or Cu or other metal, etc. The waterproof/dustproof wall 151 may also be of the arrangement shown in FIG. 36, FIG. 37, or FIG. 38 described above.

As in the third air pressure detecting device 201 of FIG. 44, there is no need to separately provide a cover arranged to protect the ambient air contacting surface S of the air pressure sensor element 102 in the air pressure detecting device 201 of FIG. 47 as well. Also with the air pressure detecting device 201 of FIG. 47, the waterproof/dustproof wall 151 of rectangular annular shape with ends in a plan view is formed on the −Z direction-side surface of the fixed portion 33B of the diaphragm 33 so as to substantially surround the movable portion 33A (ambient air contacting region Sa) and therefore entry of moisture and dust into the gap between the movable portion 33A of the diaphragm 33 and the low area 113 of the supporting substrate 104 can be suppressed.

Figure 49:
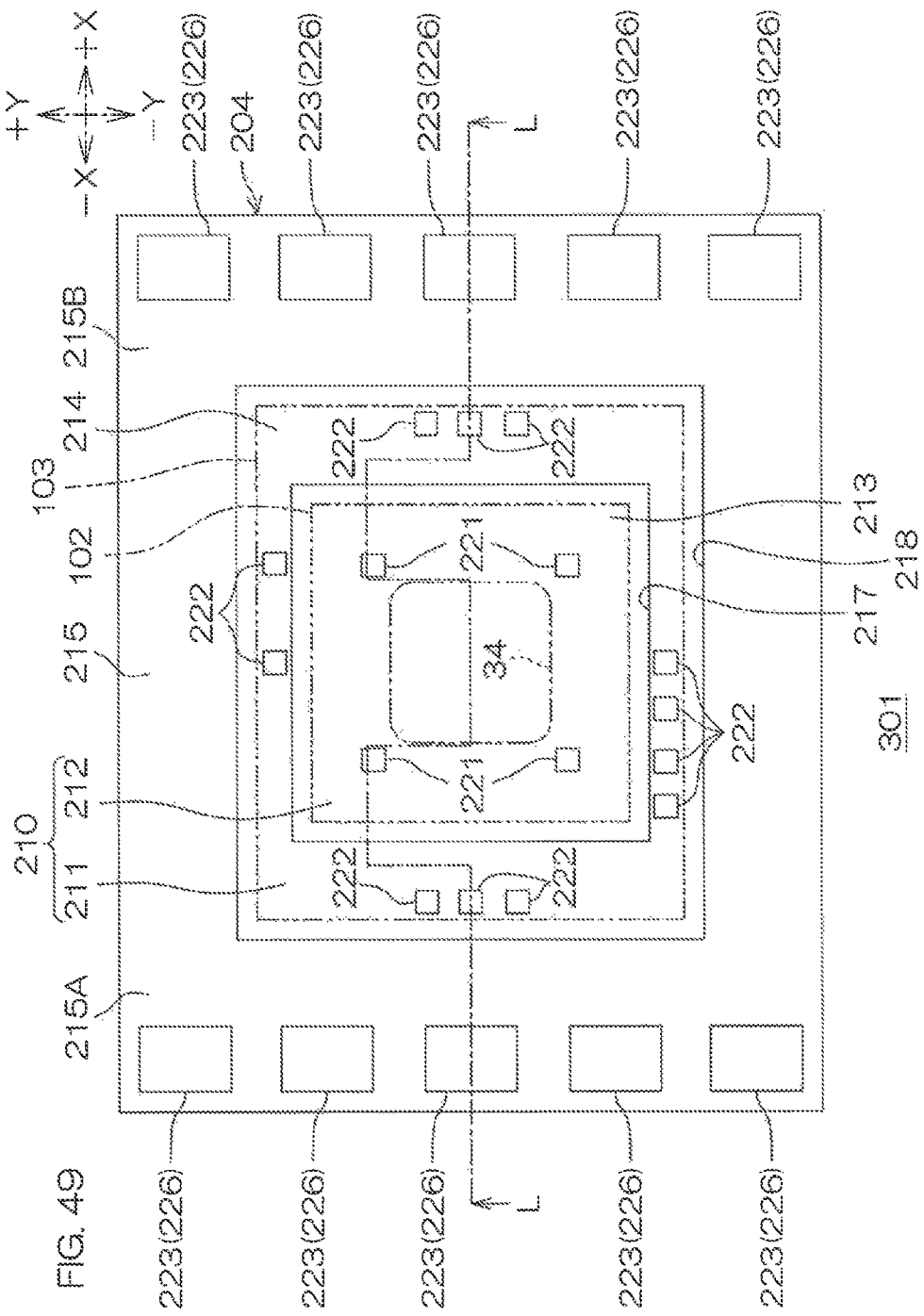
FIG. 49 is an illustrative plan view of a fourth air pressure detecting device.
Figure 50:
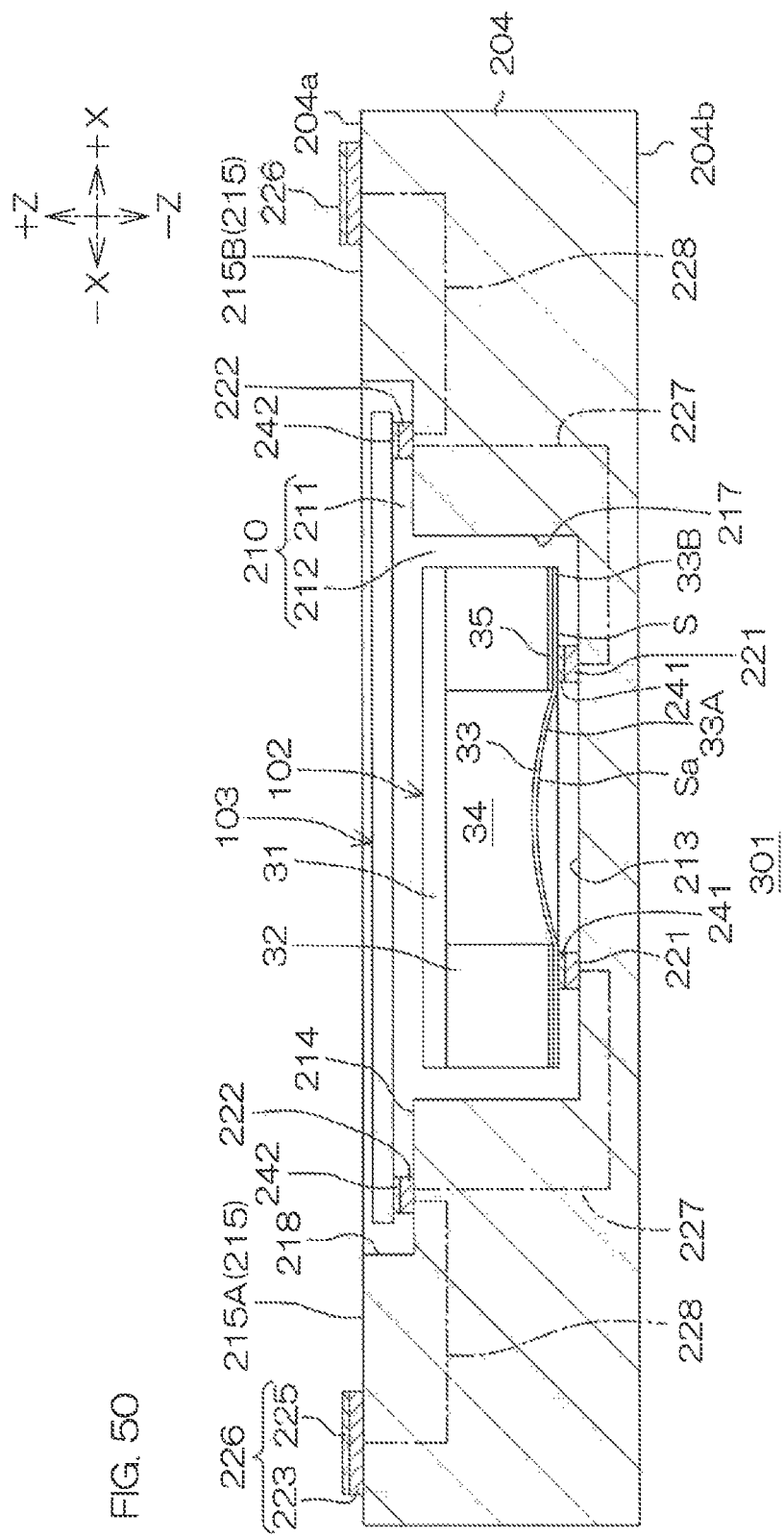
FIG. 50 is an illustrative sectional view taken along line L-L in FIG. 49.

FIG. 49 is an illustrative plan view of a fourth air pressure detecting device. FIG. 50 is an illustrative sectional view taken along line L-L in FIG. 49.

The fourth air pressure detecting device 301 includes the air pressure sensor element 102, an integrated circuit element 103, performing air pressure detection processing based on an output of the air pressure sensor element 102, and a supporting substrate 204 supporting the air pressure sensor element 102 and the integrated circuit element. For convenience of description, a +X direction, a −X direction, a +Y direction, and a −Y direction shown in FIG. 49 and a +Z direction and a −Z direction shown in FIG. 50 may be used in the following description.

The supporting substrate 204 is constituted of a multilayer wiring substrate having a wiring layer in its interior. The supporting substrate 204 is formed to a rectangular shape in a plan view and has a pair of major surfaces 204a and 204b and four lateral surfaces connecting the major surfaces 204a and 204b. At a central portion of one major surface (major surface at the +Z direction side) 204a of the supporting substrate 204 is formed a recess 210 of rectangular shape in a plan view that is depressed towards the other major surface 204b. The other major surface 204b of the supporting substrate 204 is a flat surface.

The recess 210 is constituted of a third recess 211 of rectangular shape in a plan view that is depressed from the major surface 204a of the substrate 204 and a fourth recess 212 that is depressed further from a bottom surface of the third recess 211. When viewed from the Z direction, outlines of the third recess 211 and the fourth recess 212 are mutually similar rectangles and the outline of the fourth recess 212 is smaller than the outline of the third recess 211. When viewed from the Z direction, the bottom surface of the third recess 211 is a rectangular annular shape that surrounds the fourth recess 212, and a bottom surface of the fourth recess 212 is a rectangular shape surrounded by the bottom surface of the third recess 211.

At the one major surface 204a of the substrate 204, a low area 213 of rectangular shape in a plan view, which is the bottom surface of the fourth recess 212, a middle area 214 of rectangular annular shape in a plan view, which is the bottom surface of the third recess 211, and a high area 215 of rectangular annular shape in a plan view, which is a periphery of the recess 210, are formed by the third recess 211 and the fourth recess 212.

Between four sides of the low area 213 and four sides at an inner peripheral edge side of the middle area 214 is formed a connecting portion 217 arranged to connect these portions. Between four sides at an outer peripheral edge side of the middle area 214 and the high area 215 is formed a connecting portion 218 arranged to connect these portions. The connecting portion 217 is substantially perpendicular to the low area 213. The connecting portion 218 is substantially perpendicular to the middle area 214. The high area 215 includes a first region 215A and a second region 215B having rectangular shapes that are long in the Y direction in a plan view and are disposed apart in the X direction across the recess 210.

A plurality of first pads 221 are formed at a peripheral edge portion of the low area 213. The plurality of first pads 221 are rectangular in a plan view and, for example, four thereof are formed in the low area 213. The first pads 221 are provided to fix the air pressure sensor element 102 to the low area 213 mechanically and electrically.

A plurality of second pads 222 are formed in the middle area 214. The plurality of second pads 222 are rectangular in a plan view and, for example, twelve thereof are formed in the middle area 214. The second pads 222 are provided to fix the integrated circuit element 103 to the middle area 214 mechanically and electrically.

A plurality of third pads 223 are formed in the first region 215A and the second region 215B of the high area 215. Five each of the plurality of third pads 223 are formed in each of the first region 215A and the second region 215B. A bump 225 is formed on each third pad 223. An external terminal 226 is formed by each third pad 223 and the bump 225 formed thereon. The external terminals 226 are used for surface-mounting the air pressure detecting device 301 onto an unillustrated circuit board. Predetermined first pads 221 and second pads 222 are connected via wirings 227 formed inside the supporting substrate 204. Also, predetermined second pads 222 and third pads 223 (external terminals 226) are connected via wirings 228 formed inside the supporting substrate 204.

The air pressure sensor element 102 is the same as the air pressure sensor element 102 of the second air pressure detecting device 101 and therefore description thereof shall be omitted. The air pressure sensor element 102 has a rectangular parallelepiped shape and is housed inside the fourth recess 212. The air pressure sensor element 102 is bonded to the low area 213 in the face-down state where its ambient air contacting surface S is made to face the low area 213 (fourth recess 212 bottom surface). Specifically, each of the plurality of pad electrodes provided at the ambient air contacting surface S of the air pressure sensor element 102 is mechanically and electrically bonded via a solder layer 241 to a first pad 221 formed in the low area 213. The respective pad electrodes of the air pressure sensor element 102 are thereby connected to predetermined second pads 222 via the first pads 221 and the wirings 227 formed inside the supporting substrate 204. A gap, corresponding to a sum thickness of a thickness of the first pad 221 and a thickness of the solder layer 241, is formed between the ambient air contacting surface S (ambient air contacting region Sa) of the air pressure sensor element 102 and the low area 213. That is, a gap, corresponding to at least the thickness of the first pad 221, is present between the ambient air contacting region Sa of the air pressure sensor element 102 and the low area 213.

In the present preferred embodiment, the integrated circuit element 103 is arranged as a so-called ASIC (Application Specific Integrated Circuit) element. The integrated circuit element 103 has a rectangular parallelepiped shape that is flat in the Z direction and is housed inside the third recess 211. A plurality of pad electrodes (unillustrated) are provided at a peripheral edge portion of one surface (−Z direction-side surface; hereinafter referred to as a "mounting surface") of the integrated circuit element 103. The integrated circuit element 103 is bonded to the middle area 214 in a state where the peripheral edge portion of its mounting surface is made to face the middle area 214. Specifically, each of the plurality of pad electrodes provided at the mounting surface of the integrated circuit element 103 is mechanically and electrically bonded via a solder layer 242 to a second pad 222 formed in the middle area 214. The respective pad electrodes of the integrated circuit element 103 are thereby connected to predetermined third pads 223 via the second pads 222 and the wirings 228 formed inside the supporting substrate 204.

The integrated circuit element 103 may be used to process a signal that is in accordance with an amount of change in electrical resistance value of the strain gauge resistor in the air pressure sensor element 103, etc. A signal processing result of the integrated circuit element 103 may be output externally via a wiring 228 and an external terminal 226.

Figure 51:
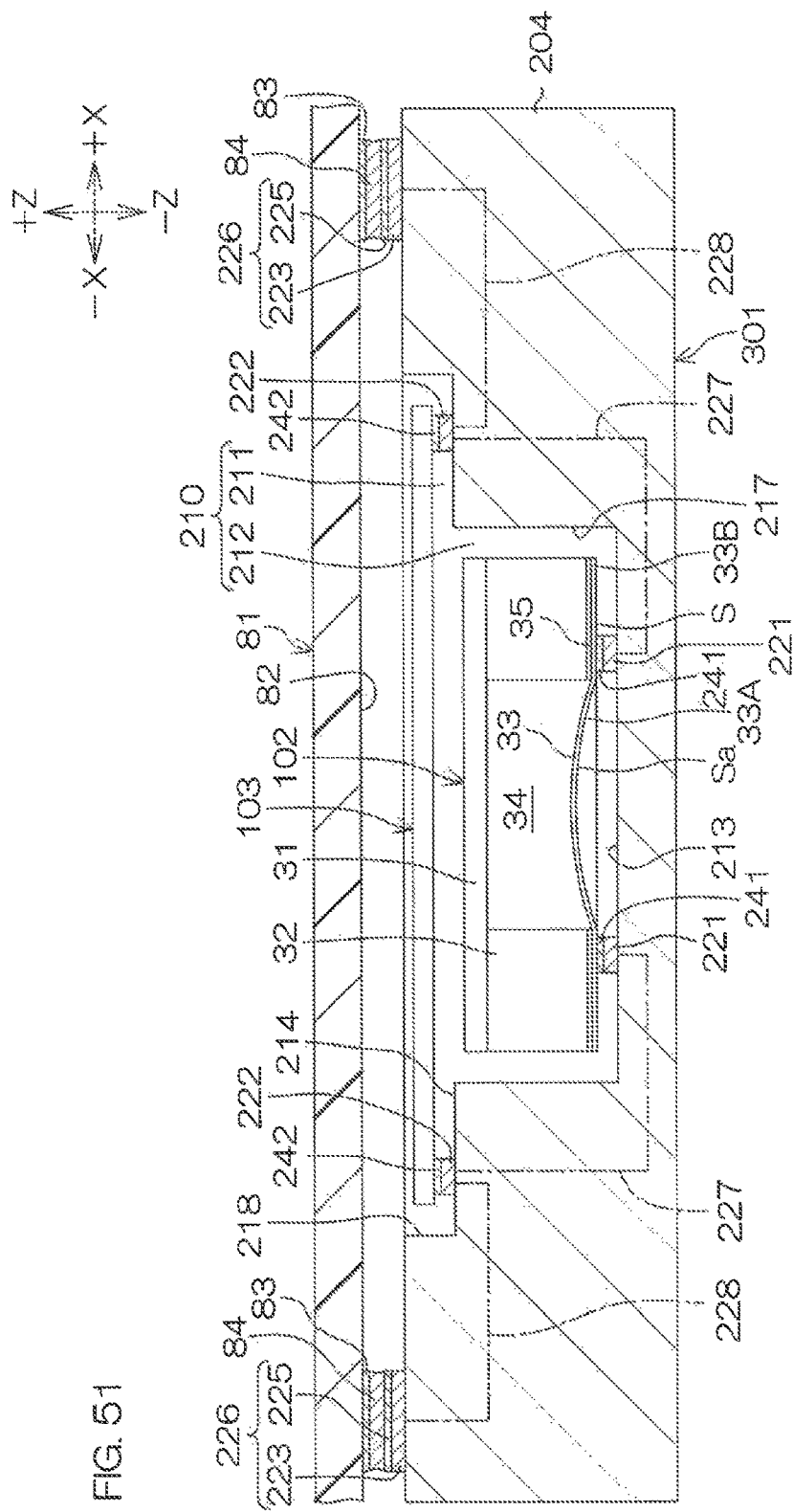
FIG. 51 is an illustrative sectional view of a mounting state of the air pressure detecting device shown in FIG. 49.

FIG. 51 is an illustrative sectional view of a mounting state of the fourth air pressure detecting device shown in FIG. 49 and shows a section plane corresponding to FIG. 50.

The plurality of lands 83 are formed on the surface 82 of the wiring substrate (mounting substrate) 81. The air pressure detecting device 301 is surface-mounted onto the surface 82 of the wiring substrate (mounting substrate) 81 with the bumps 225 facing the surface 82. The cream solder 84 is coated on the plurality of lands 83. In surface-mounting the air pressure detecting device 301 onto the wiring substrate 81, the third pads 223 of the air pressure detecting device 301 are bonded to the lands 83 via the cream solder 84 and the bumps 225.

In a state where the air pressure detecting device 301 has been mounted on the wiring substrate 81, a gap, corresponding to a sum thickness of a thickness of the third pad 223 and a thickness of the bump 225, cream solder 84, and land 83, is present between a surface (+Z-side surface) of the high area 215 of the supporting substrate 204 of the air pressure detecting device 301 and the wiring substrate 81. As mentioned above, the gap corresponding to at least the thickness of the first pad 221 is present between the ambient air contacting surface S of the air pressure sensor element 102 and the low area 213 of the supporting substrate 204. The ambient air can thus flow into the gap between the ambient air contacting surface S (ambient air contacting region Sa) of the air pressure sensor element 102 and the low area 213 of the supporting substrate 204 through the gap, between the wiring substrate 81 and the air pressure detecting device 301, and the recess 210. The external surface (ambient air contacting region Sa) of a movable film portion 33A of the diaphragm 33 of the air pressure sensor element 102 is thus put in the state of being exposed to the ambient air to enable air pressure detection using the air pressure sensor element 102.

With the fourth air pressure detecting device 301 described above, the air pressure sensor element 102 is bonded to the low area 213 of the supporting substrate 204 in the face-down state with its ambient air contacting surface S being made to face the low area 213. The ambient air contacting surface S (ambient air contacting region Sa) of the air pressure sensor element 102 is thereby protected by the supporting substrate 204 arranged to support the air pressure sensor element 102, and therefore there is no need to separately provide a cover arranged to protect the ambient air contacting surface S (ambient air contacting region Sa) of the air pressure sensor element 102. Even in such a case where the air pressure sensor element 102 is bonded in the face-down state to the supporting substrate 204, the gap, corresponding to at least the thickness of the first pad 221 is formed between the ambient air contacting region Sa of the air pressure sensor element 102 and the low area 213 of the supporting substrate 204, and the ambient air contacting region Sa of the air pressure sensor element 102 can thus be exposed to the ambient air through the recess 210. Hindrance to air pressure detection thus does not arise.

A waterproof/dustproof wall similar to the waterproof/dustproof wall 151 described using FIG. 33 to FIG. 35 may be formed on an outer surface of the fixed portion 33B of the diaphragm 33 of the air pressure sensor element 102 in the fourth air pressure detecting device 301 as well. Also, the waterproof/dustproof wall formed on the outer surface of the fixed portion 33B may be of the arrangement shown in FIG. 36, FIG. 37, or FIG. 38 described above.

A waterproof/dustproof wall similar to the waterproof/dustproof wall 155 described using FIG. 39 and FIG. 40 may be formed in the high area 215 of the supporting substrate 204 in the fourth air pressure detecting device 301 as well. Also, the waterproof/dustproof wall formed in the high area 215 may be of the arrangement shown in FIG. 41, FIG. 42, or FIG. 43 described above.

Figure 52:
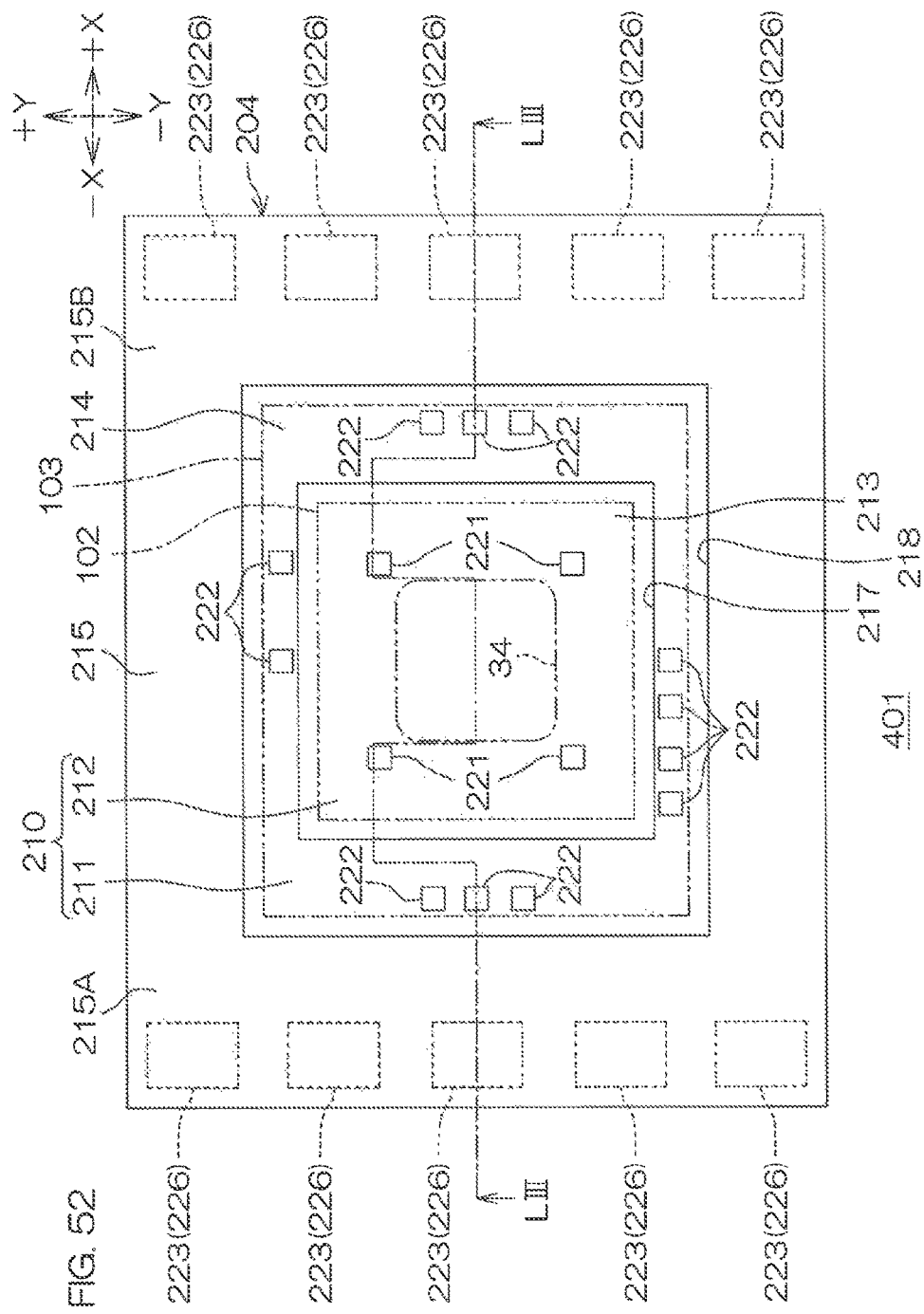
FIG. 52 is an illustrative plan view of a fifth air pressure detecting device.
Figure 53:
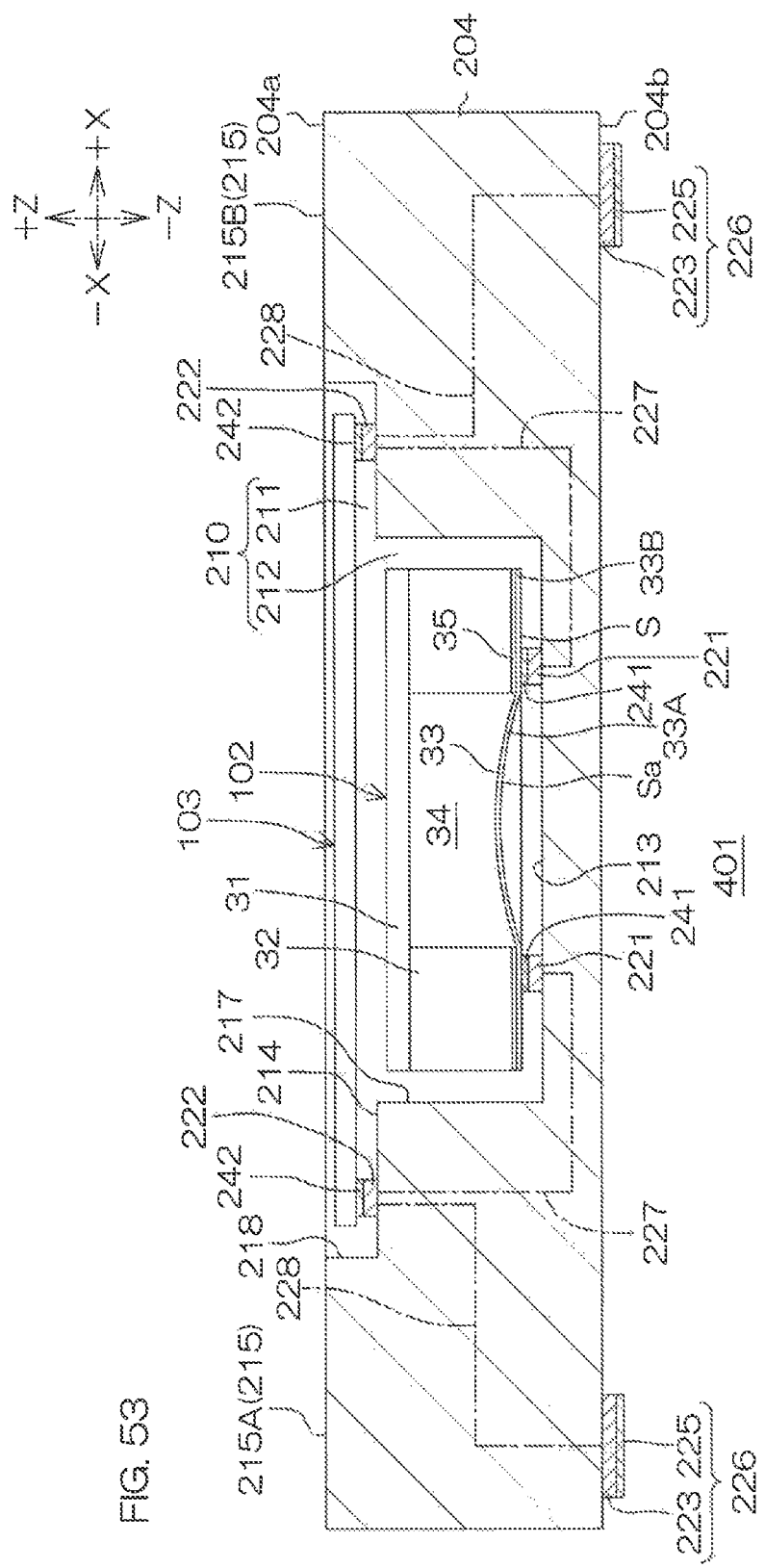
FIG. 53 is an illustrative sectional view taken along line LIII-LIII in FIG. 52.

FIG. 52 is an illustrative plan view of a fifth air pressure detecting device. FIG. 53 is an illustrative sectional view taken along line LIII-LIII in FIG. 52. In FIG. 52 and FIG. 53, portions corresponding to respective portions shown in FIG. 49 and FIG. 50 described above are indicated by attaching the same reference symbols.

The fifth air pressure detecting device 401 includes the air pressure sensor element 102, the integrated circuit element 103, performing air pressure detection processing based on the output of the air pressure sensor element 102, and the supporting substrate 204 supporting the air pressure sensor element 102 and the integrated circuit element 103. For convenience of description, the +X direction, the −X direction, the +Y direction, and the −Y direction shown in FIG. 49 and the +Z direction and the −Z direction shown in FIG. 50 may be used in the following description.

With the fifth air pressure detecting device 401, forming positions of the third pads 223 for surface mounting of the air pressure detecting device 201 onto the wiring substrate 81 and paths of the wirings connecting the second pads 222 and the third pads 223 differ from those of the fourth air pressure detecting device 301 described above. Aspects other than the above are the same as in the fourth air pressure detecting device 301.

With the fifth air pressure detecting device 401, the third pads 223 are formed not on the major surface 204a at the +Z direction side of the supporting substrate 204 but on the major surface 204b at the −Z direction side. Specifically, at the major surface 204b of the supporting substrate 204, five each of the third pads 223 are formed in each of a region opposing the first region 215A of the high area 215 and a region opposing the second region 215B of the high area 215. The bump 225 is formed on each third pad 223. The external terminal 226 is formed by each third pad 223 and the bump 225 formed thereon. The second pads 222 and the third pads 223 are connected via the wirings 228 formed inside the supporting substrate 204.

Figure 54:
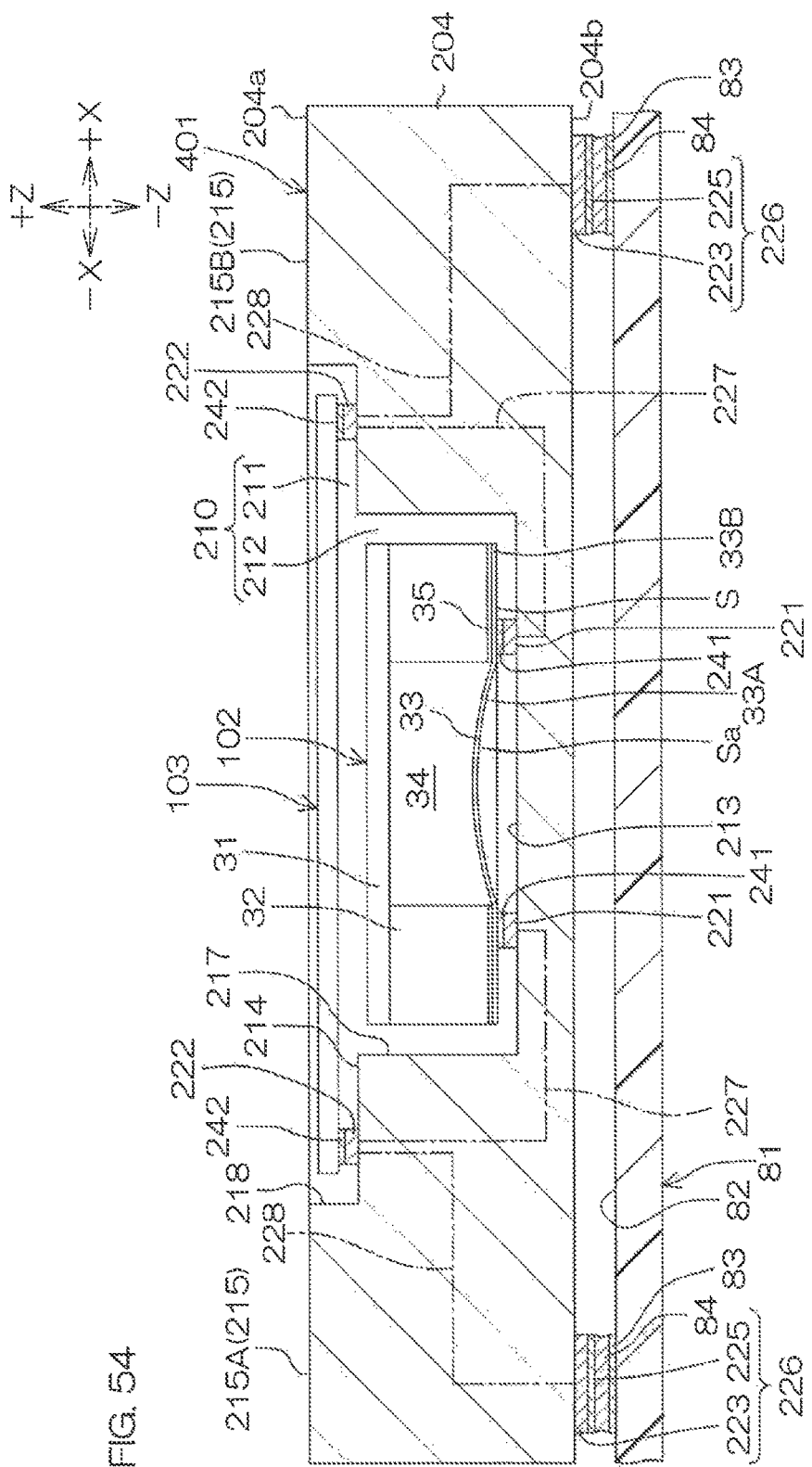
FIG. 54 is an illustrative sectional view of a mounting state of the air pressure detecting device shown in FIG. 52.

FIG. 54 is an illustrative sectional view of a mounting state of the fifth air pressure detecting device shown in FIG. 53 and shows a section plane corresponding to FIG. 53.

The plurality of lands 83 are formed on the surface 82 of the wiring substrate (mounting substrate) 81. The air pressure detecting device 401 is surface-mounted onto the surface 82 of the wiring substrate (mounting substrate) 81 with the bumps 225 facing the surface 82. With the fifth air pressure detecting device 401, the bumps 225 are formed at the major surface 204b side of the supporting substrate 204 and therefore the air pressure detecting device 401 is mounted onto the wiring substrate 81 in a state where the major surface 204b of the supporting substrate 204 faces the surface of the wiring substrate 81. The cream solder 84 is coated on the plurality of lands 83. In surface-mounting the air pressure detecting device 401 onto the wiring substrate 81, the third pads 223 of the air pressure detecting device 401 are bonded to the lands 83 via the cream solder 84 and the bumps 225.

In a state where the air pressure detecting device 401 has been mounted on the wiring substrate 81, an opening portion of the recess 210 (opening portion of the third recess 211) is open to the ambient air. The gap corresponding to at least the thickness of the first pad 221 is present between the ambient air contacting surface S of the air pressure sensor element 102 and the low area 213 of the supporting substrate 204. The ambient air can thus flow into the gap between the ambient air contacting surface S of the air pressure sensor element 102 and the low area 213 of the supporting substrate 204 through the opening portion of the recess 210. The external surface (ambient air contacting region Sa) of the movable portion 33A of the diaphragm 33 of the air pressure sensor element 102 is thus put in the state of being exposed to the ambient air to enable air pressure detection using the air pressure sensor element 102.

With the fifth air pressure detecting device 401, the air pressure sensor element 102 is bonded to the low area 213 of the supporting substrate 204 in the face-down state with its ambient air contacting surface S being made to face the low area 213. The ambient air contacting surface S (ambient air contacting region Sa) of the air pressure sensor element 102 is thereby protected by the supporting substrate 204 arranged to support the air pressure sensor element 102, and therefore there is no need to separately provide a cover arranged to protect the ambient air contacting surface S (ambient air contacting region Sa) of the air pressure sensor element 102. Even in such a case where the air pressure sensor element 102 is bonded in the face-down state to the supporting substrate 204, the gap, corresponding to at least the thickness of the first pad 221 is formed between the ambient air contacting region Sa of the air pressure sensor element 102 and the low area 213 of the supporting substrate 204, and the ambient air contacting region Sa of the air pressure sensor element 102 can thus be exposed to the ambient air through the recess 210. Hindrance to air pressure detection thus does not arise.

A waterproof/dustproof wall similar to the waterproof/dustproof wall 151 described using FIG. 33 to FIG. 35 may be formed on the outer surface of the fixed portion 33B of the diaphragm 33 of the air pressure sensor element 102 in the fifth air pressure detecting device 401 as well. Also, the waterproof/dustproof wall formed on the outer surface of the fixed portion 33B may be of the arrangement shown in FIG. 36, FIG. 37, or FIG. 38 described above.

Figure 55:
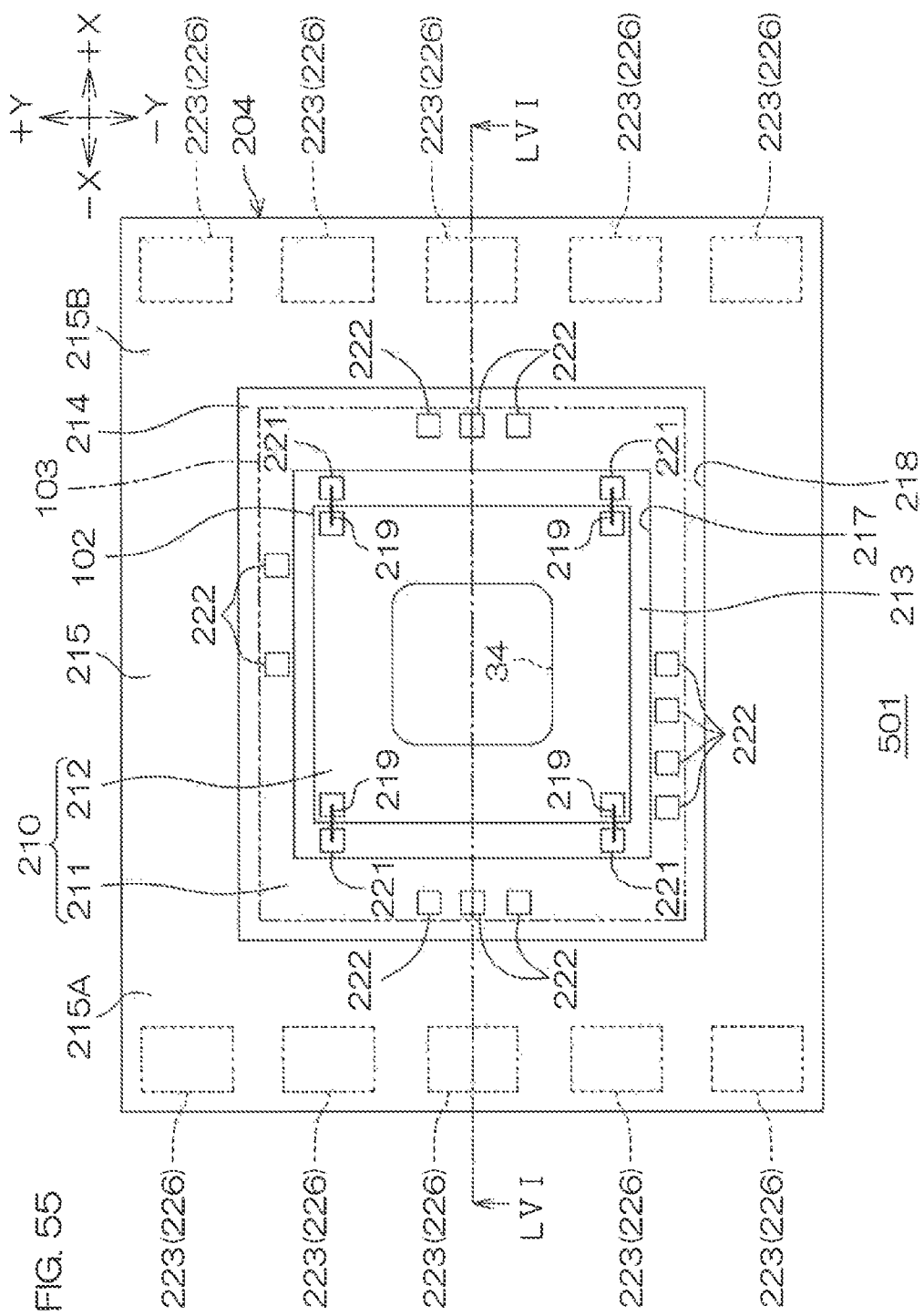
FIG. 55 is an illustrative plan view of a sixth air pressure detecting device.
Figure 56:
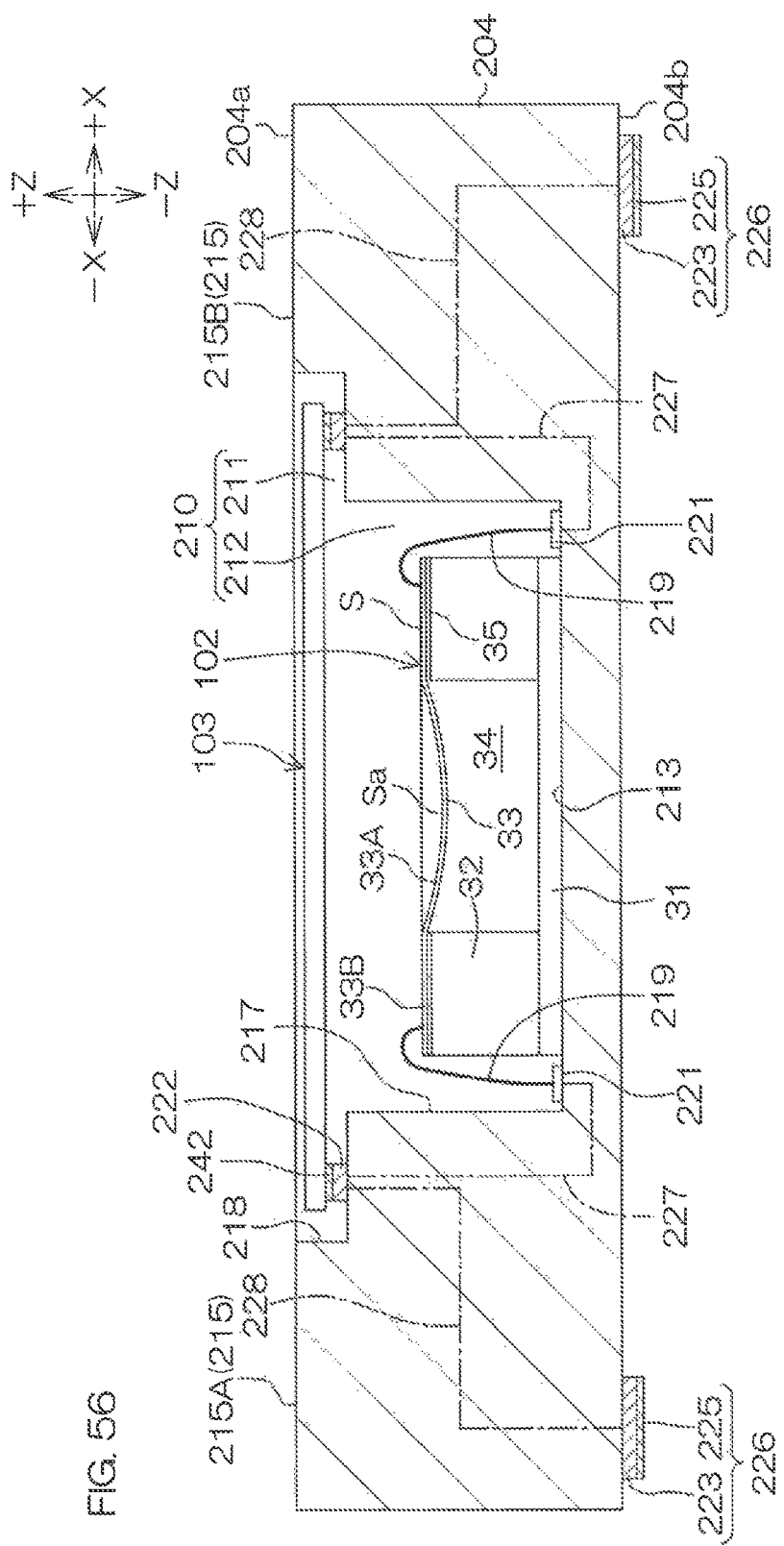
FIG. 56 is an illustrative sectional view taken along line LVI-LVI in FIG. 55.

FIG. 55 is an illustrative plan view of a sixth air pressure detecting device. FIG. 56 is an illustrative sectional view taken along line LVI-LVI in FIG. 55. In FIG. 55 and FIG. 56, portions corresponding to respective portions shown in FIG. 52 and FIG. 53 described above are indicated by attaching the same reference symbols.

The sixth air pressure detecting device 501 includes the air pressure sensor element 102, the integrated circuit element 103, performing air pressure detection processing based on the output of the air pressure sensor element 102, and the supporting substrate 204 supporting the air pressure sensor element 102 and the integrated circuit element 103. For convenience of description, a +X direction, a −X direction, a +Y direction, and a −Y direction shown in FIG. 55 and a +Z direction and a −Z direction shown in FIG. 56 may be used in the following description.

Although the arrangement of the sixth air pressure detecting device 501 is substantially the same as that of the fifth air pressure detecting device 401, an orientation of the air pressure sensor element 102 supported by the supporting substrate 204 differs from that in the fifth air pressure detecting device 401. That is, with the sixth air pressure detecting device 501, the air pressure sensor element 102 is bonded to the low area 213 of the supporting substrate 204 in a face-up state where its surface (base 31-side surface) at a side opposite the ambient air contacting surface S is made to face the low area 213. In the low area 213, the plurality of first pads 221 are formed in a region outside a region in which the air pressure sensor element 102 is bonded. The pad electrodes formed on the ambient air contacting surface S of the air pressure sensor element 102 are connected to the first pads 221 via bonding wires 219. The first pads 221 are connected to the second pads 222 by the wirings 227 formed inside the supporting substrate 204. The second pads 222 are connected to the third pads 223 by the wirings 228 formed inside the supporting substrate 204.

With the sixth air pressure detecting device 501, the air pressure sensor element 102 is bonded to the low area 213 of the supporting substrate 204 in the face-up state with its surface at the side opposite the ambient air contacting surface S being made to face the low area 213. However, the ambient air contacting surface S of the air pressure sensor element 102 is covered by the integrated circuit element 103 and therefore there is no need to separately provide a cover arranged to protect the ambient air contacting surface S of the air pressure sensor element 102.

Although cases of applying the present invention to air pressure detecting devices including air pressure sensor elements have been described above, the present invention may be applied to any electronic part besides air pressure detecting devices as long as the electronic part includes a sensor element that includes an ambient air contacting surface including an ambient air contacting region to be exposed to ambient air. An example of such an electronic part is a humidity detecting device that includes a humidity sensor element.

The present application corresponds to Japanese Patent Application No. 2016-66345 filed in the Japan Patent Office on Mar. 29, 2016, and the entire disclosure of this application is incorporated herein by reference.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. An electronic part comprising:
a sensor element that includes an ambient air contacting surface including an ambient air contacting region to be exposed to ambient air; and
a supporting substrate, arranged to support the sensor element,
wherein the sensor element is bonded to one surface of the supporting substrate in a state where the ambient air contacting surface faces the one surface of the supporting substrate and a gap, through which the ambient air flows, is formed between the ambient air contacting region and the one surface of the supporting substrate,
wherein a recess, depressed from the one surface of the supporting substrate and housing the sensor element, is formed in the supporting substrate, and
wherein the sensor element is bonded to a bottom surface of the recess in a state where the ambient air contacting surface faces a bottom surface of the recess and a gap, through which the ambient air flows, is formed between the ambient air contacting region and the bottom surface of the recess.

2. The electronic part according to claim 1, further comprising:
a plurality of electrodes, formed at the ambient air contacting surface side of the sensor element; and
a plurality of pads, formed on the one surface of the supporting substrate,
wherein the plurality of electrodes are bonded to the plurality of pads.

3. The electronic part according to claim 1, further comprising:
a plurality of electrodes, formed at the ambient air contacting surface side of the sensor element; and
a plurality of pads, formed on the bottom surface of the recess,
wherein the plurality of electrodes are bonded to the plurality of pads.

4. The electronic part according to claim 3, further comprising: a plurality of external terminals formed in a region of the one surface of the supporting substrate that surrounds the recess and connected to any of the plurality of pads.

5. The electronic part according to claim 4, wherein the plurality of external terminals are connected to any of the plurality of pads via wirings formed on the one surface of the supporting substrate.

6. The electronic part according to claim 4, wherein the plurality of external terminals are connected to any of the plurality of pads via wirings formed inside the supporting substrate.

7. The electronic part according to claim 3, further comprising: a plurality of external terminals formed on another surface at a side opposite the one surface of the supporting substrate and connected to any of the plurality of pads.

8. The electronic part according to claim 7, wherein the plurality of external terminals are connected to any of the plurality of pads via wirings formed inside the supporting substrate.

9. An electronic part comprising:
a sensor element that includes an ambient air contacting surface including an ambient air contacting region to be exposed to ambient air;
a supporting substrate, arranged to support the sensor element; and
an integrated circuit element supported by the supporting substrate,
wherein the sensor element is bonded to one surface of the supporting substrate in a state where the ambient air contacting surface faces the one surface of the supporting substrate and a gap, through which the ambient air flows, is formed between the ambient air contacting region and the one surface of the supporting substrate,
wherein the supporting substrate has formed therein a first recess, depressed from the one surface of the supporting substrate, and a second recess, depressed from the one surface of the supporting substrate, being in communication with a lateral surface of the first recess, and being shallower in depth than the first recess,
wherein the sensor element is bonded to a bottom surface of the first recess in a state where ambient air contacting surface faces the bottom surface of the first recess and a gap, through which the ambient air flows, is formed between the ambient air contacting region and the bottom surface of the first recess, and
wherein the integrated circuit element is bonded to a bottom surface of the second recess in a state where one surface of the integrated circuit element faces the bottom surface of the second recess.

10. The electronic part according to claim 9, further comprising:
a plurality of first electrodes, formed at the ambient air contacting surface side of the sensor element; and
a plurality of first pads, formed on the bottom surface of the first recess,
wherein the plurality of first electrodes are bonded to the plurality of first pads.

11. The electronic part according to claim 10, further comprising:
a plurality of second electrodes, formed at the one surface side of the integrated circuit element; and
a plurality of second pads, formed on the bottom surface of the second recess and connected to any of the plurality of first pads,
wherein the plurality of second electrodes are bonded to the plurality of second pads.

12. The electronic part according to claim 11, further comprising: a plurality of external terminals formed in a region of the one surface of the supporting substrate that surrounds the first recess and the second recess and connected to any of the plurality of second pads.

13. The electronic part according to claim 12, wherein the plurality of second pads are connected to any of the plurality of first pads via first wirings formed on the one surface of the supporting substrate, and the plurality of external terminals are connected to any of the plurality of second pads via second wirings formed on the one surface of the supporting substrate.

14. An electronic part comprising:

a sensor element that includes an ambient air contacting surface including an ambient air contacting region to be exposed to ambient air;

a supporting substrate arranged to support the sensor element; and an integrated circuit element supported by the supporting substrate, wherein the sensor element is bonded to one surface of the supporting substrate in a state where the ambient air contacting surface faces the one surface of the supporting substrate and a gap, through which the ambient air flows, is formed between the ambient air contacting region and the one surface of the supporting substrate, wherein the supporting substrate has formed therein a third recess, depressed from the one surface of the supporting substrate, and a fourth recess, depressed further from a bottom surface of the third recess, wherein the sensor element is bonded to a bottom surface of the fourth recess in a state where the ambient air contacting surface faces the bottom surface of the fourth recess and a gap, through which the ambient air flows, is formed between the ambient air contacting region and the bottom surface of the fourth recess, and wherein the integrated circuit element is bonded to the bottom surface of the third recess in a state where one surface of the integrated circuit element faces the bottom surface of the third recess and a gap, through which the ambient air flows, is formed between the one surface and the bottom surface of the third recess.

15. The electronic part according to claim 14, further comprising:

a plurality of first electrodes, formed at the ambient air contacting surface side of the sensor element; and a plurality of first pads, formed on the bottom surface of the fourth recess, wherein the plurality of first electrodes are bonded to the plurality of first pads.

16. The electronic part according to claim 15, further comprising:

a plurality of second electrodes, formed at the one surface side of the integrated circuit element; and a plurality of second pads, formed on the bottom surface of the third recess and connected to any of the plurality of first pads, wherein the plurality of second electrodes are bonded to the plurality of second pads.

17. The electronic part according to claim 16, further comprising: a plurality of external terminals formed in a region of the one surface of the supporting substrate that surrounds the third recess and connected to any of the plurality of second pads.

18. The electronic part according to claim 17, wherein the plurality of second pads are connected to any of the plurality of first pads via first wirings formed inside the supporting substrate, and the plurality of external terminals are connected to any of the plurality of second pads via second wirings formed inside the supporting substrate.

* * * * *